US009739430B2

(12) United States Patent
Lang

(10) Patent No.: US 9,739,430 B2
(45) Date of Patent: Aug. 22, 2017

(54) SYSTEMS, METHODS AND/OR DEVICES FOR PROVIDING LED LIGHTING

(71) Applicant: Photon Holding LLC, Las Vegas, NV (US)

(72) Inventor: Daniel Stewart Lang, Las Vegas, NV (US)

(73) Assignee: Photon Holding LLC, Las Vegas, NV (US)

( * ) Notice: Subject to any disclaimer, the term of this patent is extended or adjusted under 35 U.S.C. 154(b) by 75 days.

(21) Appl. No.: 14/358,693

(22) PCT Filed: Nov. 15, 2012

(86) PCT No.: PCT/US2012/065174
§ 371 (c)(1),
(2) Date: May 15, 2014

(87) PCT Pub. No.: WO2013/074729
PCT Pub. Date: May 23, 2013

(65) Prior Publication Data
US 2014/0313716 A1      Oct. 23, 2014

Related U.S. Application Data

(63) Continuation-in-part of application No. PCT/US2011/060942, filed on Nov. 16, 2011, and a
(Continued)

(51) Int. Cl.
*F21L 4/08* (2006.01)
*H01L 35/30* (2006.01)
(Continued)

(52) U.S. Cl.
CPC ............... *F21L 4/08* (2013.01); *F21K 9/232* (2016.08); *F21K 9/65* (2016.08); *F21V 7/0083* (2013.01);
(Continued)

(58) Field of Classification Search
USPC ........................................................ 362/242
See application file for complete search history.

(56) References Cited

U.S. PATENT DOCUMENTS

2004/0114355 A1* 6/2004 Rizkin ...................... B64F 1/20
                                                            362/153
2004/0120156 A1* 6/2004 Ryan ..................... F21V 29/004
                                                            362/373
(Continued)

FOREIGN PATENT DOCUMENTS

CN          101057114 A   * 10/2007

OTHER PUBLICATIONS

International Search Report dated Jan. 13, 2013 for PCT/US2012/065174.

*Primary Examiner* — Laura Tso
(74) *Attorney, Agent, or Firm* — Jones Day

(57) ABSTRACT

Certain embodiments are directed to a lighting device comprising one or more of the following: a plurality of LEDs; a plurality of optic devices corresponding to the plurality of LEDs; at least one optical separator for substantially preventing the light emitted from one LED from effecting the other LEDs; a thermoelectric device configured to harvest heat generated by the LEDs and convert the harvested heat into electrical energy; and a low temperature material for creating a temperature difference across the thermoelectric device.

26 Claims, 41 Drawing Sheets

Related U.S. Application Data continuation-in-part of application No. PCT/US2011/060937, filed on Nov. 16, 2011.

(60) Provisional application No. 61/647,863, filed on May 16, 2012, provisional application No. 61/648,034, filed on May 16, 2012.

(51) Int. Cl.

| | | |
|---|---|---|
| *F21V 7/00* | (2006.01) | |
| *H01L 33/64* | (2010.01) | |
| *H01L 25/16* | (2006.01) | |
| *F21K 9/232* | (2016.01) | |
| *F21K 9/65* | (2016.01) | |
| *H01L 25/075* | (2006.01) | |
| *F21Y 105/00* | (2016.01) | |
| *F21Y 115/10* | (2016.01) | |
| *F21Y 115/15* | (2016.01) | |
| *F21Y 107/20* | (2016.01) | |

(52) U.S. Cl.
CPC .......... *H01L 25/167* (2013.01); *H01L 33/645* (2013.01); *H01L 35/30* (2013.01); *F21Y 2105/00* (2013.01); *F21Y 2107/20* (2016.08); *F21Y 2115/10* (2016.08); *F21Y 2115/15* (2016.08); *H01L 25/0753* (2013.01); *H01L 2924/0002* (2013.01)

(56) References Cited

U.S. PATENT DOCUMENTS

| | | | |
|---|---|---|---|
| 2006/0088271 A1 | 4/2006 | Ghoshal | |
| 2007/0008727 A1* | 1/2007 | Chinniah | F21S 48/1154 362/294 |
| 2008/0006843 A1 | 1/2008 | Dai et al. | |
| 2008/0013320 A1* | 1/2008 | Tain | H01L 33/645 362/294 |
| 2008/0130289 A1 | 6/2008 | Takemoto et al. | |
| 2008/0298069 A1* | 12/2008 | Chu | F21V 29/54 362/294 |
| 2009/0059594 A1* | 3/2009 | Lin | F21K 9/00 362/294 |
| 2009/0065799 A1 | 3/2009 | Kim et al. | |
| 2009/0159905 A1 | 6/2009 | Chen | |
| 2010/0110671 A1* | 5/2010 | Gordin | F21V 5/04 362/228 |
| 2010/0207573 A1 | 8/2010 | Mo et al. | |
| 2010/0284167 A1 | 11/2010 | Duong et al. | |
| 2011/0038151 A1* | 2/2011 | Carraher | F21S 8/08 362/242 |
| 2011/0234107 A1 | 9/2011 | Simon et al. | |
| 2011/0235328 A1* | 9/2011 | Xu | F21S 9/04 362/249.02 |

\* cited by examiner

SYSTEMS, METHODS AND/OR DEVICES FOR PROVIDING LED LIGHTING

CROSS-REFERENCE TO RELATED APPLICATIONS AND MATERIALS

This Application is the National Phase application of International Application No. PCT/US2012/065174, filed Nov. 15, 2012, which claims priority to U.S. Provisional Application No. 61/647,863, filed on May 16, 2012, U.S. Provisional Application No. 61/648,034, filed on May 16, 2012, International Application No. PCT/US2011/060937, filed on Nov. 16, 2011, and International Application No. PCT/US2011/060942, filed on Nov. 16, 2011. This application is also related to U.S. Provisional Application No. 61/413,995, filed on Nov. 16, 2010 and U.S. Provisional Application No. 61/532,104, filed Sep. 8, 2011. Each of these applications is herein incorporated by reference in their entirety. In addition, each of the following items is incorporated by reference in their entirety: Nichia Corporation Specification for White LED NS6W183AT, NESW157AT, and NSSL157AT-H3.

FIELD

This disclosure generally relates to systems, methods, and devices for providing Light Emitting Diode ("LED") lighting. This disclosure also relates to systems, methods, and devices for providing Organic Light Emitting Diode ("OLED") lighting. This disclosure also relates to systems, methods, and devices for providing LED lighting with reduced energy consumption.

BACKGROUND

LED lighting has come to the forefront as a more efficient means of providing household and commercial lighting. In contrast to most conventional lighting techniques, LEDs generally require electrical flow in one direction or direct current ("DC") in order to produce light. Since standard building wiring throughout the world is alternating current ("AC"), LED lighting designs typically take one of two prevailing approaches to insure sustainable light.

The first approach utilizes a driver circuit that converts AC to DC, steps down, and conditions the power. A typical converter design currently in the market utilizes up to eighty components to achieve the conversion and may use additional components if dimming is required. The second approach is to use AC LED technology.

These systems can be complex and inefficient because much of the energy is emitted as heat and the system does not manage the heat loss effectively. Additionally, there are inefficiencies caused by interference from within the system.

Accordingly, it would be desirable to have a system that managed the emitted heat in a more effective manner and reduced the inefficiencies caused by interference from within the system.

SUMMARY

In exemplary embodiments of LED lighting systems, methods, and devices, the LEDs may be isolated or substantially isolated from each other to avoid or reduce optical, thermal, and/or electrical interference associated with the production of visible light. In certain embodiments, a plurality of the LEDs may be isolated or substantially isolated from each other to avoid or reduce optical, thermal, and/or electrical interference associated with the production of visible light. In some configurations, one or more LEDs may not be isolated or substantially isolated from each other to avoid or reduce optical, thermal, and/or electrical interference associated with the production of visible light, if so desired.

Exemplary embodiments may provide a method for blocking the adverse effects on LEDs of light produced by adjacent LEDs in LED arrays. Certain embodiments may provide a device, system and/or method for blocking, reducing, or substantially blocking certain adverse effects on LEDs of light produced by adjacent LEDs in LED arrays. For example, when light from one LED (the first LED) hits another LED (the second LED) there may be at least two different things that negatively affect the ability of the second LED to produce light. First, the reflected light creates a voltage in the second LED (i.e., electrical interference), which negatively affects the ability of the second LED to produce photons. Second, the light emitted by the first LED reflects off the lens covering the second LED (i.e., optical interference) reducing the ability of the second LED to emit its own light-producing photons.

In exemplary embodiments, a lens or reflector between the LEDs may be utilized to block the path of light from one LED to another LED. These lenses, reflectors or shields reduce and/or eliminate at least one or both of the electrical and optical interference of the first LED on the second LED. In certain embodiments, at least one lens, at least one reflector, and/or at least one shield between the LEDs may be utilized to block, reduce, or substantially block the path of light from one LED to another LED. These lenses, reflectors and/or shields reduce, substantially eliminate, partially eliminate and/or eliminate at least one or both of the electrical and optical interference of the at least one first LED on the at least one second LED.

In exemplary embodiments, active heat management may be implemented using a thermoelectric device(s) that convert heat generated by the LEDs and/or other components (including, e.g., the sun, resistors, capacitors, transformers and/or other electrical components on the circuit) into electrical energy that is used to cool the LEDs.

In exemplary embodiments, thermoelectric generators thermally connected to the LEDs and/or transformers may be used to convert the emitted heat into electrical energy. In certain embodiments, at least one thermoelectric generator may be in thermal communication with at least one LED and/or at least one transformer and such a configuration may be used to convert the emitted heat into electrical energy. In exemplary embodiments, the electrical energy may be used to power another thermoelectric device(s) that actively cools the LEDs. In exemplary embodiments, this approach may be advantageous to typical passive aluminum heat sinks for at least three reasons, first the heat sink simply removes, or reduces, the heat but is unable to utilize it for other purposes, second, in many cases the heat sink(s) may be integrated and the heat they dissipate is for the most part trapped in the fixture housing rendering it useless over time and third, heat sinks may work against an outdoor circuit, when heated by the sun's thermal energy the heat sink may transfer the heat directly back to the circuit the heat sink is supposed to protect causing a much shorter life of the circuit and the circuits components. Certain disclosed embodiments address these and/or other issues and provide one or more advantages over existing LED products.

In exemplary embodiments, a pair of AC powered LEDs with opposite polarity may be used to produce constant light. In exemplary embodiments, the paired LEDs when positioned in close proximity to each other produce a steady stream of light without a noticeable strobe effect notwithstanding that each LED is cycling at e.g., between 50-60 pulses per second.

In exemplary embodiments, power control at the component level may be utilized to minimize and/or reduce power consumption and optimize and/or improve performance. By properly sizing components to draw just the power that is needed for the application, exemplary embodiments may reduce and/or minimize the amount of power that is drawn and dissipated as heat. In exemplary embodiments, the device and/or system may utilize only a few components to produce light from the LEDs. For example, in exemplary embodiments, the main component may be a step transformer that may be governed by two resistors. In exemplary embodiments, there may be no special driver board or dimmer board typically required in applications. Additionally, in exemplary embodiments, the active heat management system may have no outside power consumption as it may be powered by wasted energy of the transformers and resistors and may be on an entirety isolated circuit. In certain embodiments, the heat management system may have no outside power consumption, or reduced power consumption, as it may be powered, or partially powered, by wasted energy of the transformers and resistors.

In exemplary embodiments the LED lighting may not require the conversion of power from AC to DC or the storage of current as used by current systems, each of which results in loss of energy. Thus in exemplary embodiments, the LED lighting may:

- eliminate and/or reduce the need for costly driver circuitry used by current systems to convert power from AC to DC;
- eliminate and/or reduce the need for capacitor circuitry used by current systems to store and/or smooth power for use in off cycles;
- eliminate and/or reduce the need for special circuitry used by current systems to allow for dimming. In exemplary embodiments, a standard dimmer may be used to dim the LED lighting;
- be more reliable than previous systems;
- manage heat more effectively;
- extended the life of the LEDs since each LED (or a plurality of the LEDs) is only powered half of the time of operation, in effect, doubling, or substantially doubling its life;
- eliminate, or at least reduce, the use of circuit boards for more effective thermal management.
- eliminate, or at least reduce, the use of the reflow process to minimize, or at least reduce, damage to the LED in the fixture manufacturing process; and
- reduce the number of types of components for the LED lighting device to just the LED.

In exemplary embodiments, the life of the LED may be extended because of combinations of one or more of the following: (1) half operation of the LEDs as discussed in exemplary double string A/C embodiments; (2) reducing the current through each LED (or through a plurality of LEDs) by using more LEDs per fixture; (3) maintaining the LEDs in a cooler operating and ambient temperature; (4) not subjecting the LEDs to the high temperatures of a reflow process often used in populating circuit boards; (5) eliminating, or at least reducing, the printed circuit board primarily used for LED lighting and utilizing a substrate that eliminates, or at least reduces, thermal build up around the LEDs; and/or (6) eliminating, or at least reducing, the printed circuit board primarily used for LED lighting and utilizing the substrate that is part of a system to harvest the unwanted LED thermal energy and/or convert it into electrical energy to be used by additional LEDs, to operate chillers, or other electronic needs. In certain embodiments, the life of the LED may be extended because of one or more of the advantages discussed herein.

Exemplary embodiments may provide a lighting device comprising: a plurality of LEDs; a plurality of optic devices corresponding to the plurality of LEDs; at least one optical separator for substantially preventing the light emitted from one LED from effecting the other LEDs; a thermoelectric device configured to harvest heat generated by the LEDs and convert the harvested heat into electrical energy; and a low temperature material for creating a temperature difference across the thermoelectric device.

Exemplary embodiments may provide a lighting device comprising: a plurality of LEDs; a plurality of optic devices corresponding to the plurality of LEDs; at least one optical separator for substantially preventing the light emitted from one LED from effecting the other LEDs; optionally a thermoelectric device configured to harvest heat generated by the LEDs and convert the harvested heat into electrical energy and a low temperature material for creating a temperature difference across the thermoelectric device.

In exemplary embodiments of the lighting device, at least one optical separator substantially prevents a change in refractive index of the other LEDs.

In exemplary embodiments of the lighting device, at least one optical separator substantially prevents a photovoltaic effect on the other LEDs.

In exemplary embodiments of the lighting device, the low temperature material is a phase change material.

In exemplary embodiments of the lighting device, the harvested electrical energy is used to aid in maintaining the low temperature material at a low temperature.

In exemplary embodiments of the lighting device, the harvested electrical energy is used to aid in powering at least one additional LED.

In exemplary embodiments of the lighting device the lighting device is supplied with DC voltage.

In exemplary embodiments, the DC power may be harvested from the site where the light is needed (e.g., waste thermal energy from a water line or other local process, rectified radio waves, sunlight, etc.).

In exemplary embodiments of the lighting device, the lighting device is supplied with AC voltage and at plurality of LEDs are arranged such that about 50% are in a first polarity and about 50% are in a reverse polarity.

Exemplary embodiments may provide a lighting device comprising: a plurality of lighting means for providing light; a plurality of optic means corresponding to the plurality of lighting means; at least one optical separator means for substantially preventing the light emitted from one lighting means from affecting the other lighting means; thermoelectric means configured to harvest heat generated by the lighting means and convert the harvested heat into electrical energy; and a low temperature means for creating a temperature difference across the thermoelectric device.

In exemplary embodiments, the lighting means may be LEDs, including OLEDs.

In exemplary embodiments of the lighting device, at least one optical separator means substantially prevents a change in refractive index of the other LEDs.

In exemplary embodiments of the lighting device, at least one optical separator means for substantially preventing a photovoltaic effect on the other LEDs may be provided.

In exemplary embodiments of the lighting device, the low temperature means is a phase change material.

In exemplary embodiments of the lighting device, the generated electrical energy is used to aid in maintaining the low temperature means for storing thermal energy at a low temperature.

In exemplary embodiments of the lighting device, the generated electrical energy is used to aid in powering at least one additional lighting means.

In exemplary embodiments of the lighting device, the generated electrical energy may be used to aid in powering a device not associated with the lighting device but able to be powered by the generated energy (e.g., smoke detectors, motion detectors, cameras, etc.).

In exemplary embodiments of the lighting device. the generated electrical energy may be used to aid in powering a device associated with the lighting device that can be powered by the generated energy (e.g., timers, controllers, servos, etc.).

In exemplary embodiments of the lighting device, the lighting device may be supplied with AC voltage and at plurality of LED means are arranged such that about 50% are in a first polarity and about 50% are in a reverse polarity and the voltage is stepped up or down by use of a transformer with governing resistance.

In exemplary embodiments of the lighting device, the lighting device may be supplied with AC voltage where the number of LEDs placed in series equals the A/C input voltage to reduce (or substantially eliminate) the efficiency loss of a transformer.

In exemplary embodiments of the lighting device, the lighting device may be supplied with AC voltage and a plurality of LEDs means are arranged such that about 50% are in a first polarity and about 50% are in a reverse polarity and the lighting device is supplied with AC voltage where the forward voltage of the LED's placed in series match the supplied AC voltage to eliminate the efficiency loss of a transformer.

In exemplary embodiments of the lighting device, the lighting device may be supplied with AC voltage and the first four LEDs are configured as diodes in a typical rectifying pattern where the reverse current allowable for the LEDs is not exceeded giving the remaining LED DC power and the forward voltage of the LED's placed in series matching the supplied AC voltage.

In certain embodiments, the lighting device may be supplied with AC voltage and the at least first four LEDs are configured as diodes in a rectifying pattern where the reverse current allowable for the LEDs is not exceeded giving the remaining LEDs DC power and the forward voltage of the LED's placed in series matching, or substantially matching, the supplied AC voltage and at least one thermoelectric chiller may be placed in the circuit after the first four LEDs configured as diodes in a rectifying pattern.

In exemplary embodiments of the lighting device, the lighting device may be supplied with AC voltage and the first four LEDs are configured as diodes in a typical rectifying pattern where the reverse current allowable for the LEDs is not exceeded giving the remaining LEDs DC power and the voltage is stepped up or down by use of a transformer with governing resistance.

In exemplary embodiments of the lighting device, the lighting device may be supplied with AC voltage and the at least first four LEDs are configured as diodes in a rectifying pattern where the reverse current allowable for the LEDs is not exceeded giving the remaining LED DC power and the voltage is stepped up or down by use of at least one transformer with governing resistance and at least one thermoelectric chiller may be placed in the circuit after the first four LEDs configured as diodes in a rectifying pattern.

In exemplary embodiments of the lighting device the lighting device may be supplied with AC voltage and four blocking diodes may be included in a typical rectifying pattern to convert the AC to DC giving the LEDs DC power and the voltage is stepped up or down by use of a transformer with governing resistance.

In exemplary embodiments of the lighting device the lighting device may be supplied with AC voltage and four blocking diodes may be included in a typical rectifying pattern to convert the AC to DC giving the LEDs DC power and the voltage is stepped up or down by use of a transformer with governing resistance and a thermoelectric chiller may be placed in the circuit after the first four LEDs configured as diodes in a typical rectifying pattern.

In exemplary embodiments of the lighting device, the lighting device may be supplied with AC voltage and four blocking diodes may be included in a typical rectifying pattern to convert the AC to DC giving the LEDs DC power and the voltage is dealt with by the number of LED's placed in series on the circuit eliminating the need for of a transformer with governing resistance.

In exemplary embodiments of the lighting device, the lighting device may be supplied with AC voltage and four blocking diodes may be included in a typical rectifying pattern to convert the AC to DC giving the LEDs DC power and the voltage is dealt with by the number of LED's placed in series on the circuit eliminating the need for of a transformer with governing resistance and a thermoelectric chiller may be placed in the circuit after the four blocking diodes configured as diodes in a typical rectifying pattern.

In exemplary embodiments of the lighting device, the lighting device may be supplied with AC voltage and four blocking diodes may be included in a typical rectifying pattern to convert the AC to DC giving the LEDs DC power, the voltage being dealt with by the number of LED's placed in series on the circuit eliminating the need for of a transformer with governing resistance and a capacitor may be added between the rectifying circuit and the LEDs to smooth out current ripple.

In exemplary embodiments of the lighting device, the lighting device may be supplied with AC voltage and four blocking diodes may be included in a typical rectifying pattern to convert the AC to DC giving the LEDs DC power, the voltage being dealt with by the number of LED's placed in series on the circuit eliminating the need for of a transformer with governing resistance, a capacitor may be added between the rectifying circuit and the LEDs to smooth out current ripple and a thermoelectric chiller may be placed in the circuit after the four blocking diodes configured as diodes in a typical rectifying pattern.

In exemplary embodiments of the lighting device, the lighting device may be supplied with AC voltage and four blocking diodes may be included in a typical rectifying pattern to convert the AC to DC giving the LEDs DC power, the voltage being dealt with by the number of LED's placed in series on the circuit eliminating the need for of a transformer with governing resistance and a fuse may be added on the neutral lead before the rectifying circuit to protect the lighting device from power spikes.

In exemplary embodiments of the lighting device, the lighting device may be supplied with AC voltage and four blocking diodes may be included in a typical rectifying pattern to convert the AC to DC giving the LEDs DC power, the voltage being dealt with by the number of LED's placed in series on the circuit eliminating the need for of a transformer with governing resistance, a fuse may be added on the neutral lead before the rectifying circuit to protect the lighting device from power spikes and a thermoelectric chiller may be placed in the circuit after the four blocking diodes configured as diodes in a typical rectifying pattern.

In exemplary embodiments of the lighting device, the lighting device may be supplied with AC voltage and four blocking diodes may be included in a typical rectifying pattern to convert the AC to DC giving the LEDs DC power, the voltage being dealt with by the number of LED's placed in series on the circuit eliminating the need for of a transformer with governing resistance, a capacitor may be added between the rectifying circuit and the LEDs to smooth out current ripple and a fuse added on the neutral lead before the rectifying circuit to protect the lighting device from power spikes.

In exemplary embodiments of the lighting device, the lighting device may be supplied with AC voltage and four blocking diodes may be included in a typical rectifying pattern to convert the AC to DC giving the LEDs DC power, the voltage being dealt with by the number of LED's placed in series on the circuit eliminating the need for of a transformer with governing resistance, a capacitor added between the rectifying circuit and the LEDs to smooth out current ripple, a fuse may be added on the neutral lead before the rectifying circuit to protect the lighting device from power spikes and a thermoelectric chiller may be placed in the circuit after the four blocking diodes configured as diodes in a typical rectifying pattern.

In exemplary embodiments of the lighting device, the lighting device may be supplied with AC voltage and four foam diodes may be included in a typical rectifying pattern to convert the AC to DC giving the LEDs DC power and the voltage is stepped up or down by use of a transformer with governing resistance.

In exemplary embodiments of the lighting device, the lighting device may be supplied with AC voltage and four foam diodes may be included in a typical rectifying pattern to convert the AC to DC giving the LEDs DC power and the voltage is stepped up or down by use of a transformer with governing resistance and a thermoelectric chiller may be placed in the circuit after the four foam diodes configured as diodes in a typical rectifying pattern.

In exemplary embodiments of the lighting device, the lighting device may be supplied with AC voltage and four foam diodes may be included in a typical rectifying pattern to convert the AC to DC giving the LEDs DC power and the voltage is dealt with by the number of LED's placed in series on the circuit eliminating the need for of a transformer with governing resistance.

In exemplary embodiments of the lighting device, the lighting device may be supplied with AC voltage and four foam diodes may be included in a typical rectifying pattern to convert the AC to DC giving the LEDs DC power and the voltage is dealt with by the number of LED's placed in series on the circuit eliminating the need for of a transformer with governing resistance and a thermoelectric chiller may be placed in the circuit after the four foam diodes configured as diodes in a typical rectifying pattern.

In exemplary embodiments of the lighting device, the lighting device may be supplied with AC voltage and four foam diodes may be included in a typical rectifying pattern to convert the AC to DC giving the LEDs DC power, the voltage being dealt with by the number of LED's placed in series on the circuit eliminating the need for of a transformer with governing resistance and a capacitor may be added between the rectifying circuit and the LEDs to smooth out current ripple.

In exemplary embodiments of the lighting device, the lighting device may be supplied with AC voltage and four foam diodes may be included in a typical rectifying pattern to convert the AC to DC giving the LEDs DC power, the voltage being dealt with by the number of LED's placed in series on the circuit eliminating the need for of a transformer with governing resistance, a capacitor may be added between the rectifying circuit and the LEDs to smooth out current ripple and a thermoelectric chiller may be placed in the circuit after the four foam diodes configured as diodes in a typical rectifying pattern.

In exemplary embodiments of the lighting device, the lighting device may be supplied with AC voltage and four foam diodes may be included in a typical rectifying pattern to convert the AC to DC giving the LEDs DC power, the voltage being dealt with by the number of LED's placed in series on the circuit eliminating the need for of a transformer with governing resistance, a fuse may be added on the neutral lead before the rectifying circuit to protect the lighting device from power spikes.

In exemplary embodiments of the lighting device, the lighting device may be supplied with AC voltage and four foam diodes may be included in a typical rectifying pattern to convert the AC to DC giving the LEDs DC power, the voltage being dealt with by the number of LED's placed in series on the circuit eliminating the need for of a transformer with governing resistance, a fuse may be added on the neutral lead before the rectifying circuit to protect the lighting device from power spikes and a thermoelectric chiller may be placed in the circuit after the four foam diodes configured as diodes in a typical rectifying pattern.

In exemplary embodiments of the lighting device, the lighting device may be supplied with AC voltage and four foam diodes may be included in a typical rectifying pattern to convert the AC to DC giving the LEDs DC power, the voltage being dealt with by the number of LED's placed in series on the circuit eliminating the need for of a transformer with governing resistance, a capacitor added between the rectifying circuit and the LEDs to smooth out current ripple and a fuse may be added on the neutral lead before the rectifying circuit to protect the lighting device from power spikes.

In exemplary embodiments of the lighting device, the lighting device may be supplied with AC voltage and four foam diodes may be included in a typical rectifying pattern to convert the AC to DC giving the LEDs DC power, the voltage being dealt with by the number of LED's placed in series on the circuit eliminating the need for of a transformer with governing resistance, a capacitor added between the rectifying circuit and the LEDs to smooth out current ripple, a fuse may be added on the neutral lead before the rectifying circuit to protect the lighting device from power spikes and a thermoelectric chiller may be placed in the circuit after the four foam diodes configured as diodes in a typical rectifying pattern.

In exemplary embodiments of the lighting device, a lighting circuit, or part of a lighting circuit, with multiple lighting devices, may share the voltage transformer and AC to DC conversion thereby reducing the cost and complexity of the lighting device and also sharing a single conversion loss over multiple lighting devices.

In exemplary embodiments of the lighting device in applications for omnidirectional light output, (e.g. bulbs), the LEDs may be configured in a three dimensional pattern to emit light in an omnidirectional pattern separated by their relative angle in space so as not to emit light on one another.

In exemplary embodiments of the lighting device in applications for omnidirectional light output, (e.g. bulbs), the LEDs may be configured in a three dimensional pattern inside a diffuser bulb housing to emit light in an omnidirectional pattern separated by their relative angle in space so as not to emit light on one another.

In exemplary embodiments of the lighting device in applications for omnidirectional light output, (e.g. bulbs), the LEDs may be configured in a three dimensional pattern on the outside of a bulb housing to emit light in an omnidirectional pattern separated by their relative angle in space so as not to emit light on one another and not take secondary diffusion loss, reduce secondary diffusion loss, or substantially not take secondary diffusion loss.

In exemplary embodiments of the lighting device in applications for omnidirectional light output, (e.g. bulbs), the LEDs may be configured in a three dimensional pattern on the inside of a bulb housing with openings in the bulb housing for the LED lenses to emit light in an omnidirectional pattern separated by their relative angle in space so as not to emit light on one another and not take secondary diffusion loss, reduce secondary diffusion loss, or substantially not take secondary diffusion loss.

In exemplary embodiments of the lighting device in applications for omnidirectional light output, (e.g. bulbs), the LEDs may be configured in a three dimensional pattern manufactured within the bulb housing with openings in the bulb housing for the LED lenses to emit light in an omnidirectional pattern separated by their relative angle in space so as not to emit light on one-another and not take secondary diffusion loss, reduce secondary diffusion loss, or substantially not take secondary diffusion loss.

In exemplary embodiments, the lighting device may have multiple Color Rendering Indexes ("CRI") by having multiple circuits of LEDs with different CRIs that may be controlled by a physical switch.

In exemplary embodiments, the lighting device may have multiple CRI's by having multiple circuits of LEDs with different CRI's that may be controlled by a resident memory switch chip.

In exemplary embodiments, the lighting device may have multiple CRI's by having multiple circuits of LEDs with different CRI's that may be controlled by a Digital Multiplex interface ("DMX-512") control system.

In exemplary embodiments, the lighting device may have multiple Correlated Color Temperatures ("CCT") by having multiple circuits of LEDs with different CCT's that may be controlled by a physical switch.

In exemplary embodiments, the lighting device may have multiple CCT's by having multiple circuits of LEDs with different CCT's that may be controlled by a resident memory switch chip.

In exemplary embodiments, the lighting device may have multiple CCT's by having multiple circuits of LEDs with different CCT's that may be controlled by a Digital Multiplex interface ("DMX-512") control system.

In exemplary embodiments, the lighting device may have multiple color LEDs (e.g., red, green and blue), wherein one or more have different output of emitted light for the fixed generation of "white" light.

In exemplary embodiments the lighting device may have one color or multiple color LEDs (e.g., red, green and blue), wherein one or more have different output of emitted light for the fixed generation of various colors of light.

In exemplary embodiments the lighting device may have one color or multiple color LEDs (e.g., red, green and blue), wherein one or more have different output of emitted light for the adjustable generation of various colors of light that may be controlled by a Digital Multiplex interface ("DMX-512") control system.

In exemplary embodiments the lighting device may have multiple color LEDs (e.g., red, green, blue, ultra violet and near infrared), wherein one or more have different output of emitted light to match (or substantially match) the ideal light spectrum for photosynthesis for the growth of plant life.

DESCRIPTION OF THE DRAWINGS

Exemplary embodiments will now be described, by way of example only, with reference to the accompanying drawings in which.

DETAILED DESCRIPTION

Figure 1:
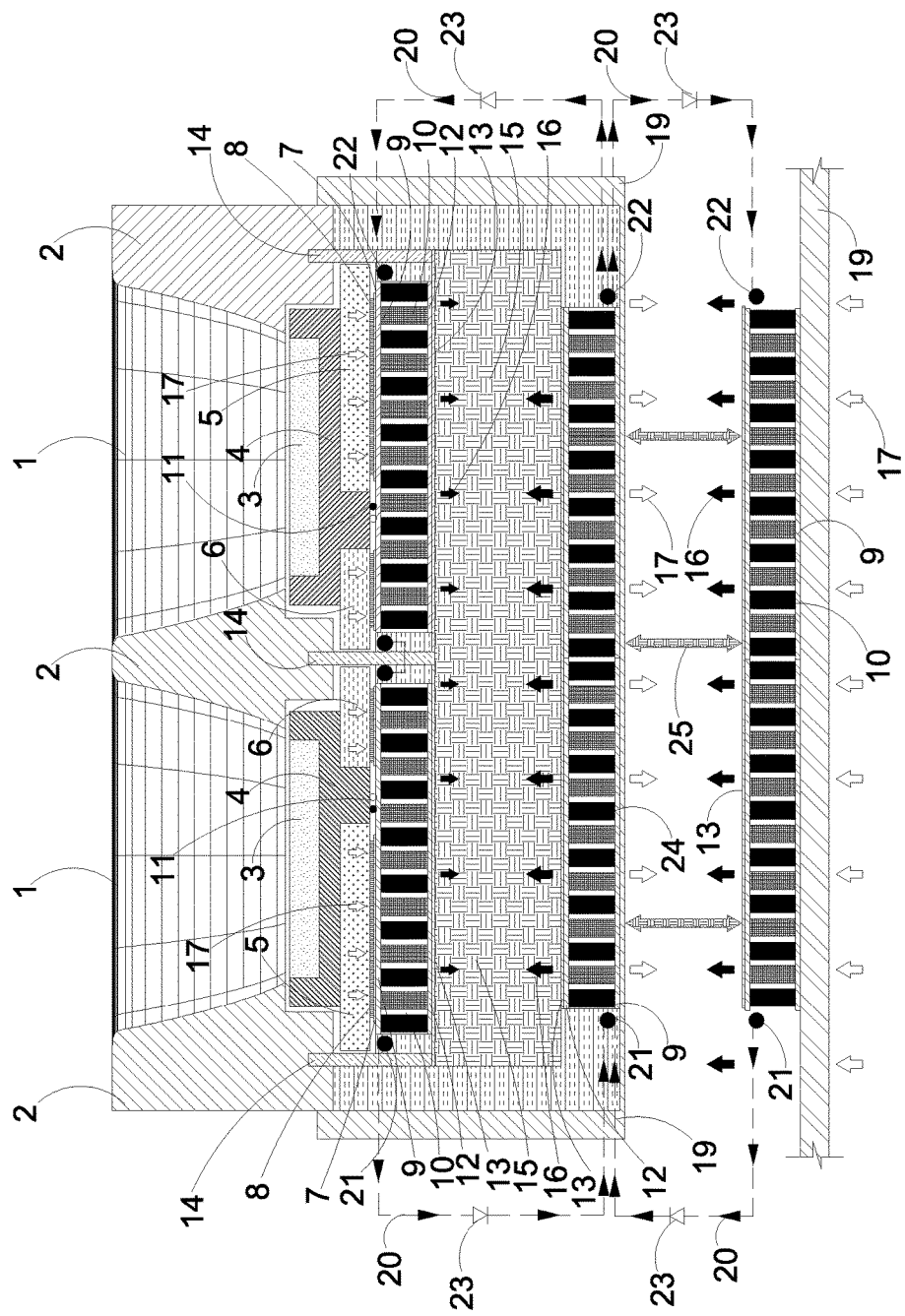
FIG. 1 is a schematic diagram of an exemplary LED lighting device.

Exemplary embodiments described in the disclosure relate to efficient LED light generation and delivery. Certain embodiments disclosed herein may be beneficial for environmental and/or economic reasons. In certain embodiments, the systems, methods and devices for LED lighting disclosed herein may require an amount of power that renders it feasible for building LED lighting systems to be completely or partially off-grid power. In certain embodiments, due to the low current and the active cooling methods disclosed herein, the life cycle of the systems, methods and devices for LED lighting may exceed 25,000, 50,000, 100,000, 250,000, 400,000, 600,000, 900,000 or a million hours, drastically reducing lighting maintenance and/or replacement costs. In certain embodiments, the systems, methods and devices for LED lighting disclosed herein may reduce the cost of agriculture by providing economical hydroponic and/or aeroponic urban indoor farming due at least in part to the ability of producing a variety of spectrums of light with a reduced heat and/or power consumption as compared to conventional agricultural grow light systems.

In certain embodiments, the cost of cooling in buildings may be decreased due to the little, reduced, or minimal heat output of the certain embodiments. In the United States, twenty percent of cooling is used to offset the heat generated by lighting. In certain embodiments, production costs for movies and/or events may be greatly reduced due to the low power requirements and/or the lack of heat generation. In certain embodiments, the systems, methods and devices for LED lighting may provide possible roadway lighting to be, partially, substantially, or entirely off the power grid and/or powered instead by solar power, reducing the cost of energy, the cost of infrastructure and/or maintenance or combinations thereof related to roadway lighting. In certain embodiments, the systems, methods and devices for LED lighting may provide for reduced power needs and/or longer lifecycles to electronics such as LED billboards, televisions, displays, laptop and desktop computers, tablet computers, cellphones and/or handheld devices.

Certain embodiments may provide secondary electrical power for subsystems here before not possible without additional power supplies. Certain embodiments may provide additional cooling to electronic systems, which may enhance performance and/or extend lifespan. Certain embodiments disclosed herein provide methods to eliminate, or reduce, the need for circuit boards in electrical systems which may reduce manufacturing cost for lighting and/or other types of electronics.

In certain embodiments, the systems, methods and devices for LED lighting disclosed herein may reduce the amount of photons needed, and thus require less power, to be generated because a substantial portion, or a portion, of the photons emitted from the LED device makes it to the desired working surface. In certain embodiments, the systems, methods and devices for LED lighting disclosed herein may use AC and/or DC power. However, in certain applications, DC power may be the preferred and/or more efficient choice.

In certain embodiments, the systems, methods and devices for LED lighting disclosed herein permit a typical 100 Watt incandescent bulb replacement with a light output of 1,600 lumens, and a lifespan of 750 hours to be replaced by an LED bulb with a light output of 1,600 lumens and a lifespan of in excess of 60,000, 100,000, 400,000, 800,000 or a million hours which uses approximately 8 Watts. In certain aspects, this LED bulb may be manufactured for at least 20%, 30%, 40%, 50%, 65%, or 75% less costs than conventional LED bulbs on the market.

In certain embodiments, the systems, methods and devices for LED lighting disclosed herein permit disclosure a typical 60 Watt incandescent bulb replacement with a light output of 910 lumens and a lifespan of 1000 hours to be replaced by an LED bulb with a light output of 910 lumens and a lifespan of in excess of 60,000, 100,000, 400,000, 800,000 or a million hours which uses approximately 5.4 Watts. In certain aspects, this LED bulb may be manufactured for at least 20%, 30%, 40%, 50%, 65%, or 75% less cost than conventional LED bulbs on the market.

In certain embodiments, the systems, methods and devices for LED lighting disclosed herein permit a typical 40 Watt incandescent bulb replacement with a light output of 600 lumens and a lifespan of 1,200 hours to be replaced by an LED bulb with a light output of 600 lumens and a lifespan of in excess of 60,000, 100,000, 400,000, 800,000 or a million hours which uses approximately 3.5 Watts. In certain aspects, this LED bulb may be manufactured for at least 20%, 30%, 40%, 50%, 65%, or 75% less costs than conventional LED bulbs on the market.

In certain embodiments, the systems, methods and devices for LED lighting disclosed herein permit a H.I.D. lamp and ballast consuming 1,250 Watts with a system lifespan of three to five years to be replaced by an LED system with equivalent light output at the working surface and a lifespan of in excess of 60,000, 100,000, 400,000, 800,000 or a million hours which uses less than 10 Watts. In certain aspects, this LED system may be priced for a return of investment of under one year.

In certain embodiments, the systems, methods and devices for LED lighting disclosed herein permit a parking lot and parking structure lamps and ballast consuming 1,250 Watts with a system lifespan of three to five years to be replaced by an LED system with equivalent light output at the working surface and a lifespan of millions of hours may use less than 10 Watts and may be priced for a return of investment of under one year.

In certain embodiments, the systems, methods and devices for LED lighting disclosed herein permit a parking lot and parking structure lamps and ballast consuming 650 Watts with a system lifespan of three to five years to be replaced by an LED system with equivalent light output at the working surface and a lifespan of in excess of 60,000, 100,000, 400,000, 800,000 or a million hours which uses less than 5 Watts. In certain aspects, the LED system may be priced for a return of investment of under one year.

In certain embodiments, the systems, methods and devices for LED lighting disclosed herein permit a parking lot and parking structure lamps and ballast consuming 350 Watts with a system lifespan of three to five years to be replaced by an LED system with equivalent light output at the working surface and a lifespan of in excess of 60,000, 100,000, 400,000, 800,000 or a million hours which uses less than 3 Watts. In certain aspects, this LED system may be priced for a return of investment of under one year.

In certain embodiments, the systems, methods and devices for LED lighting disclosed herein permit an outdoor architectural building illumination lamps and ballast consuming 1,700 Watts with a system lifespan of two to four years to be replaced by an LED system with equivalent light output at the working surface and a lifespan of in excess of 60,000, 100,000, 400,000, 800,000 or a million hours which uses less than 170 Watts. In certain aspects, this LED system may be priced for a return of investment of under one year.

In certain embodiments, the systems, methods and devices for LED lighting disclosed herein permit a halogen work lights consuming 500 Watts with a lamp lifespan of 1,000 hours to be replaced by an LED system with equivalent light output at the working surface and a lifespan of in excess of 60,000, 100,000, 400,000, 800,000 or a million hours millions of hours may use less than 12 Watts if powered by AC or 8 Watts if powered by DC.

Certain embodiments are directed to systems, methods and/or devices for LED lighting wherein the life cycle of the LED lighting is in excess of 30,000, 50,000, 100,000, 250,000, 500,000, 750,000, or 1 million hours of use. Certain embodiments are directed to systems, methods and/or devices for LED lighting wherein the life cycle of the LED lighting is between 50,000 to 100,000, 100,000 to 250,000, 150,000 to 300,000, or 500,000 to 750,000 hours of use. Certain embodiments are directed to systems, methods and/or devices for LED lighting wherein the life cycle of the LED lighting is in excess of 5, 10, 15, 20, 30, 50, or 100 years of use.

Certain embodiments are directed to systems, methods and/or devices for LED lighting wherein disclosed herein permit.

FIG. 1 is a schematic diagram of an exemplary LED lighting device. In FIG. 1, an individual optic device 1 is used for each LED (or a plurality of LEDs) in the exemplary fixture. An optic separator 2 may be set at the edge of the LED lens 3 and may be a part of or be separate from the optic device 1. This arrangement may help to ensure that substantially less, little to no stray light from the other LEDs or elsewhere cause a reflection across the protected LED thus changing its refractive index or otherwise causing an unwanted photovoltaic effect on the semiconductor at the base of the LED lens 3. As shown in FIG. 1, the LED lens 3 may be seated in an LED die 4. In exemplary embodiments, the LED anode 5 and LED cathode 6 may be connected to the fixture circuit layer 7 using electrically and thermally conductive epoxy 8 that may cure at a temperature below 70° C., to avoid high temperatures (e.g., >260° C.) typically used by the electronics industry in reflow ovens. As would be understood by persons of ordinary skill in the art, the oven temperatures may be more than those considered safe for LEDs. Exposure to these high temperatures causes loss in the LEDs' lifetime. In exemplary embodiments, limiting the exposure of the LEDs to temperatures below 70° C. (e.g., below 100° C., below 90° C., below 80° C., below 75° C., below 70° C., below 65° C., below 60° C., below 50° C., etc.) may extend the duty cycle of the LEDs.

In exemplary embodiments, the circuit layer 7 may be a semiconductor device specific electrically conductive pad and trace layer applied directly to the thermally conductive, but electrically non-conductive, thermoelectric device substrate (hot side) 9 of a thermoelectric device 10. In exemplary embodiments, this may be accomplished by way of printing, etching and/or fastening, that eliminates the use of circuit boards. The elimination of the circuit board may achieve one or more benefits, including but not limited to; firstly, it may allow for a direct (or substantially direct) path of component thermal waste energy away from the component eliminating (or reducing) the common heat buildup into the circuit board's dielectric layer that has negative effects on the components and/or secondly, it may make possible the use of a printed, etched and/or fastened trace to the substrate as a resistor eliminating (or reducing) circuit components.

The LED circuit begins and ends with LED power supply connectors 11 and in exemplary embodiment no driver board may be required as the circuit layer 7 may be engineered to include the LED component specific current and voltage resistance and/or impedance in the case of alternating current. The thermoelectric device substrate (cold side) 12 of the thermoelectric device 10 is fastened, using known methods practiced for thermoelectric devices, to a thermally conductive substrate 13. The thermally conductive substrate 13 may include thermally conductive vertical path walls 14 that attach to the optic separator 2 to chill the ambient temperature of the LEDs and may also be part of the containment structure for low temperature phase change material storage 15.

In operation, when electrical energy is connected to the circuit layer 7 by way of the LED power supply connectors 11, the connected LEDs emit light as intended but also produce waste heat through the LED anode 5 and LED cathode 6. The waste heat is drawn away through the thermoelectric device 10 towards the low temperature phase change material storage 15 in a calculable and/or definable high temperature flow direction 17. The design temperature of the low temperature phase change material storage 15, the heat rejection flow direction 16, the thermal energy produced by the LEDs, and/or the thermal resistivity of the thermoelectric device 10 determines at least in part the amount of wasted heat energy converted back into electrical energy. Parts of the low temperature phase change material storage 15 that are not desired to be thermally conductive may be constructed using a thermal insulating barrier 18 to aid in maintaining the temperature of the low temperature phase change material storage 15.

Another source of heat to create a high temperature flow direction 17 through the thermoelectric device 10 towards the low temperature phase change material storage 15 and generate electrical energy is the fixture's outer housing 19, especially in outdoor fixtures during daytime hours as long as there is a thermally conductive link 25 to the low temperature phase change material storage 15. The electricity generated by the processes described herein moves as a direct current flow 20 from the positive leads 21 of the thermoelectric device 10 through protection diodes 23 (designed to confine the flow in one direction) and onto the positive lead 21 of the thermoelectric chiller 24 which continually chills the low temperature phase change material storage 15 and out the negative lead 22 through protection diodes 23 and onto the negative lead 22 of the thermoelectric device 10, completing the circuit.

In exemplary embodiments, this electrical circuit may be substantially separated or completely separate from the circuit powering the LEDs. In exemplary embodiments, the power supply for the LED circuit may be done without secondary circuits because of the current and voltage regulating circuit layer 7. In the case of DC power, which in exemplary embodiments may be desirable, the selection of the proper DC power source voltage and amperage per the LED manufacture's specifications may be sufficient to what is required. In the case of AC power, exemplary embodiments may employ the use of a transformer that converts the incoming voltage and amperage to the desired power source voltage and amperage of the LEDs per the LED manufacture's specifications. Additionally, in exemplary embodiments, the LED circuit may have equal LEDs set on the circuit layer 7 in reverse polarity and set in close proximity to its opposite LED, so as to use both sides of the electrical wave pattern. The use of resistors on both leads of the high voltage portion of the transformer may be suggested to maintain a longer transformer life. A method of eliminating the transformer may be to use a large number of LEDs in series to match the high voltage in buildings and use the first four LEDs to act as blocking diodes in a rectifying circuit configuration. Two of the four LEDs would alternate and the rest of the LEDs would get a direct current. To eliminate flicker on the four LEDs, in exemplary embodiments, the alternating pairs may be close to one another or cover the same area at the working surface the LED lighting is intended for.

In exemplary embodiments, the LED components prior to being used in a lighting system may have an efficacy of 150 lm/w at 2.86V and 350 mA with a 25° C. Ambient and Solder Junction Temperature and a Lifecycle of 100,000 hours? (lifecycle may be to 70% efficiency) as may be specified by LED manufacturers.

Typical industry fixtures may have one or more of the following features:
   A driver board designed for 3V and 500 mA (power mismatch and current overdrive): −30 lm/w—Lifecycle loss 5%;
   Driver board loss (A/C to D/C and rectifying-smoothing): −40 lm/w—Lifecycle loss 0%;
   The light may be mounted on PCB using reflow oven (heat damage to LED integrated optics): −2 lm/w—Lifecycle loss 18%;
   Thermal design of fixture may not remove/reduce ambient heat: −5 lm/w—Lifecycle loss 22%;
   The thermal design of the fixture may not remove/reduce solder junction heat: −5 lm/w—Lifecycle loss 10%;
   Optical light spillover: −12 to 20 lm/w—Lifecycle loss 5%.

As a result of these inefficiencies, typical lighting solutions may have one or more of the following limitations:
   The LED Efficacy may drop from 150 lm/w to 56 lm/w;
   The LED Lifecycle may drop from 100,000 hours to 25,000 hours (manufactures generally do not give more than a 5 year warranty);
   Other drawbacks may include:
      Other components on driver board may fail sooner;
      Driver board may cause more heat due to more components;
      Heat transfer methods may not work in fixture housings like ceiling cans;
      Outdoor fixtures subject to hot and cold changes daily may cause damage to PCB by expansion and contraction;
      More components and larger heat sinks cost more;
      Since most fixtures share optics in an array, a large percentage, (sometimes in excess of 80%) of the lumens that are not lost from the above mentioned reasons, may not hit the working surface the fixture is intended for.

Certain embodiments disclosed herein provide lighting devices that use multiplies of LEDs per lighting device as compared with a typical LED lighting device. In certain aspects, the disclosed lighting device may use a multiply of 2, 3, 4, 5, 6, 7, 8, 10, 12, 16, 20, 30, 50, 60, 70, or 100. In certain aspects, the disclosed lighting device may use a multiply of 2, 3, 4, 5, 6, 7, 8, 10, 12, 16, 20, 30, 50, 60, 70, or 100 and drawing $\frac{1}{32}$, $\frac{1}{20}$, $\frac{1}{16}$, $\frac{1}{10}$, $\frac{1}{8}$, $\frac{1}{4}$ or $\frac{1}{2}$ of the current, with the voltage matched (or substantially match) to the recommended current of the LED per the manufacturer's specifications. In certain embodiments, this may result in one or more of the following: reducing the amount of heat generated by the fixture, increasing the efficacy (lumens per Watt of power used) of each LED (or the plurality of LEDs)

and the lighting device, and lengthening the life span of the LEDs and the lighting device. In certain embodiments, the amount of heat generated may be reduce by 10%, 20%, 35%, 50%, 65%, 70%, 85%, 90%, or 95%. In certain embodiments, the lighting device are configured such that the efficacy of the plurality of LEDs is at least 5%, 10%, 15%, 20%, 25%, 30%, 40%, 50%, 60%, 70%, 80%, 90%, 95% or 99% greater than the efficacy of an individual LED. In certain embodiments, the lighting device are configured such that the efficacy of the plurality of LEDs is between 5% to 99%, 5% to 40%, 10% to 30%, 20% to 40% 50% to 70%, 60% to 85% or 40% to 90% greater than the efficacy of an individual LED. In certain embodiments, the lighting device may have a life cycle that exceeds 25,000, 50,000, 100,000, 250,000, 400,000, 600,000, 900,000 or a million hours. Certain embodiments may combine one or more of the features discussed herein.

Most LED chip and/or component manufactures publish specifications for their products that include electrical charts for matching the current with the proper voltage, thermal charts for determining heat vs. light output and lifecycle charts that determine lifespan (or "duty-cycle") based on the previous chart specifications. A typically LED lighting device may often be required to endure a greater amount of heat, produce less light and have a considerably shorter duty-cycle as compared with certain disclosed embodiments. For example, a lighting device according to certain embodiment may use four LEDs using one fourth of the current for each LED. Since the efficacy of each LED increases as you lower the current, the efficacy of the combined four is considerably higher than the single LED running at a higher current.

One way to determine an optimal power input for a lighting device according to certain embodiments wherein the desire is to achieve higher efficacies in the lighting device is to determine a power ratio verses relative luminous flux. This may be done by using the following method. First you begin with chip selection from the binning tables of the LED specification (For example NS6W183AT). Below in Table 2 is set forth such a binning table:

TABLE 2

| Item | Rank | Min | Max | Unit |
|---|---|---|---|---|
| Forward Voltage | L | 3.2 | 3.6 | V |
| | K | 2.8 | 3.2 | |
| | J | 2.4 | 2.8 | |
| Luminous Flux | B14 | 140 | 150 | lm |
| | B13 | 130 | 140 | |
| | B12 | 120 | 130 | |
| | B11 | 110 | 120 | |

Figure 38:
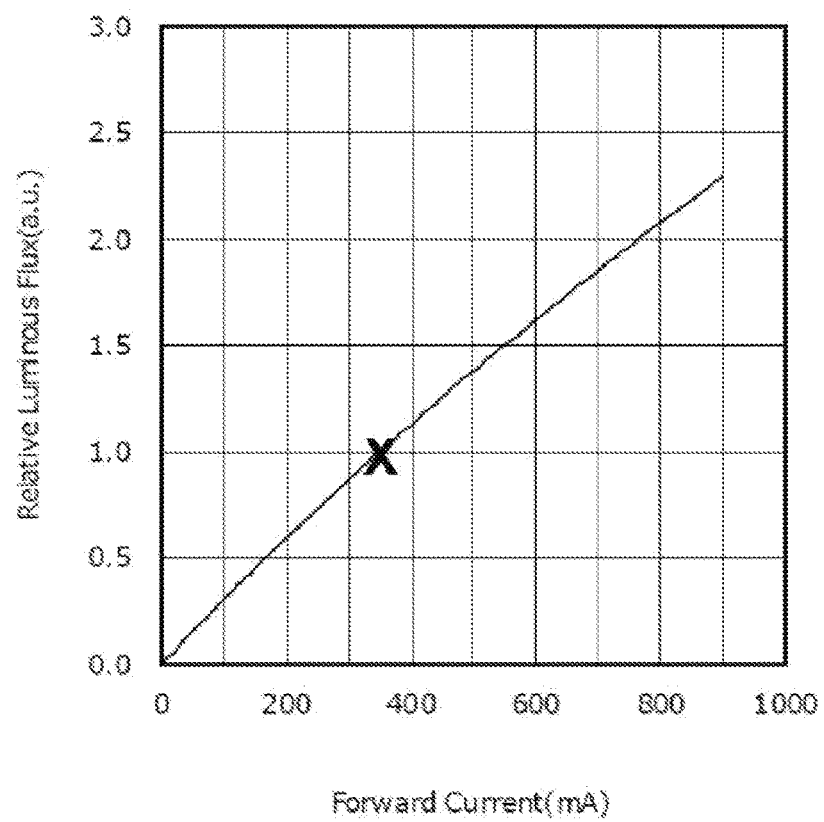
FIG. 38 is a graph that plots the Forward Current verse the relative luminous flux from NS6W183AT.
Figure 39:
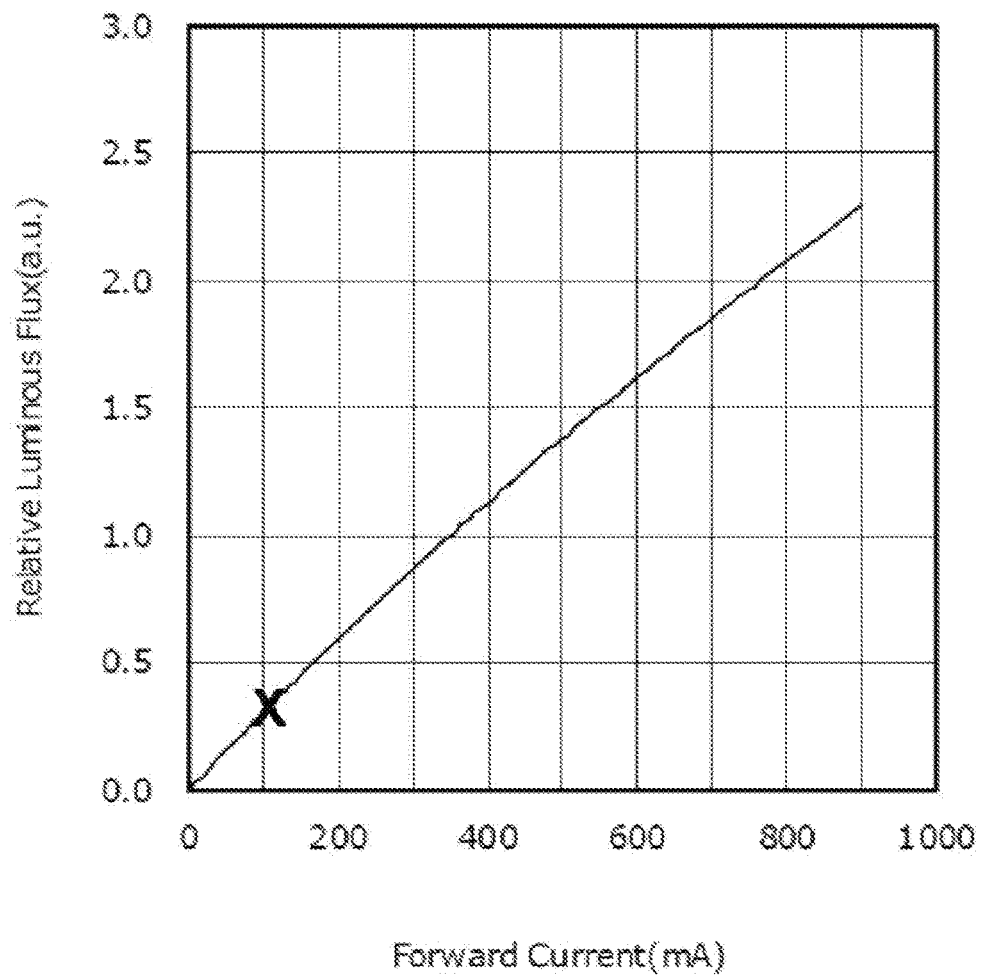
FIG. 39 is a graph that plots the Forward Current verse the relative luminous flux from NS6W183AT.
Figure 40:
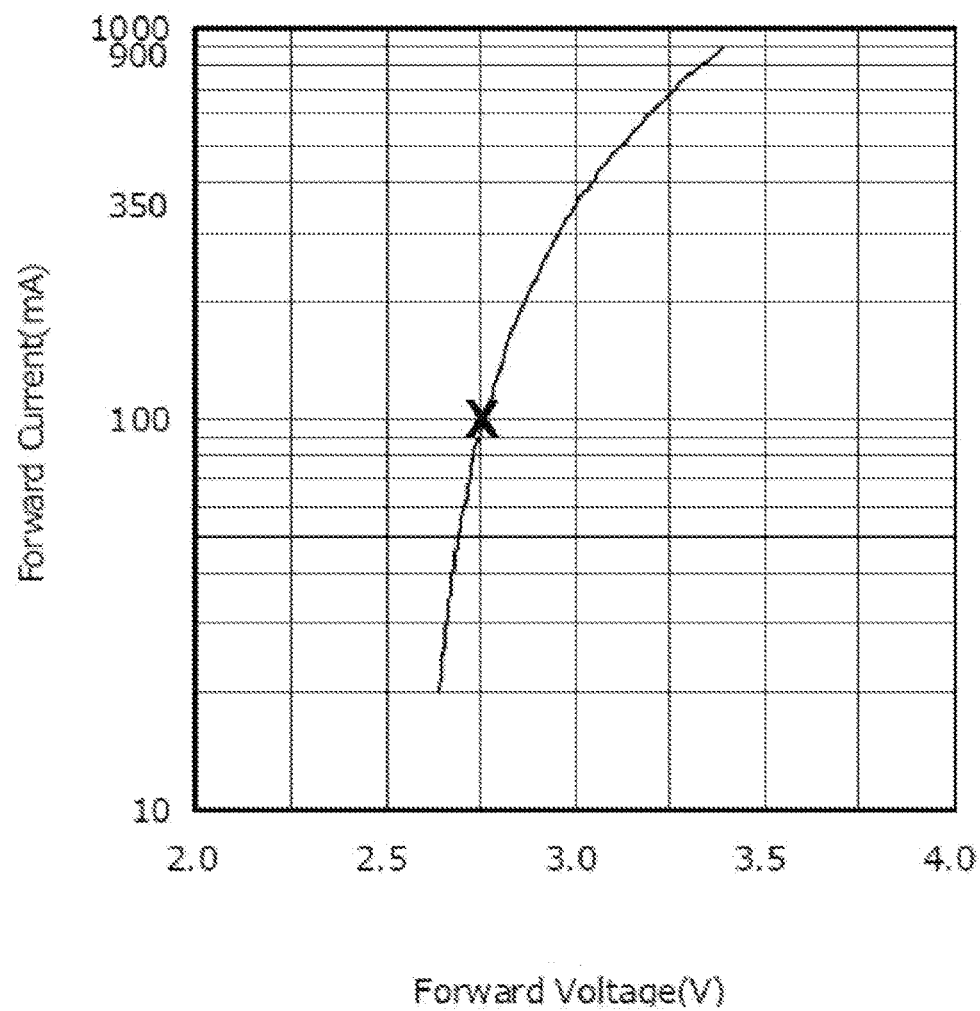
FIG. 40 is a graph that plots Forward Voltage verse Forward Current from NS6W183AT.
Figure 41:
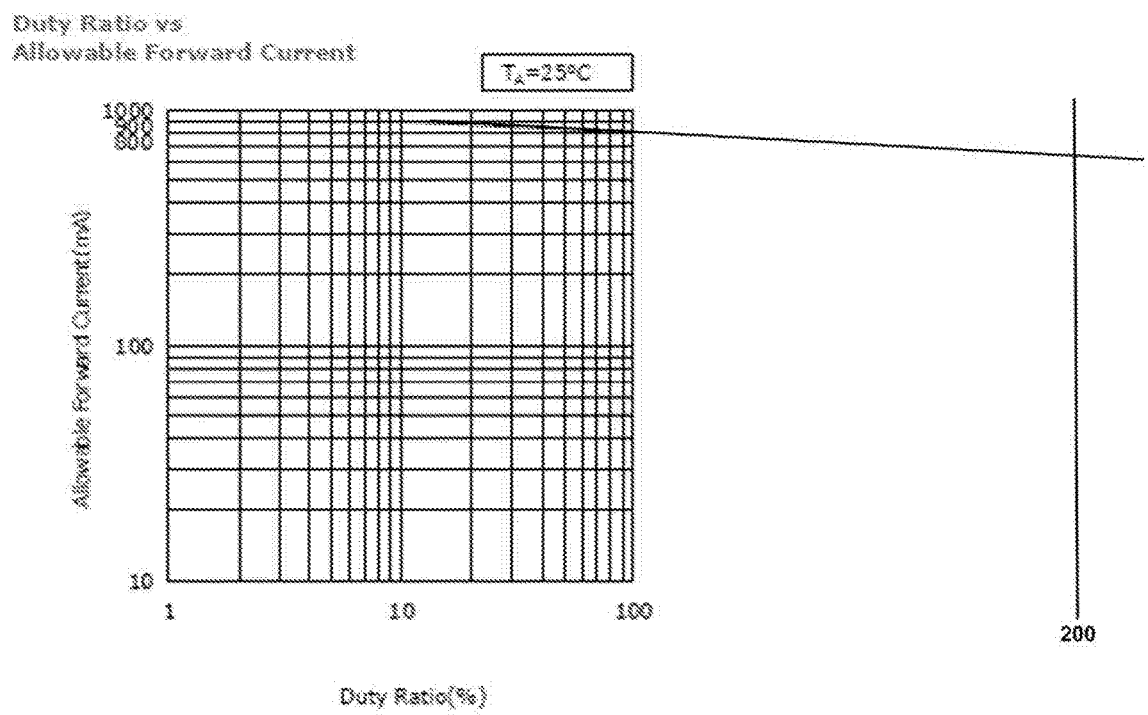
FIG. 41 is a graph that plots duty ration verse allowable Forward Current from the NS6183AT.

One In this example, Bin B14 is selected because it gives a maximum luminous Flux of 150 lumen based upon 350 mA per Table 2 and the Forward Voltage is 3.2V current. As shown in FIG. 38, which plots the Forward Current verse the relative luminous flux, the X data point is shown at 350 milliamps giving a relative luminous flux of 1 (i.e., 150 Lumens). This gives a power draw of 350 mA×3.2V=1.12 W. If you divide the lumens by the Watts you get: 150 lm/1.12 W=134 lm/W efficacy. A lower Forward Current may be selected from the graph as shown by the X in FIG. 39. FIG. 39 shows an X that has a current of 100 mA and a relative luminous flux 0.33 or 150 lm (49.5 lumens). Next we look at Forward Voltage verse Forward Current as shown in FIG. 40. The X selected in FIG. 40 shows a forward current of 100 mA intersecting with 2.75 V. This gives a power drawn that can be calculated as follows: 100 mA×2.75V=0.275 W. If you divide the lumens by the Watts you get 49.5 lm/0.275 W=180 lm/W efficacy or a 46 lm per Watt increase in efficacy. Next we look at the duty ration verse allowable Forward Current from the NS6183AT specification as shown in FIG. 41. As shown in FIG. 41, the Duty Cycle rating is 1,000 hours at 850 mA. If you extend out the line to where it intersects with 100 mA as shown by the line added to the graph provided in the NS6W183AT specification you get a Duty Ratio of 1000% of the Duty Cycle (i.e. 1,000 hours×1,000%=10,000,000 hours). This relationship can be further illustrate if you where to drop the power further and use 50 mA, then the result would be as follows using the above mentions FIGS. In other words: 50 mA×2.6V=0.13 W; 50 mA=0.2 of 150 lm=30 lm; 30 lm/0.13 W=231 lm/W. Other variations are also contemplated.

Using the features of the exemplary embodiments described herein, the LED lighting may have one or more of the following features:
  A power source design for about 2.78V and 80 mA (e.g., substantial power match to LED specifications): +72.57 lm/w (e.g., 20 lm/w, 30 lm/w, 40 lm/w, 50 lm/w, 60 lm/w, 70 lm/w, 75 lm/w, 80 lm/w, 90 lm/w, etc.)—Lifecycle gain 600% (e.g., 50%, 100%, 200%, 300%, 400%, 500%, 700%, 800%);
  The LEDs may be mounted on the TEG substrate using conductive paste or electrically conductive ultra violet light cured optical gel: +/−0 lm/w—Lifecycle loss 0% (e.g., substantially no lifecycle loss);
  An active thermal design of fixture to remove/reduce ambient heat: +8 lm/w (e.g., 4 lm/w, 5 lm/w, 6, lm/w, 7 lm/w, 9 lm/w, 10 lm/w, 15 lm/w, etc.)—Lifecycle Gain 100% (e.g., 20%, 30%, 40%, 50%, 60%, 70%, 80%, 90%, 100%, 110%, 120%, 130%, 140%, 150%);
  An active thermal design of fixture to remove solder junction heat to: +5 lm/w (e.g., 4 lm/w, 5 lm/w, 6, lm/w, 7 lm/w, 9 lm/w, 10 lm/w, 15 lm/w, etc.)—Lifecycle Gain 100% (e.g., 20%, 30%, 40%, 50%, 60%, 70%, 80%, 90%, 100%, 110%, 120%, 130%, 140%, 150%);
  The harvested thermal energy may be converted back to light: +6 lm/w (e.g., 4 lm/w, 5 lm/w, 6, lm/w, 7 lm/w, 9 lm/w, 10 lm/w, 15 lm/w, etc.)—Lifecycle Gain 0% (e.g., substantially no lifecycle loss);
  Minimal optical loss from lens or reflectors: −3% lm/w— (e.g., 1 lm/w, 2 lm/w, 3 lm/w, 4 lm/w, 5 lm/w, 6 lm/w, 7 lm/w, etc.)—Lifecycle Loss 0% (e.g., substantially no lifecycle loss).

As a result of one or more of these features, exemplary embodiments may experience one or more of the following improvements:
  LED Efficacy: raised from 150 lm/w to 234.32 lm/w (e.g., an improvement of 25%, 30%, 40%, 50%, 55%, 60%, 70%, 75%, 80%, 90%, 100%, etc.);
  LED Lifecycle: raised from 100,000 hours to 800,000 hours (e.g., 150,000, 200,000, 250,000, 300,000, 350,000, 400,000, 450,000, 500,000, 550,000, 600,000, 650,000, 700,000, 750,000, 800,000, 850,000, 900,000, 1,000,000 hours, etc.) or a life cycle extension of e.g., 100%, 200%, 300%, 400%, 500%, 600%, 700%, etc.;
  Other advantages may include one or more of the following:
    Few/no other components necessary;
    Ease and lower cost of manufacture, smaller Bill Of Materials ("BOM");
    Heat transfer methods may work in a number of fixture housings and environments;

Outdoor fixtures may benefit from harvesting heat from the sun cold thermal energies at night;

Fewer components so may cost less;

Optic design at individual LED level improves the percentage of the lumens that reach the intended working surface;

It may be possible to harvest more thermal energy to run another type of subsystem (e.g., camera, signal, sensors, etc.).

Figure 2:
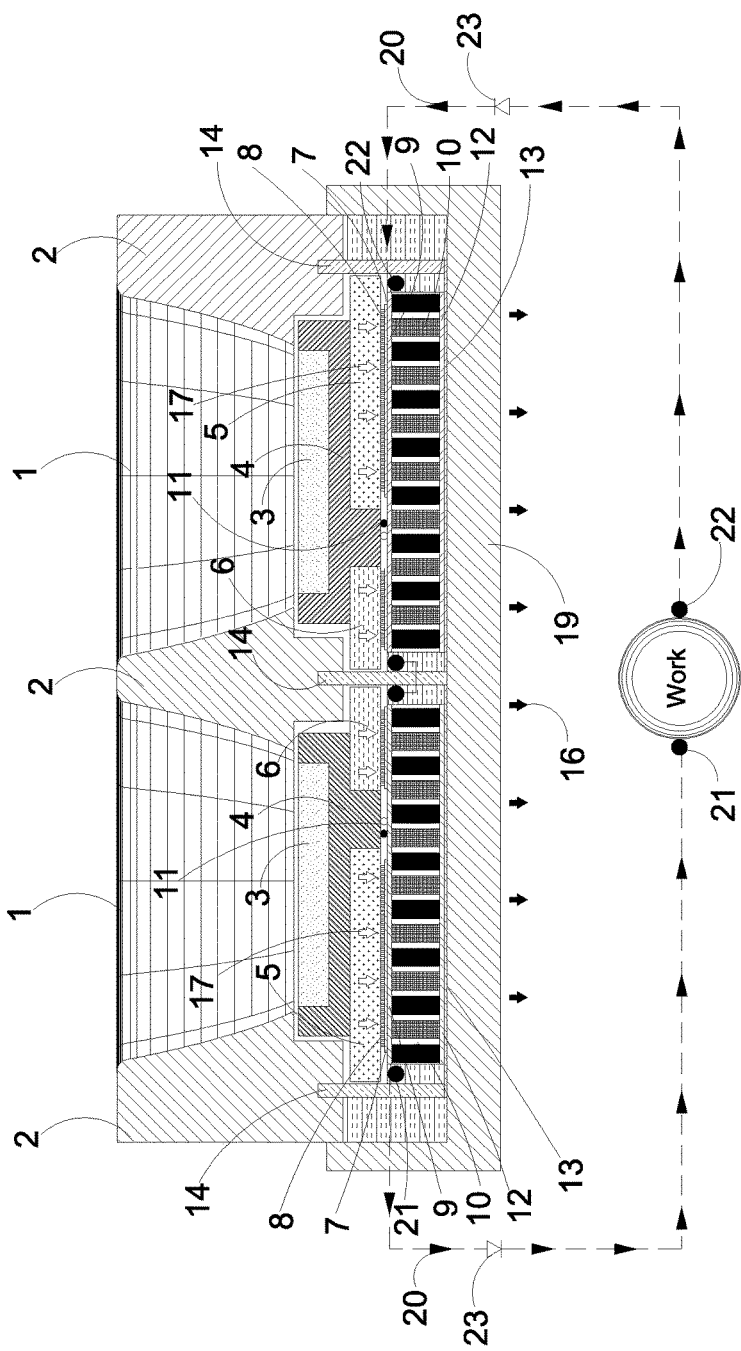
FIG. 2 is a schematic diagram of an exemplary LED lighting device.

FIG. 2 is a schematic diagram of an exemplary LED lighting device. The embodiment illustrated in FIG. 2 is similar to the embodiment described above with respect to FIG. 1 except the cold side of the thermoelectric device is in contact with a thermally conductive outer housing 19. This arrangement assumes that the ambient temperature is lower than the temperature of the waste heat so the thermoelectric device produces electrical energy. Of course, as would be understood by a person of skill in the art, the electrical energy generated could be used for a of a number of purposes (e.g., powering a camera, sensor, alarm, etc., or combinations thereof).

Figure 3:
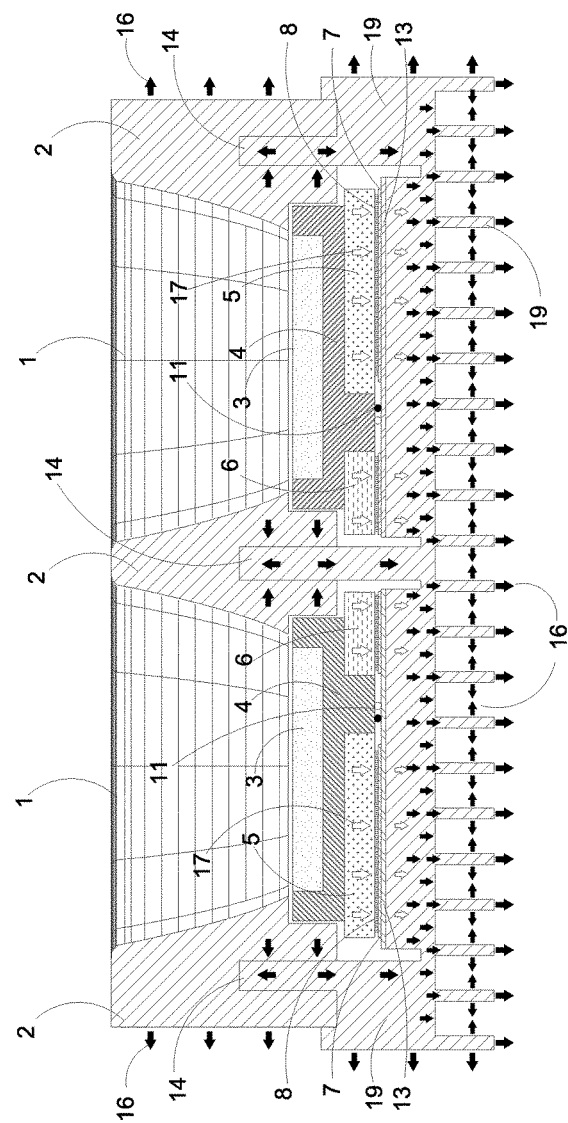
FIG. 3 is a schematic diagram of an exemplary LED lighting device.

FIG. 3 is a schematic diagram of an exemplary LED lighting device. In this embodiment, much like the embodiment of FIG. 2, there is no phase change material. However, in this case, there is also no thermoelectric device. Accordingly, the housing 19 acts in a known manner to dissipate heat from the LEDs. Of course, as would be understood by a person of ordinary skill in the art, this embodiment may still use the optics described herein. Additionally, as illustrated in this exemplary embodiment, the housing 19 includes "island" pads in the shape of the substrates 13 for better heat isolation.

Figure 4:
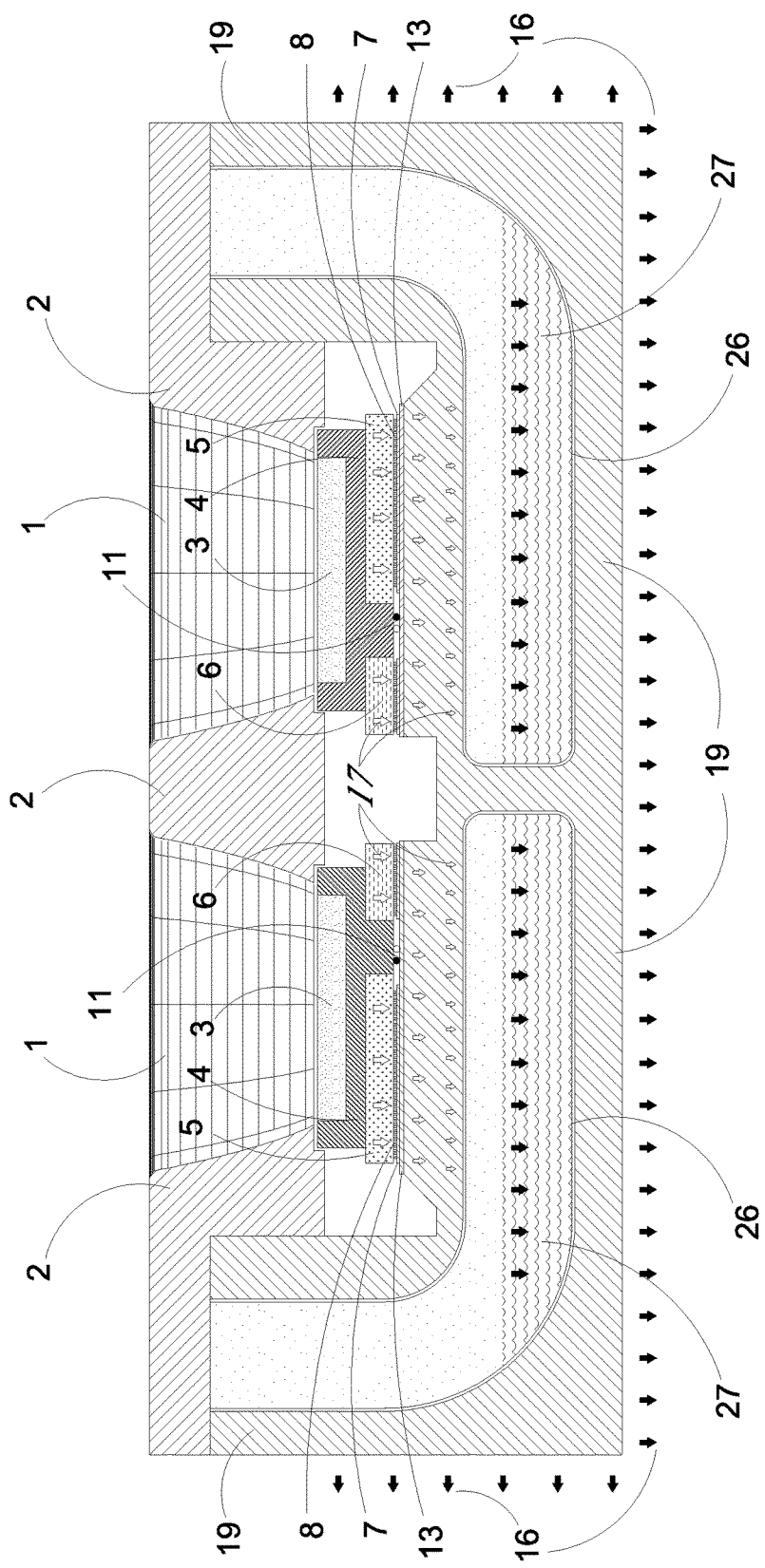
FIG. 4 is a schematic diagram of an exemplary LED lighting device.

FIG. 4 is a schematic diagram of an exemplary LED lighting device. This embodiment is similar to the embodiment of FIG. 3 except the outer housing 19 includes sintered heat pipes 26 and working fluid 27. The heat pipes 26 and working fluid 27 aid in drawing away the waste heat from the LEDs.

Figure 5:
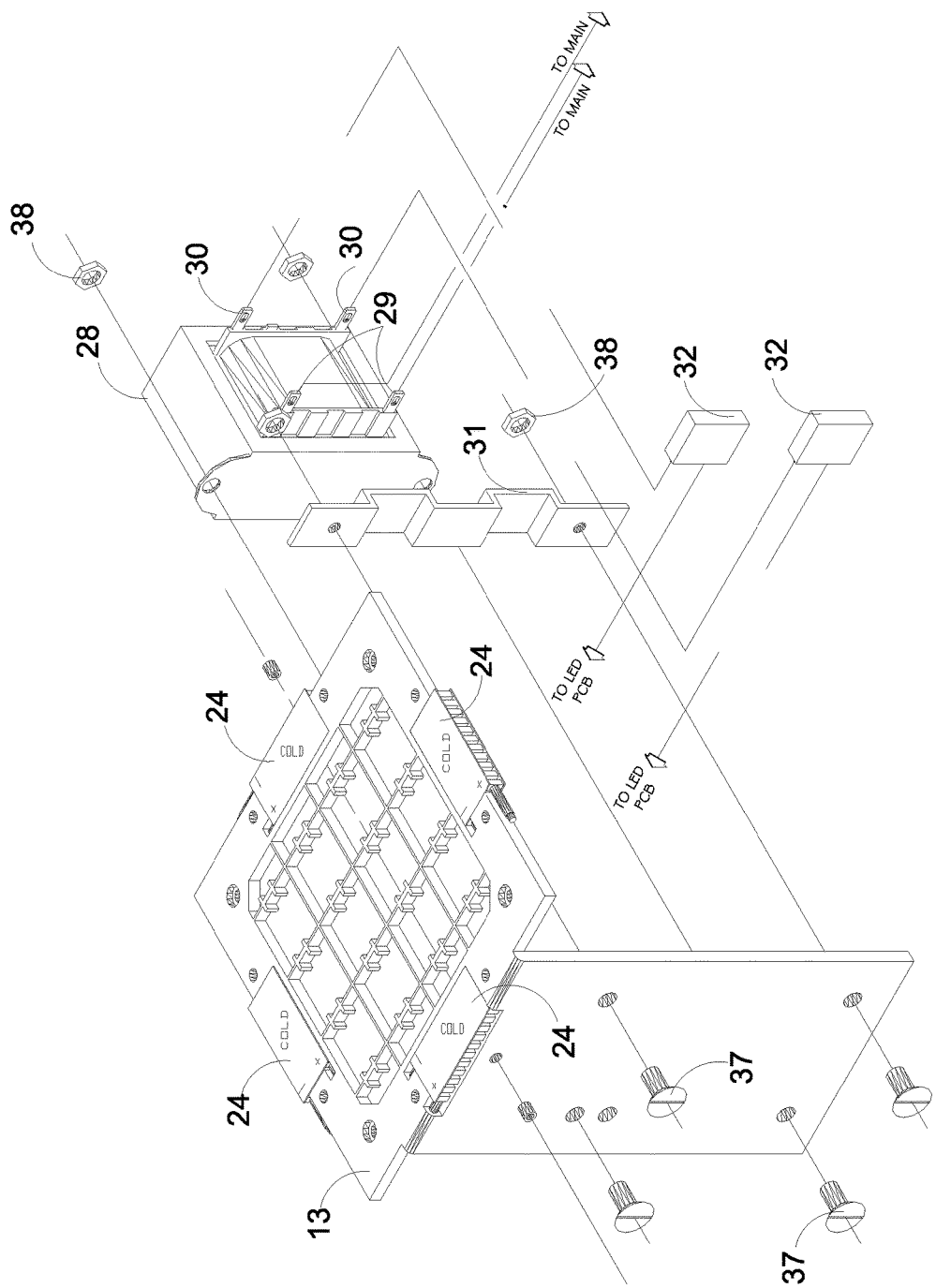
FIG. 5 is a schematic diagram of an exemplary transformer assembly for use in an LED lighting assembly.
Figure 8:
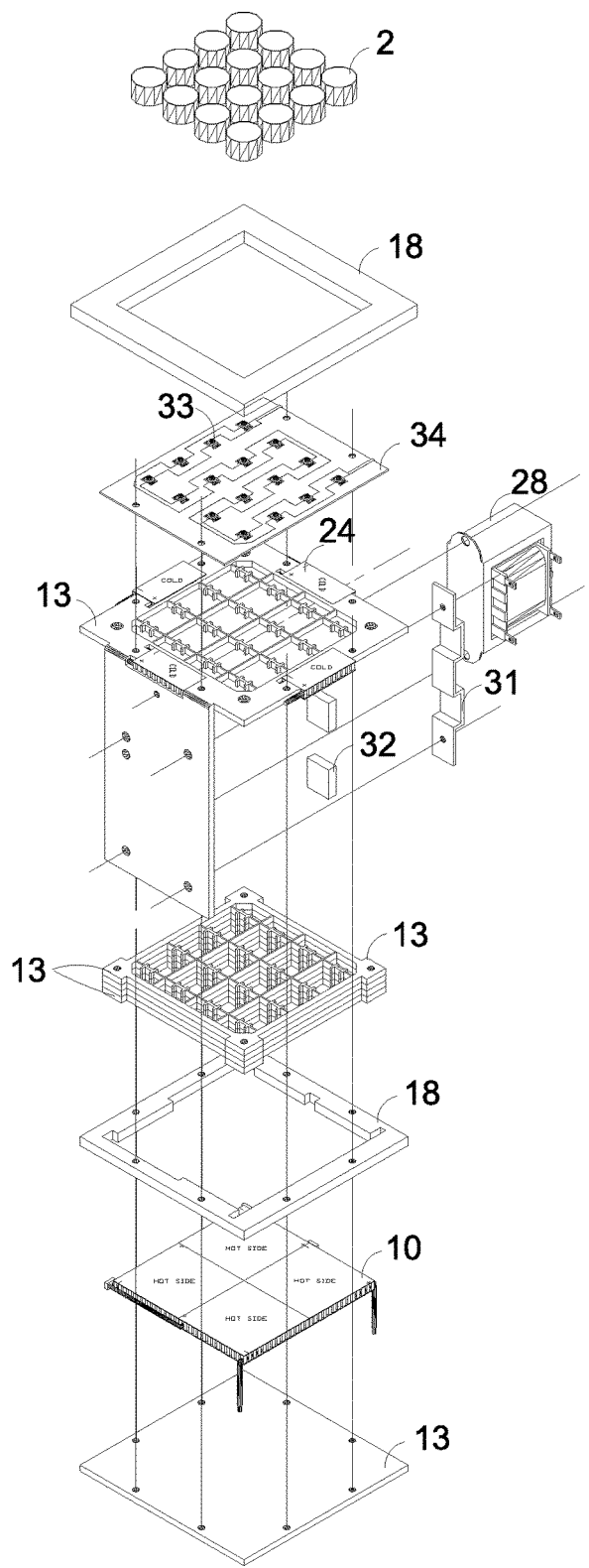
FIG. 8 is a schematic diagram of an exemplary active heat management system for use in an LED lighting assembly.

FIG. 5 is a schematic diagram of an exemplary transformer assembly for use in an LED lighting assembly. In exemplary embodiments, the LED lighting assembly may utilize a thermally isolated standard step-down power transformer 28 to more precisely match the input voltage and current to the LED manufacture's specifications. The resistors 32 may be sized to limit the power drawn from the transformer 28 so as not to overheat the transformer and reduce its lifespan. The waste thermal energy from the transformer 28 and resistors 32 clamped against a Thermally Conductive Substrate 13 may also be harvested as shown in FIG. 8.

Figure 6:
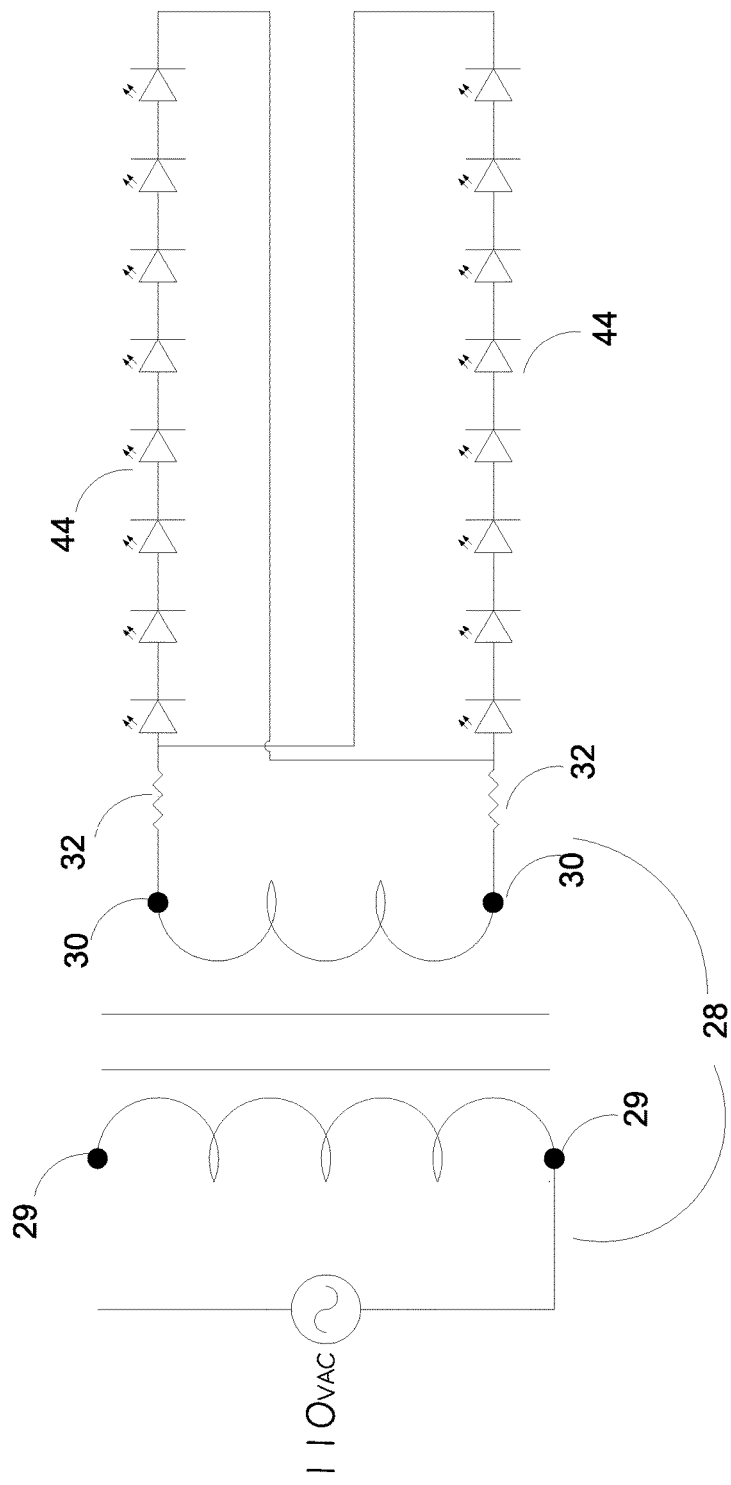
FIG. 6 is a schematic diagram of an exemplary AC LED assembly.

FIG. 6 is a schematic diagram of an exemplary AC LED assembly. In FIG. 6, two sets of LED strings 44 are wired with opposite polarity so that they are powered and produce light in an alternating fashion without the need for an LED driver circuit.

Figure 7:
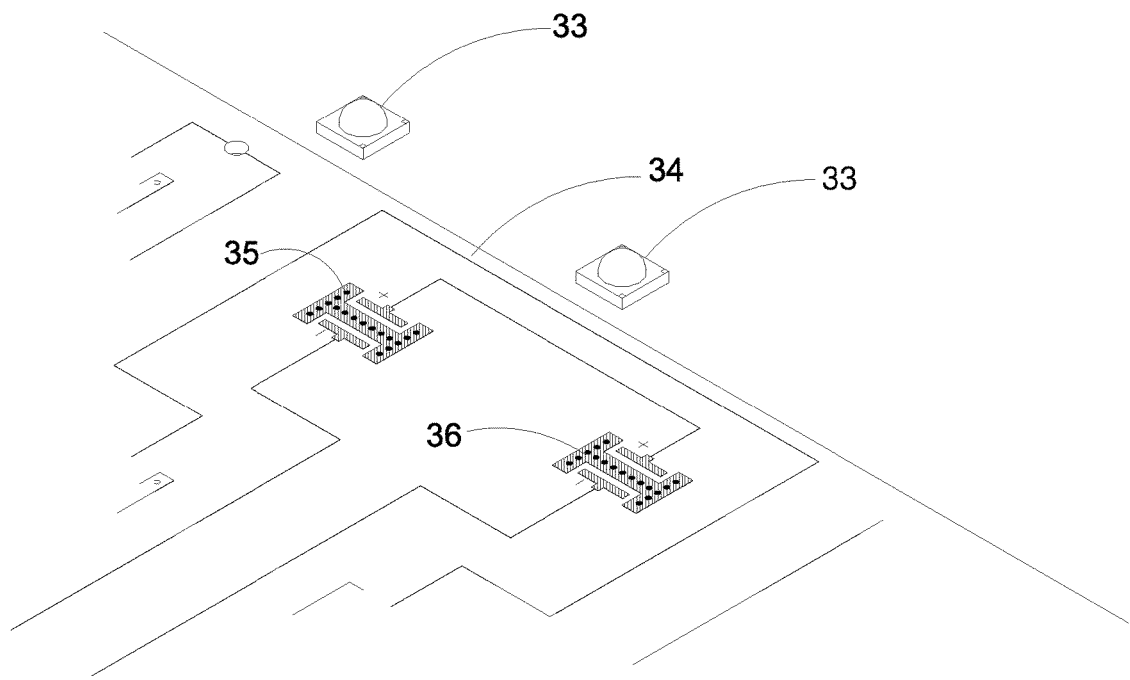
FIG. 7 is a schematic diagram of an exemplary LED mounting structure for use in an LED lighting assembly where a thermal path is made using substantially solid vias.

FIG. 7 is a schematic diagram of an exemplary LED mounting structure for use in an LED lighting assembly. In FIG. 7, LEDs 33 with opposite polarity are mounted on a thermally modified printed circuit board ("PCB") 34 in pairs so that a pair produces a steady stream of light. In exemplary embodiments, opposing LEDs are spaced at a distance of no more than the diameter of their isolating lens plus an additional distance for ease of manufacture, to prevent or reduce a possible strobe effect. Alternatively, in exemplary embodiments, the lighting may be placed at other distances from each other so long as they are aimed at the same, or substantially the same, surface.

The thermal pads 35 upon which the LEDs are mounted are "I" shaped, electrically isolated and have 0.25 mm solid copper vias 36 spaced as close together as PCB manufacturing will allow to an identical, or substantially similar, thermal pad on the backside of the PCB. This passive thermal technique helps transfer the heat from the LED 33 die solder junction to the back of the PCB 34. LEDs 33 may be attached to the PCB 34 using the reflow method specified by the LED manufacturer and/or preferably an electrical and thermal conductive epoxy to prevent the LEDs 33 from sustaining damage from the reflow oven temperature.

FIG. 8 is a schematic diagram of an AC LED lighting assembly with an exemplary active heat management system for use in an LED lighting assembly. The active heat management system draws away the passively transferred waste heat at the backside of the PCB 34 and converts it into electrical energy. In the exemplary embodiment of FIG. 8, the PCB 34 may be mechanically attached to the primary heat-sink plate 13 that is shaped to match the thermal pads 35 of the LEDs 33 so as not to allow heat to dissipate across the backside of the PCB 34. The thermal connection of the pad to plate is enhanced by the use of thermal adhesive. In exemplary embodiments, the transformer 28 may be mechanically attached to the primary heat-sink plate 13 but isolated from the PCB 34 by dropping it below the Isolation Wall 18. The thermal connection of the transformer 28 to the primary heat-sink plate 13 is enhanced by the use of thermal adhesive.

In exemplary embodiments, the resistors 32 may be mechanically attached to the primary heat-sink plate 13 using a resistor clamp 31 and is also sufficiently isolated from the PCB 34 by dropping it below the isolation wall 18. The thermal connection of the resistors 32 and the resistor clamp 31 to the primary heat-sink plate 13 is enhanced by the use of thermal adhesive.

In exemplary embodiments, a heat-sink stack of thermally conductive substrate 13 matching the thermal pads 35 of the LEDs 33 may be attached by compression to the primary thermally conductive substrate 13. The thermal connection of the primary thermally conductive substrate 13 to stack is enhanced by the use of thermal adhesive.

In exemplary embodiments, an isolation wall 18 that houses a thermoelectric device 10 with its "hot side" facing the heat-sink stack 13 may be attached by compression to the heat-sink stack 13. The thermal connection of the stack to the thermoelectric device 10 may be enhanced by the use of thermal adhesive.

In exemplary embodiments, the thermoelectric device 10 may receive most of the waste heat generated by the LEDs 33, the transformer 28 and the resistors 32, as described herein, and are configured in series, parallel or a mix of both to define the output to the desired configuration of the electrical power (volts and amps) they generate from the waste heat. These configurations of the thermoelectric devices 10 would be readily understood by a person of ordinary skill in the art. Additional thermoelectric devices may also be stacked behind the thermoelectric device 10 shown to transfer heat in stages to produce additional power and move the heat further from the PCB 34.

Figure 9:
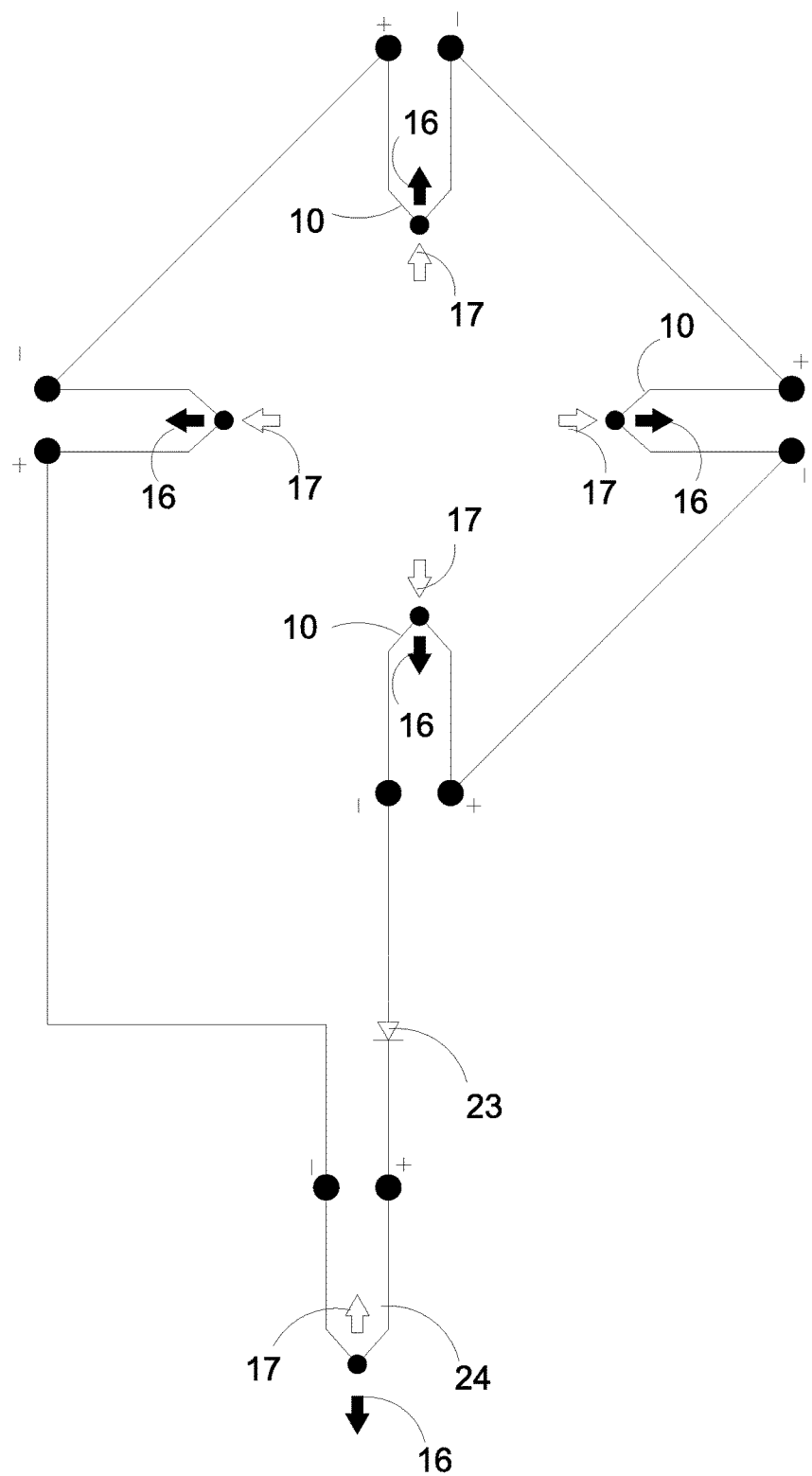
FIG. 9 is a schematic diagram of an exemplary DC circuit for use in an LED lighting assembly for harvesting thermal energy from four local heat sources, converting the thermal energy to electrical energy using thermoelectric generators (in series), to power a thermoelectric chiller.

In exemplary embodiments, a phase change material packet ring 15 may be chilled by a thermoelectric chiller 24 that is powered by the reclaimed energy from wasted heat to maximize the cooling. The thermoelectric chiller 24 becomes a thermoelectric chiller when DC power is applied in the appropriate polarity. A blocking diode 23 maintains the chilling effect by not allowing (or reducing the likelihood) the thermoelectric chillers 24 to become thermoelectric heaters. The phase change material packet 15 material may have a target temperature of 20° C. In exemplary embodiments, this secondary DC power source would add substantially less, little or no additional power consumption for the LEDs, as it is powered by reclaimed energy that would typically go wasted. This configuration is illustrated in FIG. 9, which is a schematic diagram of an exemplary DC circuit for use in actively cooling an LED lighting assembly.

The lens used in many LED fixtures cause interference and diminish the lumen output due to interference of the light generated by one LED with the ability of adjacent LEDs to operate at optimal efficiency ("LED to LED interference"). In general, LED to LED interference comes in two forms. First, the reflection of light generated by one LED off the lens of another LED causes optical interference, which changes the refractive index of the LED's built in lens. This optical interference diminishes the efficiency of the LED luminary fixture. Second, the absorption of light generated by an LED by adjacent LEDs creates a small photovoltaic effect resulting in a reverse voltage in the circuit interfering with the effectiveness of the power deployed to run the LED.

To mitigate the described interference, exemplary embodiments may use individual lenses with isolation housings or reflectors to stop, or substantially reduce, the path of light from one LED to another and the negative effects thereof. In exemplary embodiments, the lenses or reflectors also may tighten up the beam angle to the desired spread. In exemplary embodiments, the desired spread may be determined based on the entire array and not the individual LEDs.

In cases where a lens is utilized rather than a reflector an index matched gel may also be utilized at the juncture point of the optical lens and the LED lens to reduce loss caused by refraction at the juncture point. An exemplary optical adhesive is Norland Optical Cement. In general, the adhesive may have various combinations of properties similar to one or more of those detailed below in Table 1:

TABLE 1

| Exemplary Optical Adhesive Properties | |
| --- | --- |
| Solids | 100% |
| Viscosity at 25° C | 200 cps (e.g., 200-5,000 cps, 500 cps, 1000 cps, 1000-2000 cps, 200-300 cps, 200-400 cps, 150-250 cps, etc) |
| Refractive Index of Monomer | 1.52 (e.g., 1.50, 1.51, 1.52, 1.53, 1.54 etc.) |
| Refractive Index of Cured Polymer | 1.56 (e.g., 1.51-1.58, 1.51, 1.52, 1.53, 1.54, 1.55, 1.56, 1.57, 1.58, etc.) |
| Elongation at Failure | 41% (e.g., 18-80%, 25%, 30%, 40%, 50%, 60%, 70%, 75%, etc.) |
| Modulus of Elasticity (psi) | 131,000(e.g., 131,000-150,000, 135,000, 140,000, 145,000, 150,000, etc.) |
| Tensile Strength (psi) | 2,000 (e.g., 101-2800, 500, 750, 1000, 1250, 1500, 1750, 1900, 2100, 2500, 2700, 2800, etc.) |
| Hardness - Shore D | 90 (e.g., 25-90, 25, 30, 40, 45, 50, 60, 70, 75, 80, 90, etc.) |
| Total Mass Loss (TML) | 1.07% |
| Collected Volatile Condensable Material (CVCM) | <0.01% |
| Dielectric Constant (1 MHz) | 4.06 |
| Dielectric Strength (V/mil) | 457 |
| Dissipation Factor (1 MHz) | 0.0341 |

TABLE 1-continued

| Exemplary Optical Adhesive Properties | |
| --- | --- |
| Volume Resistivity (ohm-cm) | $6.85 \times 10^{14}$ |
| Surface Resistivity (MEgohms) | $3.71 \times 10^{12}$ |

Figure 10:
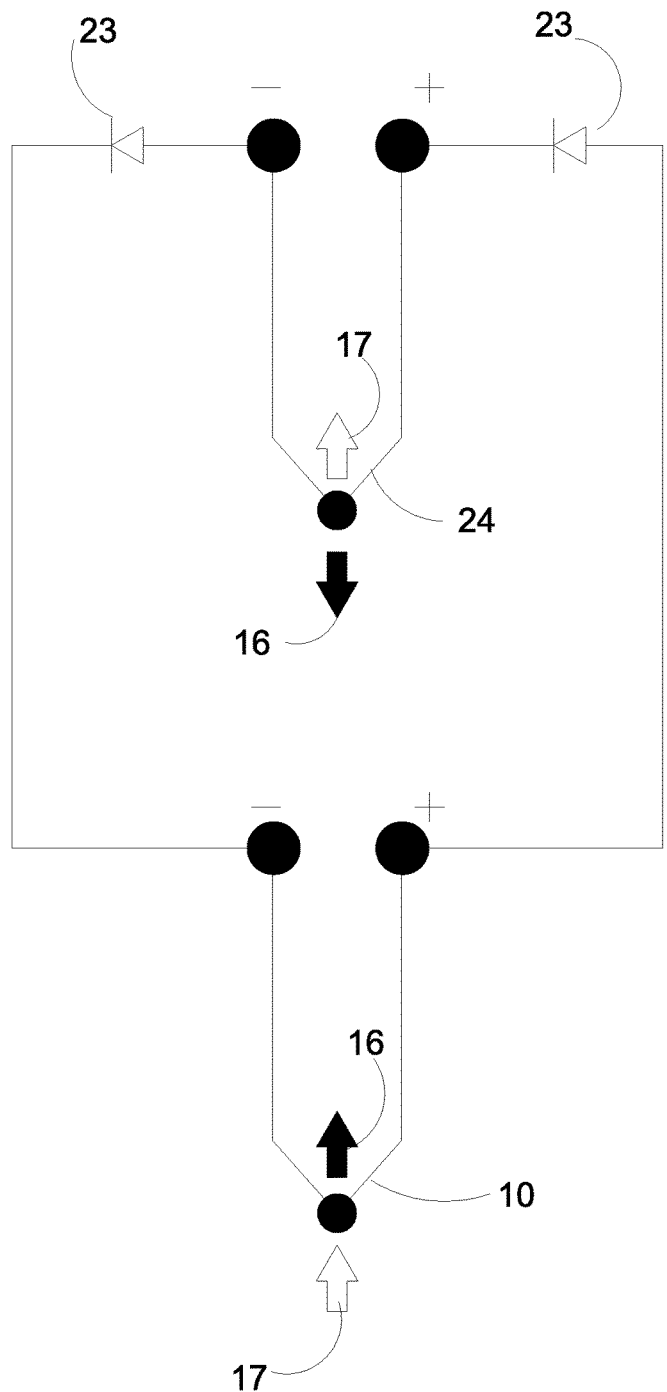
FIG. 10 is a schematic diagram of an exemplary DC circuit for harvesting thermal energy from one local heat source in an LED lighting assembly and converting the thermal energy to electrical energy using a thermoelectric generator to power a thermoelectric chiller.

FIG. 10 is a schematic diagram of an exemplary DC circuit for use in actively cooling an LED lighting assembly. In FIG. 10, a single thermoelectric generator 10 receives the wasted heat from a source, (e.g., an LED, heat of the sun on the fixture case, etc.) on one side described as the high temperature flow 17 and receives a cooler temperature on its opposite side from a source (e.g., cooler ambient temperature, a low temperature phase change material or a condensation line, etc.) described as a heat rejection flow 16. The circuit generates direct current electrical energy that flows through a blocking diode 23 placed as a protection device to ensure a single direction of electrical flow to a single thermoelectric chiller 24. The thermoelectric chiller 24 receives the electrical energy and pumps away heat from one side causing a heat rejection flow 16 from one side and a high temperature flow 17 on the other. Another blocking diode 23 may be placed after the thermoelectric chiller 24 before closing the circuit back at the thermoelectric generator 10.

Figure 11:
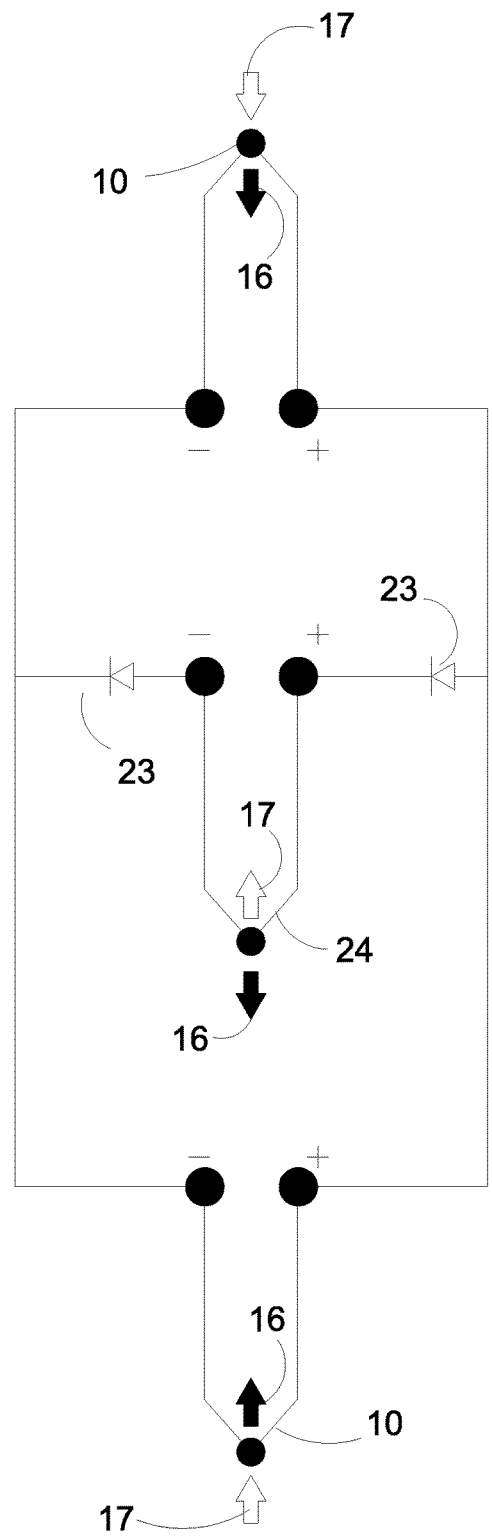
FIG. 11 is a schematic diagram of an exemplary DC circuit for harvesting thermal energy from two local heat sources in an LED lighting assembly and converting the thermal energy to electrical energy using two thermoelectric generators, in parallel, to power a thermoelectric chiller.

FIG. 11 is a schematic diagram of an exemplary DC circuit for use in actively cooling an LED lighting assembly. In FIG. 11, multiple thermoelectric generators 10 receive the wasted heat from multiple sources (e.g., an LED, heat of the sun on the fixture case, etc.) on one side described as the high temperature flow 17 and receive cooler temperature on their opposite side from multiple sources (e.g., cooler ambient temperature, a low temperature phase change material or a condensation line, etc.) described as a heat rejection flow 16. The circuit generates multiple sources of direct current electrical energy connected together in parallel that flow through a blocking diode 23 placed as a protection device to ensure a single direction of electrical flow to a thermoelectric chiller 24 that receives the electrical energy and pumps away heat from one side causing a heat rejection flow 16 from one side and a high temperature flow 17 on the other. Another blocking diode 23 may be placed after the thermoelectric chiller 24 before closing the circuit back at the thermoelectric generators 10.

Figure 12:
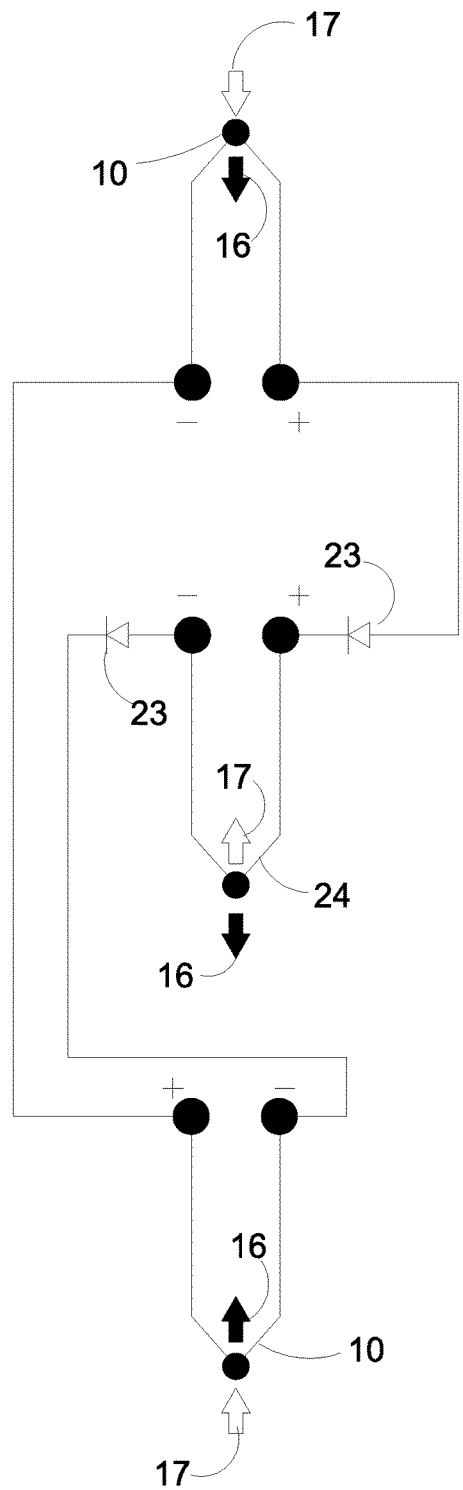
FIG. 12 is a schematic diagram of an exemplary DC circuit for harvesting thermal energy from two local heat sources in an LED lighting assembly and converting the thermal energy to electrical energy using two thermoelectric generators, in series, to power a thermoelectric chiller.

FIG. 12 is a schematic diagram of an exemplary DC circuit for use in actively cooling an LED lighting assembly, where multiple thermoelectric generators 10 receive the wasted heat from multiple sources (e.g., an LED, heat of the sun on the fixture case, etc.) on one side described as the high temperature flow 17 and receive cooler temperature on their opposite side from multiple sources (e.g., cooler ambient temperature, a low temperature phase change material or a condensation line, etc.) described as a heat rejection flow 16. The circuit generates multiple sources of direct current electrical energy connected together in series that flow through a blocking diode 23 placed as a protection device to ensure a single direction of electrical flow to a thermoelectric chiller 24 that receives the electrical energy and pumps away heat from one side causing a heat rejection flow 16 from one side and a high temperature flow 17 on the other. Another blocking diode 23 may be placed after the thermoelectric chiller 24 before closing the circuit back at the thermoelectric generators 10.

Figure 13:
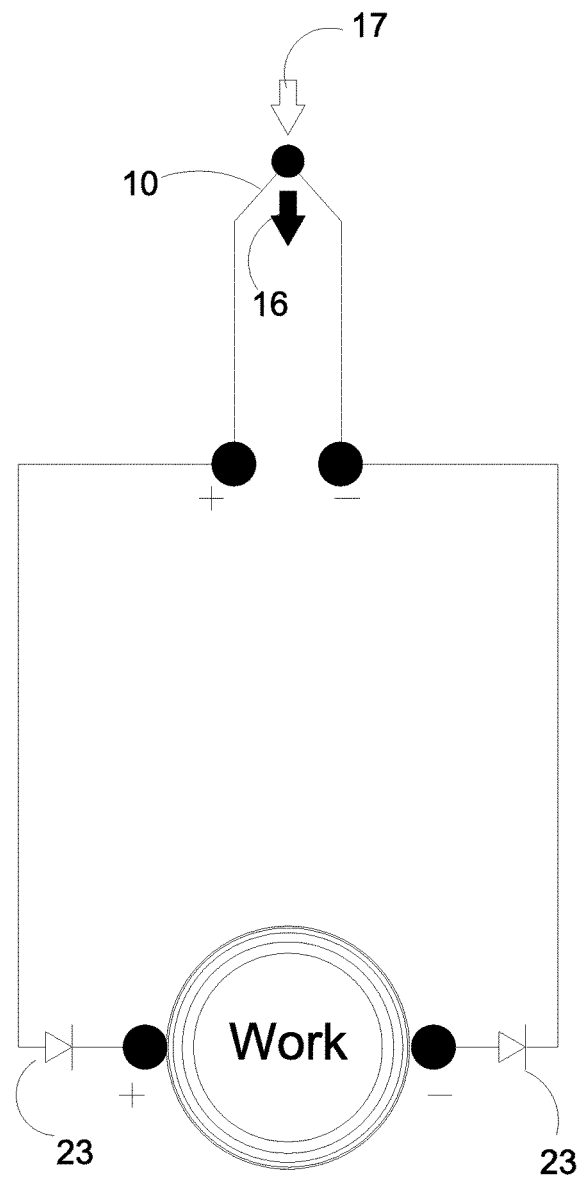
FIG. 13 is a schematic diagram of an exemplary DC circuit for harvesting thermal energy from one local heat source in an LED lighting assembly and converting the thermal energy to electrical energy using a thermoelectric generator to power another local device, (e.g., a camera, a timer or a sensor, etc.)

FIG. 13 is a schematic diagram of an exemplary DC circuit for use in actively cooling an LED lighting assembly and harvesting that thermal energy and converting it back into electrical energy. In FIG. 13, a single thermoelectric generator 10 receives the wasted heat the LED or LEDs on one side described as the high temperature flow 17 and receives a cooler temperature on the opposite side from a source, (e.g., cooler ambient temperature, a low temperature phase change material or a condensation line, etc.) described as a heat rejection flow 16. The circuit generates direct current electrical energy that flows through a blocking diode 23 placed as a protection device to ensure a single direction of electrical flow to any type of electrical device capable of using the power provided shown as "work." Another blocking diode 23 may be placed after the thermoelectric chiller 24 before closing the circuit back at the thermoelectric generator 10.

Figure 14:
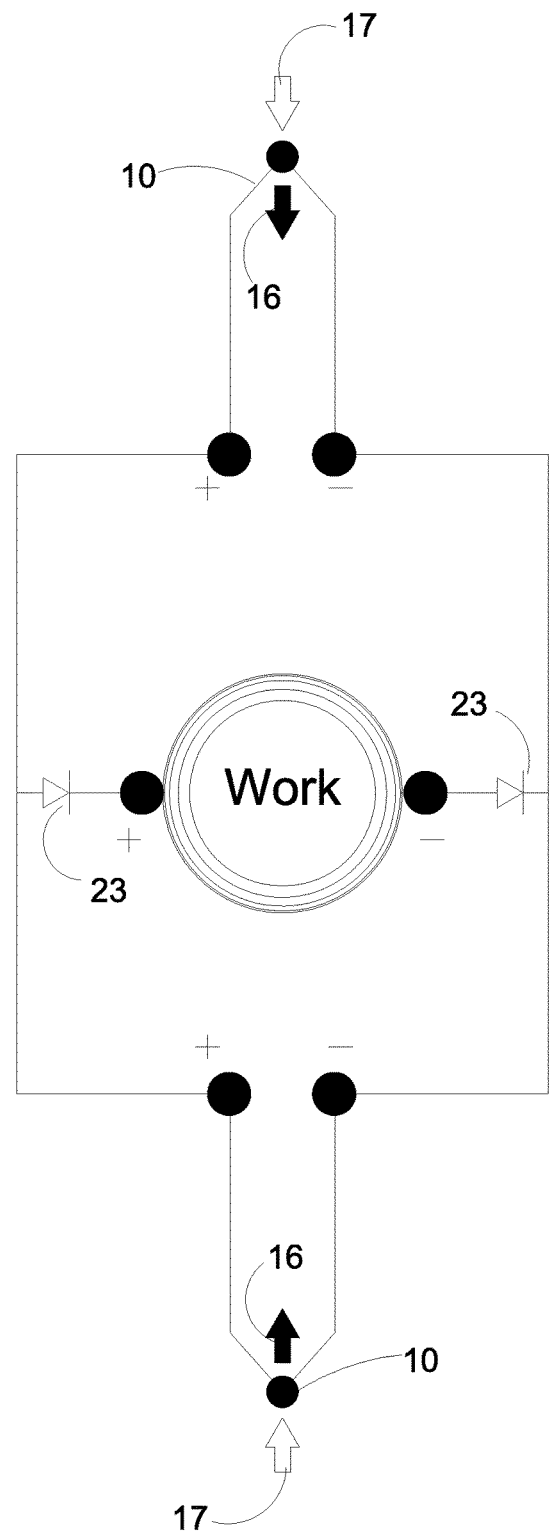
FIG. 14 is a schematic diagram of an exemplary DC circuit for harvesting thermal energy from two local heat sources in an LED lighting assembly and converting the thermal energy to electrical energy using two thermoelectric generators, in parallel, to power another local device, (e.g., a camera, a timer or a sensor, etc.)

FIG. 14 is a schematic diagram of an exemplary DC circuit for use in actively cooling an LED lighting assembly and/or harvesting that thermal energy and/or converting it back into electrical energy. In FIG. 14, multiple thermoelectric generators 10 receive the wasted heat from multiple sources (e.g., the LEDs, heat of the sun on the fixture case, etc.) on one side described as the high temperature flow 17 and receive cooler temperature on their opposite side from multiple sources (e.g., cooler ambient temperature, a low temperature phase change material and/or a condensation line, etc.) described as a heat rejection flow 16. The circuit generates multiple sources of direct current electrical energy connected together in parallel that flow through a blocking diode 23 placed as a protection device to ensure a single direction of electrical flow to various types of electrical devices capable of using the power provided shown as "work." Another blocking diode 23 may be placed after the thermoelectric chiller 24 before closing the circuit back at the thermoelectric generator 10.

Figure 15:
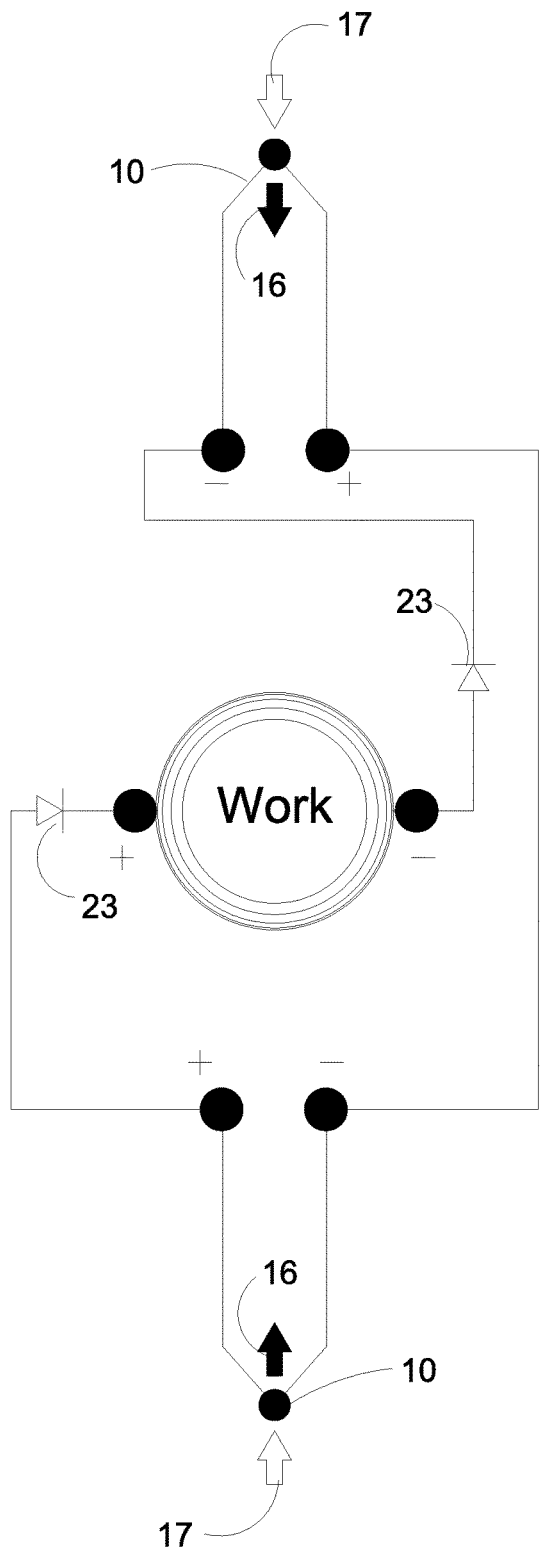
FIG. 15 is a schematic diagram of an exemplary DC circuit for harvesting thermal energy from two local heat sources in an LED lighting assembly and converting the thermal energy to electrical energy using two thermoelectric generators, in series, to power another local device, (e.g., a camera, a timer or a sensor, etc.

FIG. 15 is a schematic diagram of an exemplary DC circuit for use in actively cooling an LED lighting assembly and/or harvesting that thermal energy and/or converting it back into electrical energy. In FIG. 15, multiple thermoelectric generators 10 receive the wasted heat from multiple sources (e.g., the LEDs, heat of the sun on the fixture case, etc.) on one side described as the high temperature flow 17 and receive cooler temperature on their opposite side from multiple sources (e.g., cooler ambient temperature, a low temperature phase change material or a condensation line, etc.) described as a heat rejection flow 16. The circuit generates multiple sources of direct current electrical energy connected together in series that flow through a blocking diode 23 placed as a protection device to ensure a single direction of electrical flow to various types of electrical devices capable of using the power provided shown as "work." Another blocking diode 23 may be placed after the thermoelectric chiller 24 before closing the circuit back at the thermoelectric generator 10.

Figure 16:
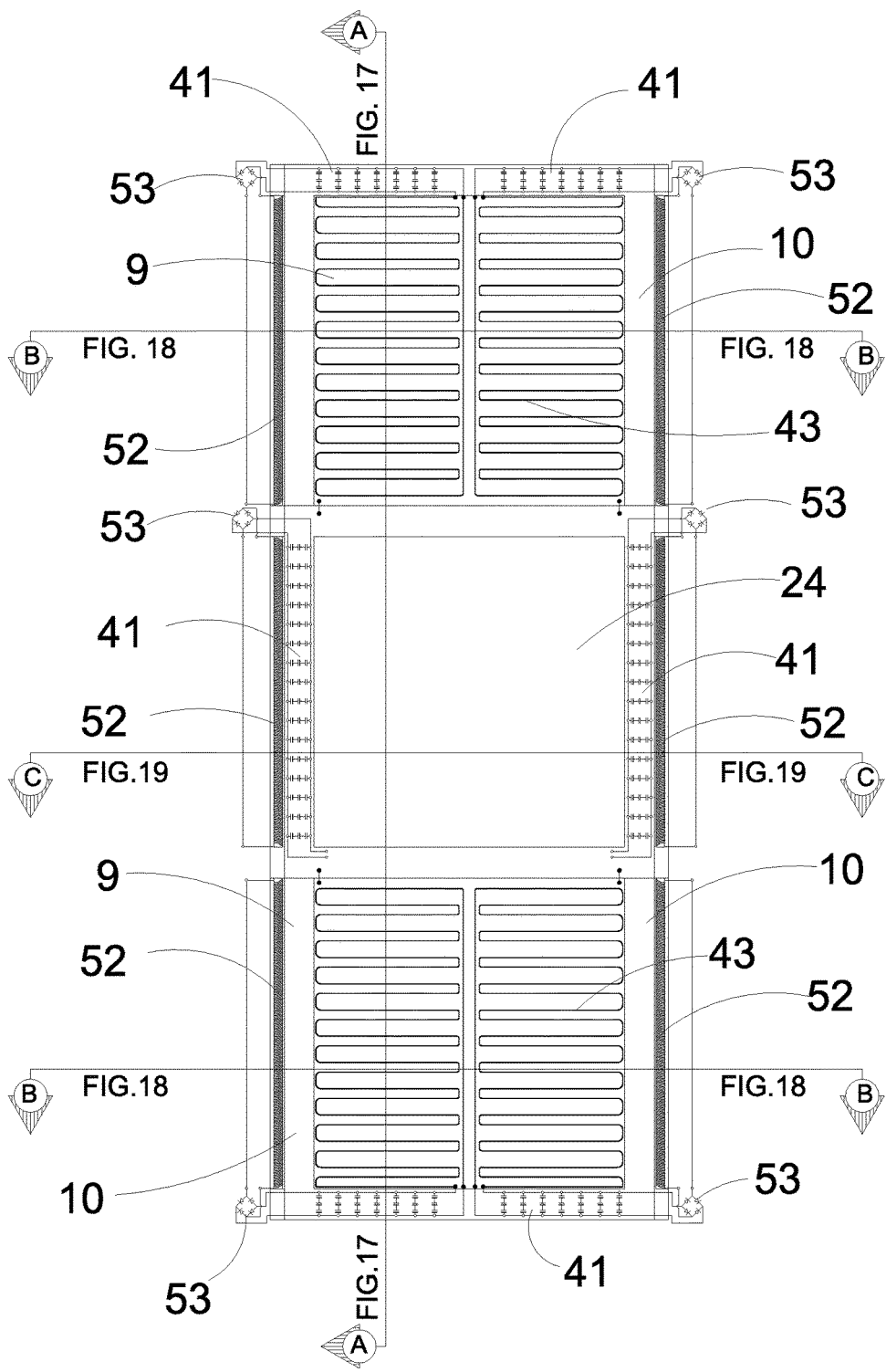
FIG. 16 is a schematic diagram of an exemplary embodiment of an electromagnetic and thermal energy harvesting power supply for use in, e.g., an LED lighting assembly.
Figure 17:
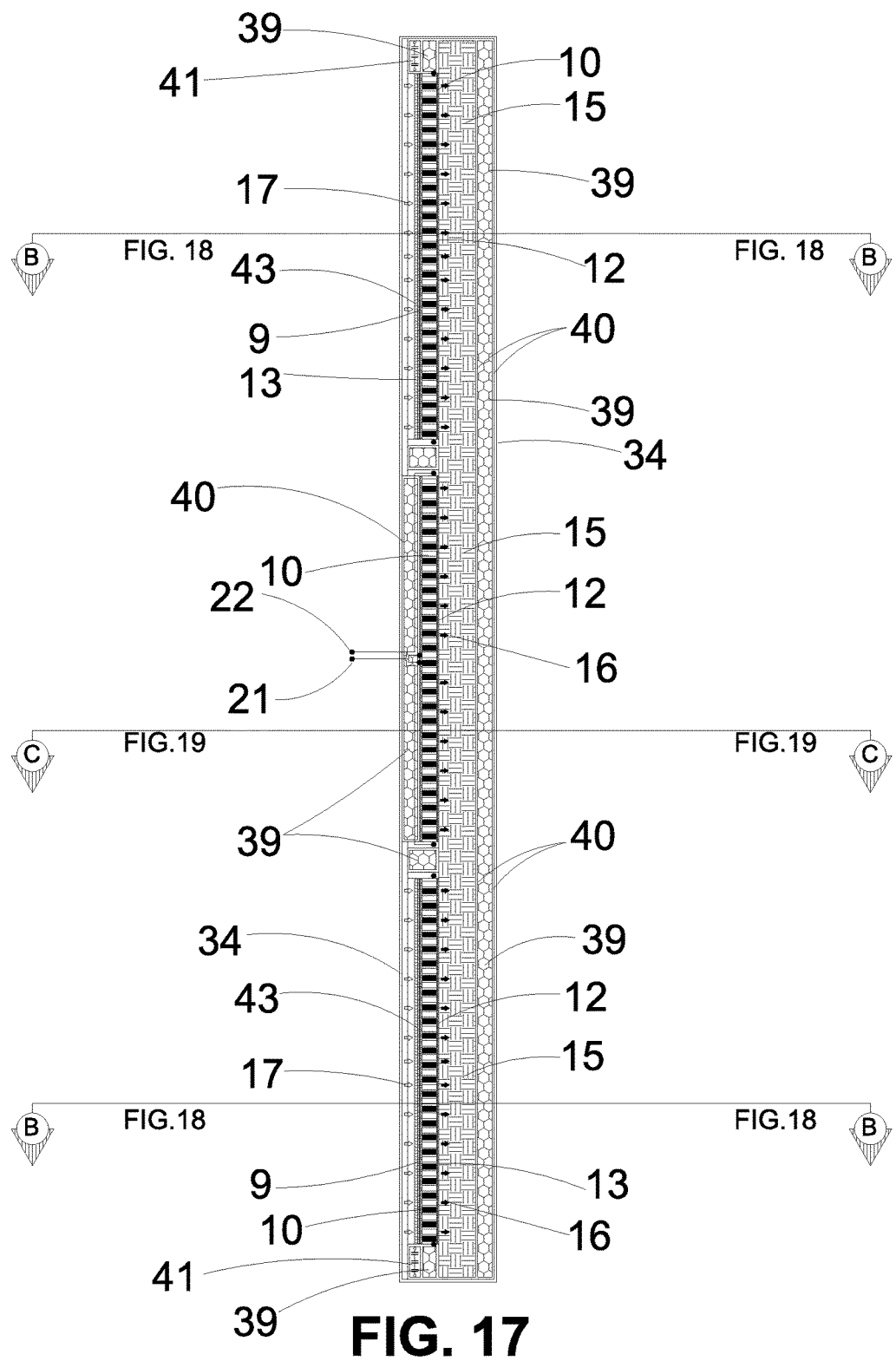
FIG. 17 is a schematic diagram of an exemplary embodiment of cross-section A of the exemplary power supply of FIG. 16 for use in an LED lighting assembly.
Figure 18:
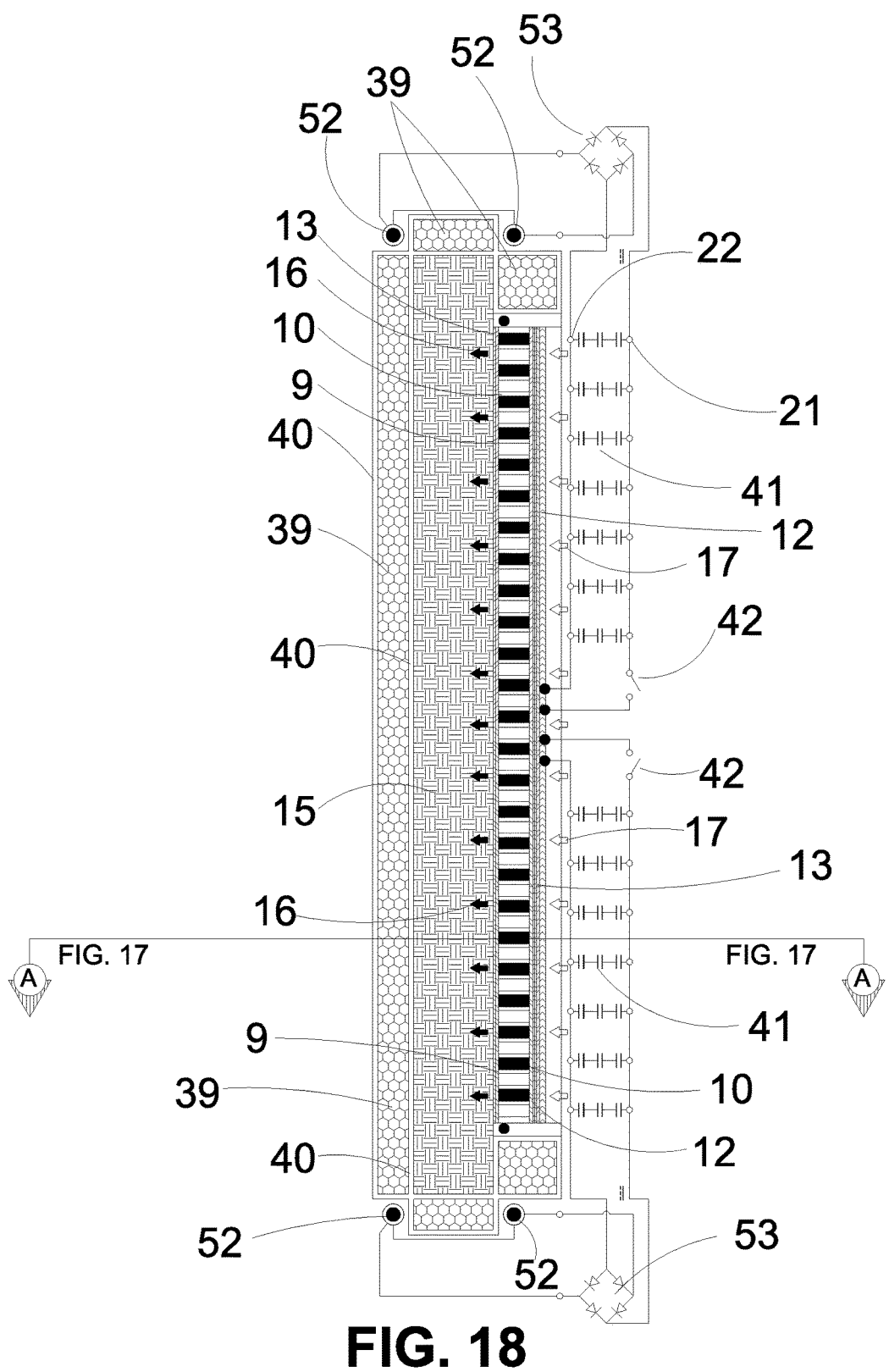
FIG. 18 is a schematic diagram of an exemplary embodiment of cross-section B of the exemplary power supply of FIG. 16 for use in an LED lighting assembly.
Figure 19:
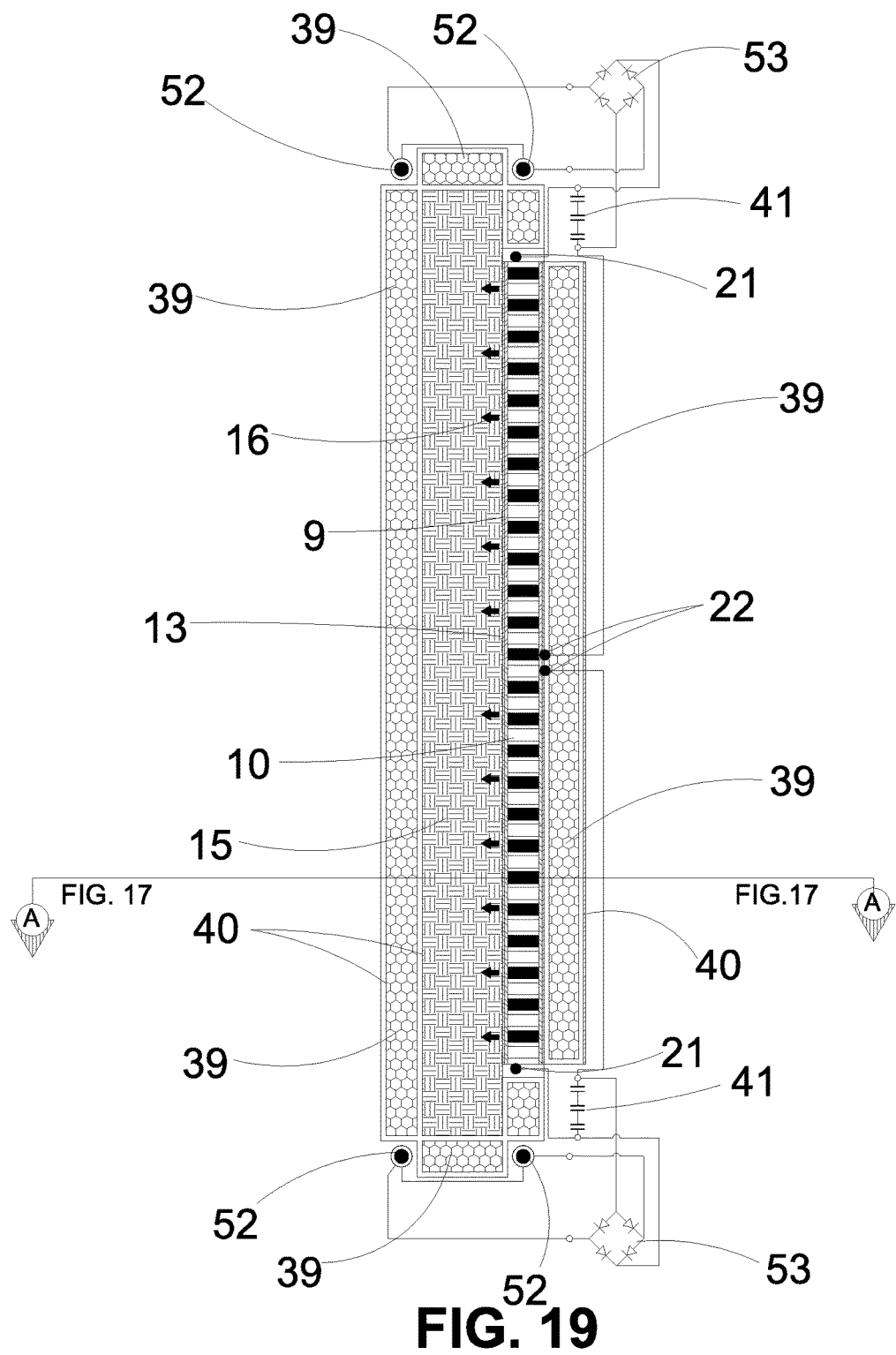
FIG. 19 is a schematic diagram of an exemplary embodiment of cross-section C of the exemplary power supply of FIG. 16 for use in an LED lighting assembly.

FIG. 16 is a schematic diagram of an exemplary embodiment of an electromagnetic and thermal energy harvesting power supply for use in, e.g., an LED lighting assembly. FIG. 17 is a schematic diagram of an exemplary embodiment of cross-section A of the exemplary power supply of FIG. 16 for use in an LED lighting assembly. FIG. 18 is a schematic diagram of an exemplary embodiment of cross-section B of the exemplary power supply of FIG. 16 for use in an LED lighting assembly. FIG. 19 is a schematic diagram of an exemplary embodiment of cross-section C of the exemplary power supply of FIG. 16 for use in an LED lighting assembly.

Referring to FIG. 16, a schematic diagram of an exemplary embodiment of a an electromagnetic and thermal energy harvesting power supply for use in a device of choice (e.g., an LED lighting assembly) is shown. In exemplary embodiments, the power supply may be used to power a device so long as the input power requirement of the device matches (or substantially matches) the output power of the described power supply. In exemplary embodiments, ambient electromagnetic radiation may be harvested using a series of enameled (or otherwise insulated) wire coil around an electrically conductive shaft (e.g., cylindrical ferrite cores 52) of differing sizes and wraps to match multiple frequencies in order to harvest energy at multiple wavelengths and frequencies where it is then converted to direct current using blocking diodes in a rectifying circuit 53 and used to fill ultra capacitor arrays 41 designed for an output power matching the input of thermoelectric chillers 24 and Nichrome coil heat elements 43. In exemplary embodiments, the coil may be implemented without a conductive shaft. The electromagnetic harvesting may be constant, if desired, regardless of whether the device of choice is being operated. The Nichrome coil heat elements 43 are in contact with the thermoelectric device substrate (hot side) 9 of thermoelectric generators 10. The thermoelectric chillers 24 are in contact with low temperature phase change material 15 as shown in FIG. 17, which is a vertical cross section schematic diagram of FIG. 16. and FIGS. 18 and 19, which are horizontal cross section schematic diagrams of FIG. 16, keeping the thermoelectric device at a calculated constant temperature. Referring to FIGS. 17, 18 and 19, the thermoelectric device substrate (cold side) 12 of the thermoelectric generators 10 is in contact with the low temperature phase change material 15. The thermoelectric device substrate (hot side) 9 of thermoelectric generators 10 are in contact with the Nichrome coil heat elements 43 which cause a thermal difference between both sides of the thermoelectric generators 10 which converts the thermal energy into a calculable electrical energy that is capable in powering the device of choice. During times when the electrical device is in operation, the waste heat from one or more components may be routed to the thermoelectric device substrate (hot side) 9 of thermoelectric generators 10 to provide passive cooling to those components and harvest the thermal energy. During times when the electrical device is not in operation, ambient temperature and the low temperature phase change material 15 cause a calculable thermal difference between both sides of the thermoelectric generators 10 which converts the thermal energy into a calculable electrical energy that is capable of powering the thermoelectric chillers 24 for the chilling of low temperature phase change material 15. The low temperature phase change material 15 is in contact with the thermoelectric generator's 10 and thermoelectric chiller's 24 low thermoelectric device substrate (cold side) 12. The other areas of the low temperature phase change material 15, are insulated with, e.g., low temperature phase change pellet insulation 39 separated with polypropylene case walls 40. The entire power supply is then sealed in outer material of choice (e.g., fiber glass, plastic or metal).

Figure 20:
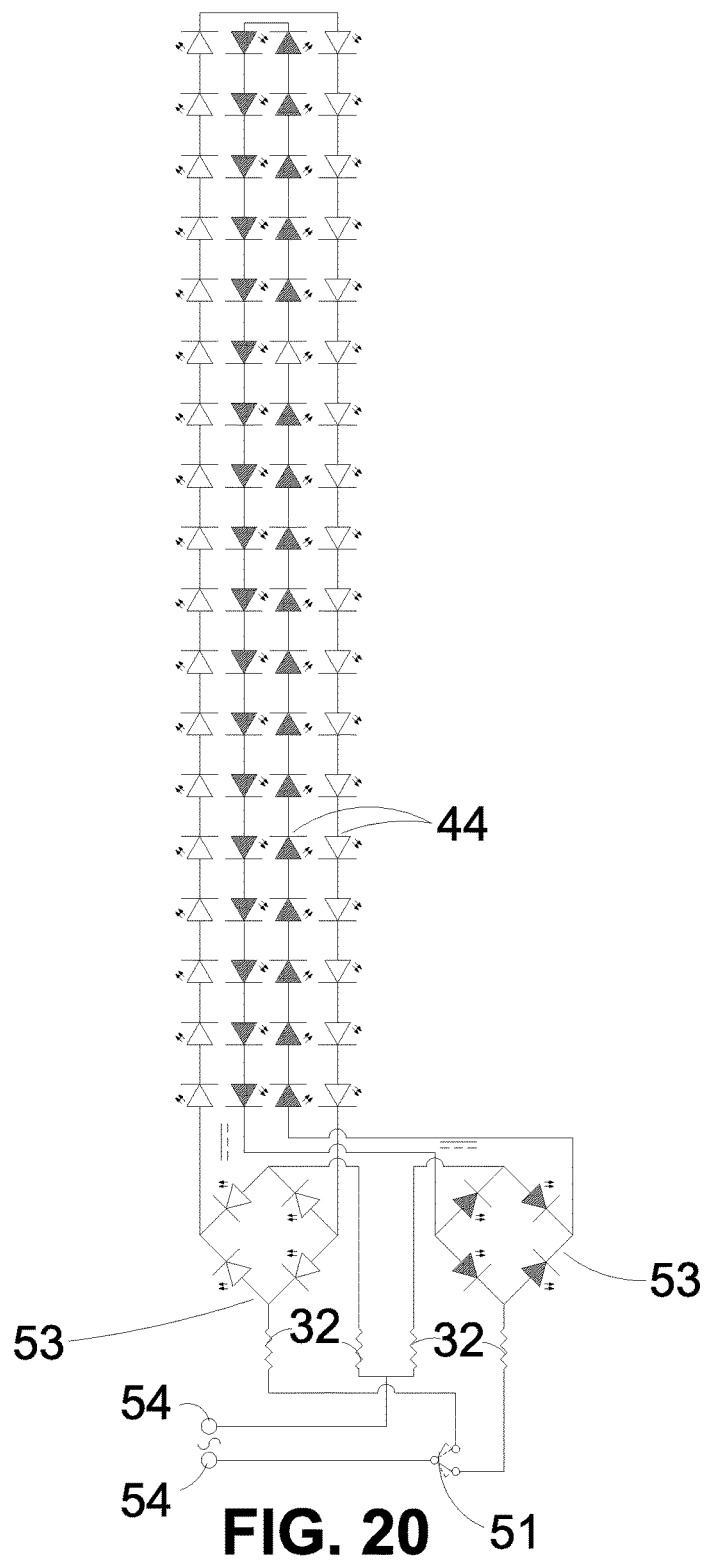
FIG. 20 is a schematic diagram of an exemplary AC LED assembly which uses the first 4 LEDs in the string to rectify the AC power without requiring the use of additional components.

FIG. 20 is a schematic diagram of an exemplary AC LED assembly which uses the first 4 LEDs in the string to rectify the AC signal without requiring the use of additional components. In FIG. 20, an electrical schematic, two separate LED strings 44, of differing color temperatures and color rendering indexes are set in series (positive to negative), in order to add up to the voltage of the input voltage. The input voltage may be 120 Volts in the United States and other countries and may be 220 to 230 volts in European and other countries. To calculate this, the input voltage may be divided by the desired forward voltage of the individual LEDs. A fraction can be rounded down with resistance added using a resistor 32 to make up the fraction or, if the number of LEDs is large enough, rounded up to add an additional LEDs to the LED strings 44. Both LED strings 44 are started with four L.E.D.'s set in a pattern commonly known in the electrical industry as a rectifying circuit 53. This can be done as long as the maximum reverse current specified by the LED manufacturer is not exceeded. On one leg of the input of the LED strings 44, before the rectifying circuit, 53 a resident memory switch chip 51 is added to allow the control of which of the LED string 44 is active. A resident memory switch chip 51 is a semiconductor switch manufactured by, e.g., Texas Instruments that "remembers" the position of the switch unless a user fast double switches the power switch, in which case the resident memory switch chip 51 changes position and "remembers" it's new position until fast double switched again. In this way a single fixture can have multiple color temperatures and color rendering indexes.

Figure 21:
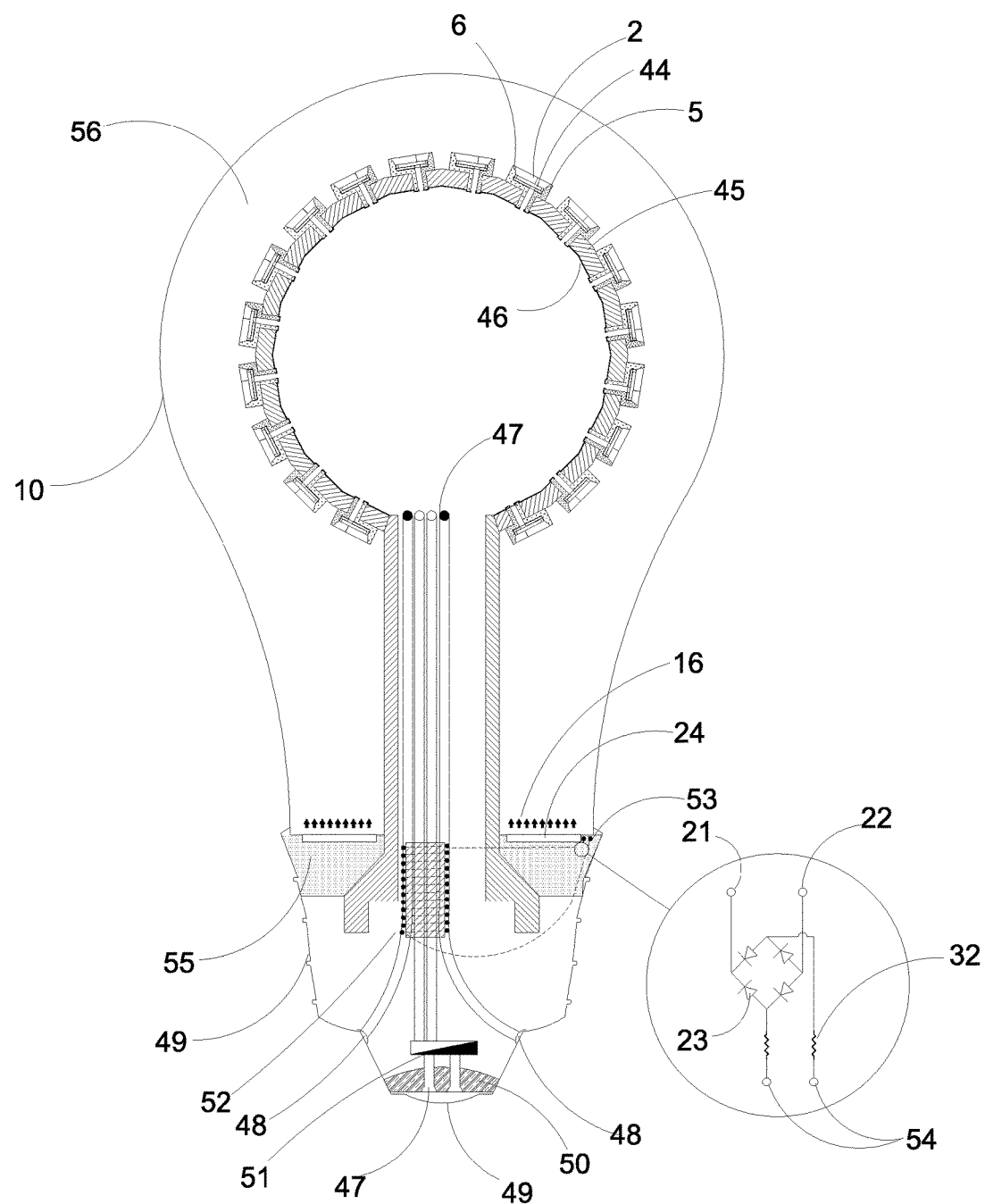
FIG. 21 is a schematic diagram of an exemplary embodiment of an LED lighting assembly.

FIG. 21 is a schematic diagram of an exemplary embodiment of an LED lighting assembly. Referring to FIG. 21, a detailed section of a light bulb embodiment of the invention, invented to replace the popular but highly inefficient incandescent bulb, with two color temperatures and two color rendering indexes controlled by a resident memory switch chip 51 added after the glass fuse enclosure 50 to one leg of the LED strings 44 allowing the control of which of the LED strings 44 is active. The LED strings 44 are electrically wired according to FIG. 20 to accept A/C current without the need of transformers or secondary rectifying circuitry. The individual LEDs of the LED strings 44 are kept clear of negative changes to their lenses refractive index and from negative photovoltaic effects due to the other LEDs in the LED strings 44 shining upon them by the aid of an individual optic separator,-reflector 2, half of which is attached to the LED cathode 6 and the other half, connected to the LED anode 5. The LED strings 44 cathodes 6 and anodes 5 are clipped into holes in a ceramic geodesic substrate and shaft 45 superstructure making contact with a copper foil circuit layer 46 on the ceramic geodesic substrate and shaft's 45 back side. The copper foil circuit layer 46 is electrically attached to enameled connecting wires 47 that electrically attach to the standard bulb screw cap 49 interior with connecting wire contacts 48. Fuse protection is added in a typical bulb industry standard glass fuse enclosure 50. In order to keep the bulb atmosphere's 56 ambient temperature cool a separate direct current circuit is required to run a thermoelectric chiller(s) 24. This is achieved by placing an enameled wire coil around cylindrical ferrite core 52 around the enameled connecting wires 47 which will receive a fraction of the electrical power running through the enameled connecting wires 47 when power is on. Both ends of the enameled wire coil around cylindrical ferrite core 52 are connected to a rectifying circuit's 53 AC connectors 44 through an inline resistor 32 on each leg and through or around blocking diodes 23 that changes the electrical flow from AC to DC. The thermoelectric chillers 24 are connected to the direct current flow positive lead 21 and the direct current flow negative lead 22 of the rectifying circuit 53 with the "cold" side, when powered, facing into the bulb atmosphere 56 and the "hot" side, when powered embedded in ceramic filler 55. The upper outer shell of the light bulb may be cellulose triacetate diffuser bulb 57 shaped to match the incandescent bulb it is replacing and made in two halves and heat welded together in order to fit around the ceramic geodesic substrate and shaft 45 superstructure and attached to a standard bulb screw cap 49.

Figure 22:
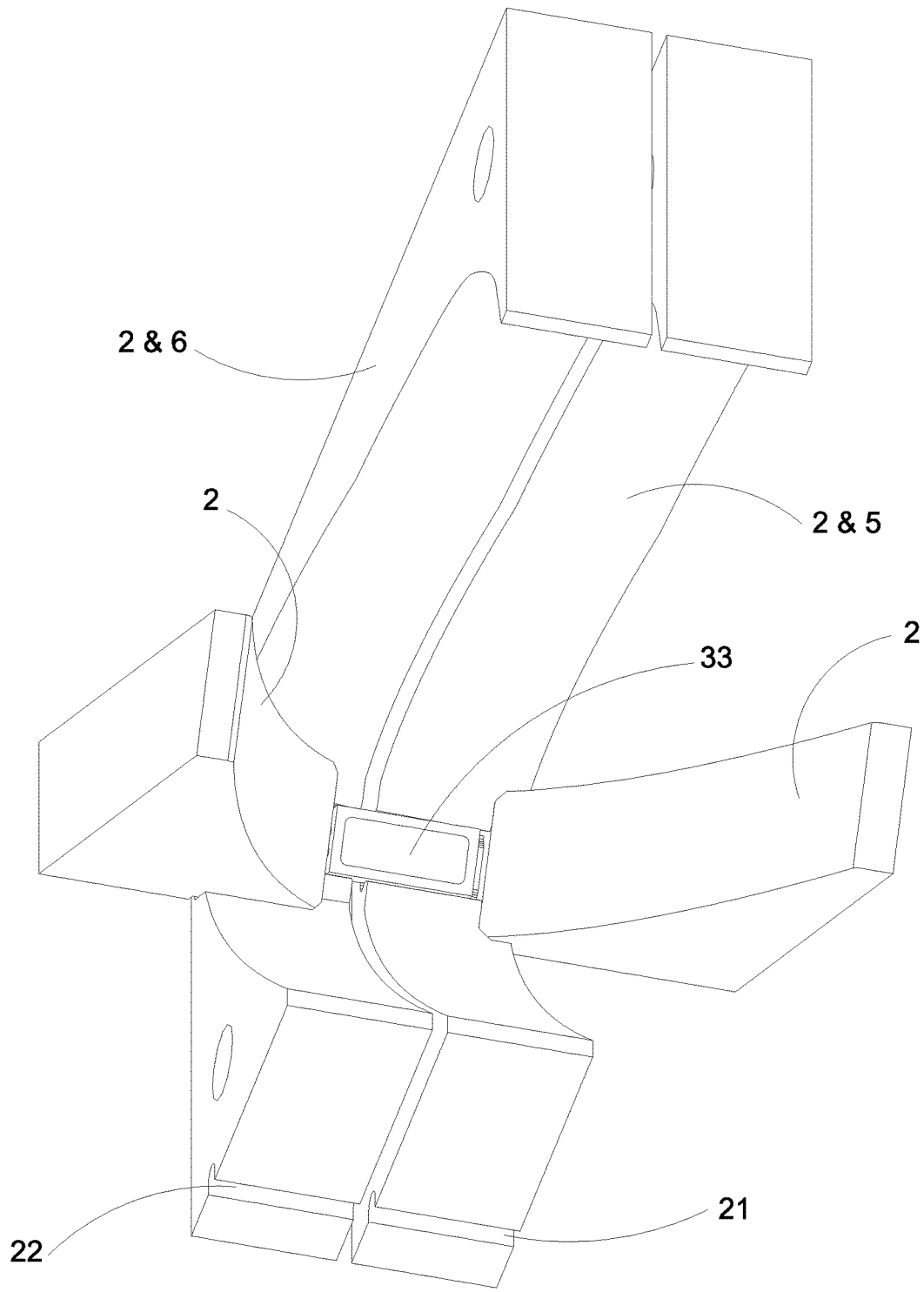
FIG. 22 is a schematic diagram of an exemplary embodiment of an LED lighting assembly for use in, e.g., a refrigerator room/case.

FIG. 22 is a schematic diagram of an exemplary embodiment of an LED lighting assembly for use in, e.g., a refrigerator room/case. In FIG. 22, an LED 33 is attached to a pair of optic electrically conductive separators-reflectors 2 using electrical and thermally conductive epoxy. One is directly attached to the LED anode 5 the other to the LED cathode 6. The optic separators-reflectors 2 are connected to the power supply, LED anode 5 to the positive lead 21 and LED cathode 6 to the negative lead 22. The waste heat produced by the LED 33 is transferred to the optic separators-reflectors 2, preventing, or substantially reducing, them to be affected by condensation that normally requires a secondary casing to alleviate.

Figure 23:
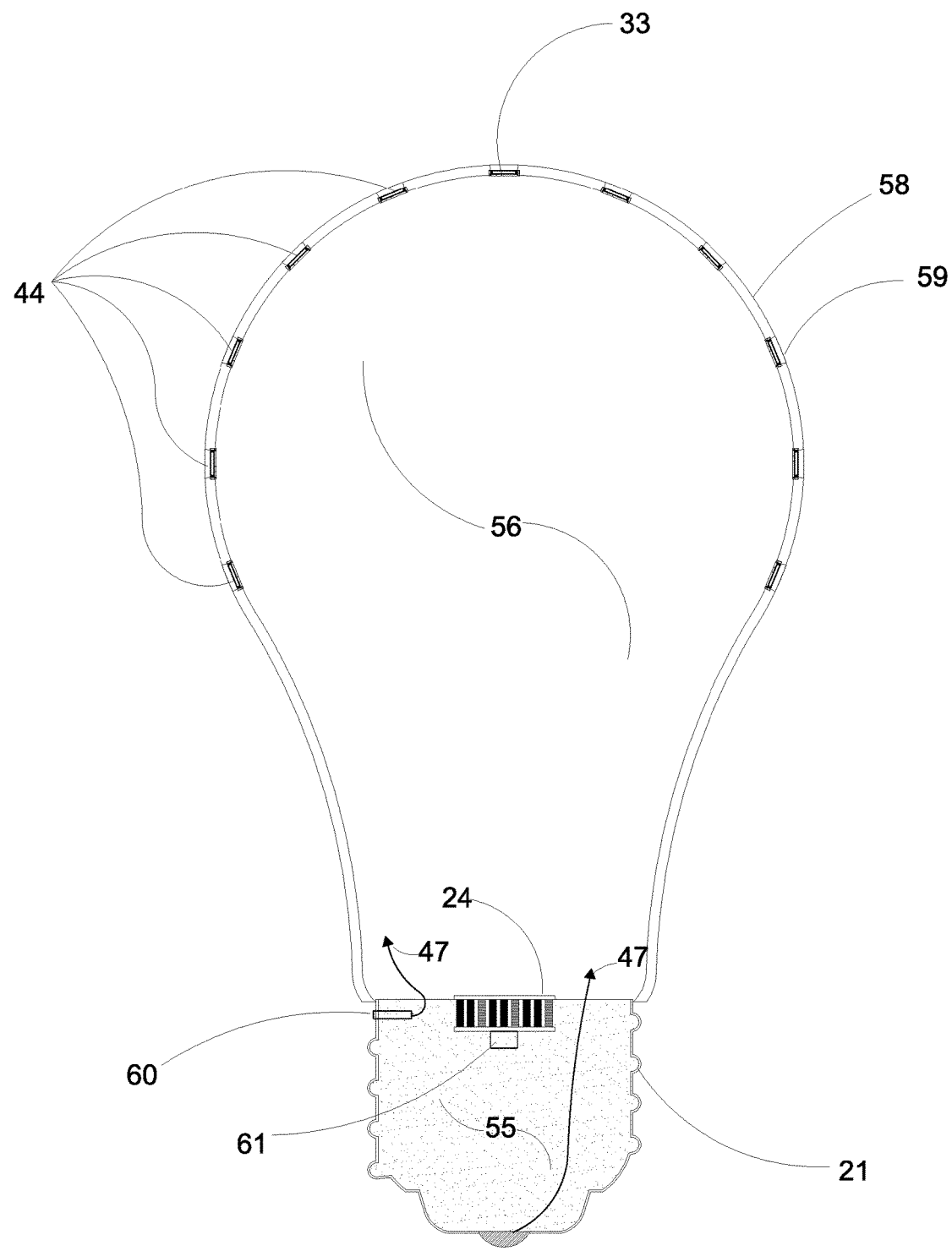
FIG. 23 is a schematic diagram of an exemplary embodiment of an LED bulb.
Figure 24:
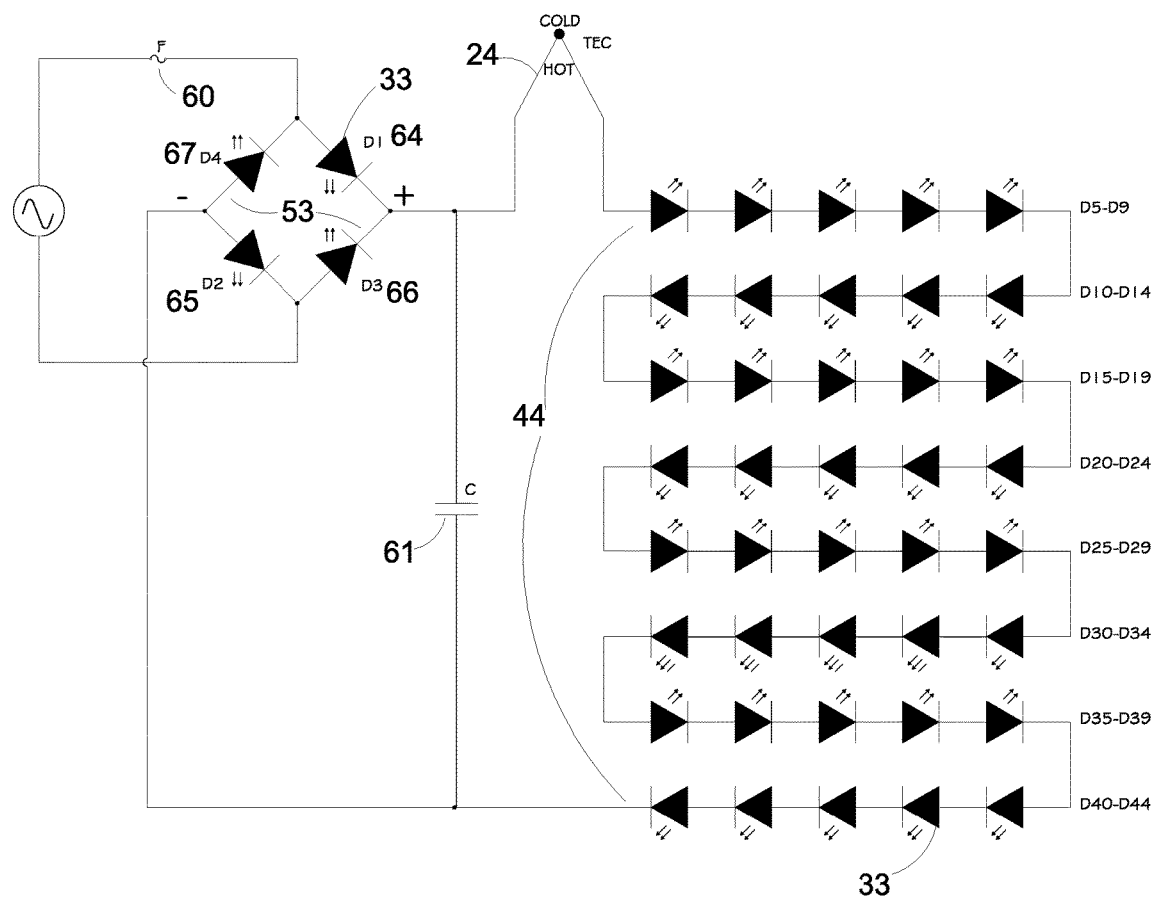
FIG. 24 is an electrical schematic of an exemplary embodiment for an AC powered LED bulb.
Figure 25:
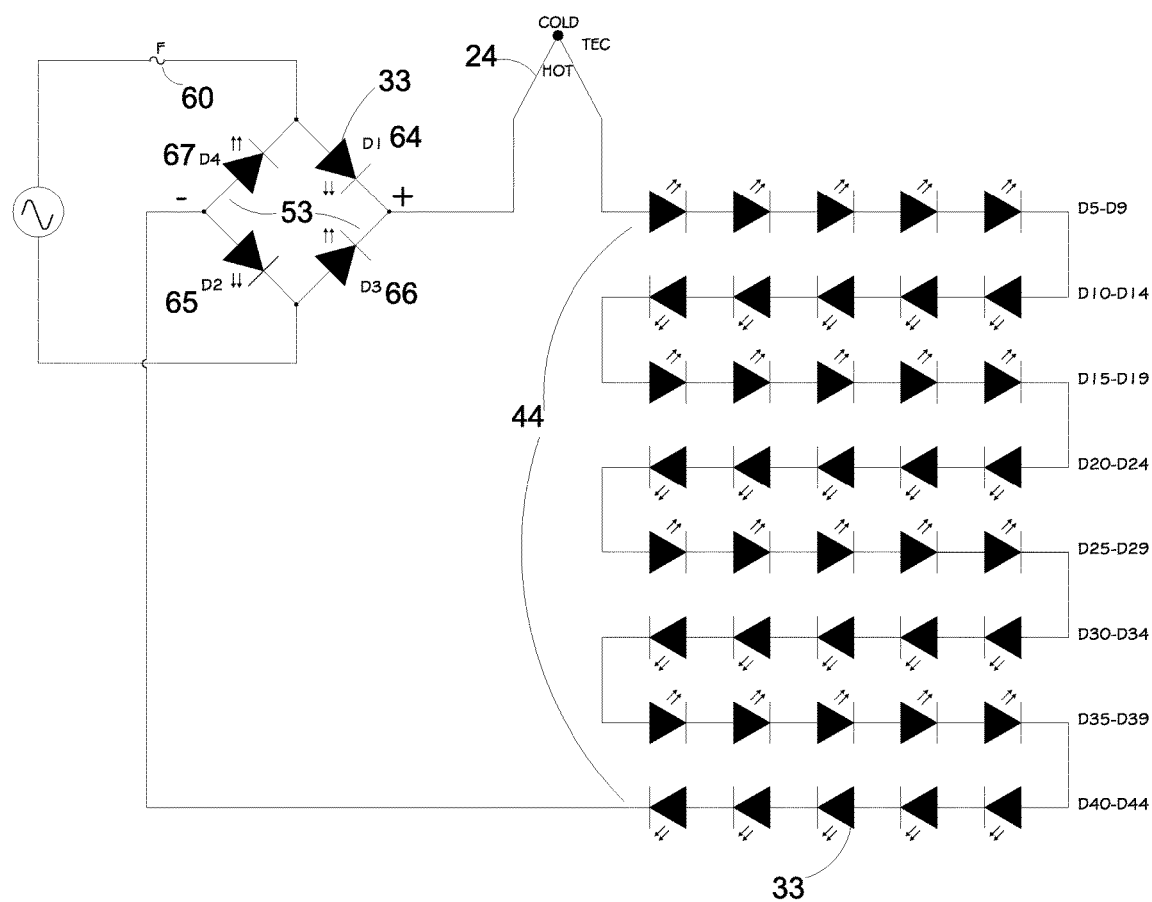
FIG. 25 is another electrical schematic of an exemplary embodiment for an AC powered LED bulb.
Figure 26:
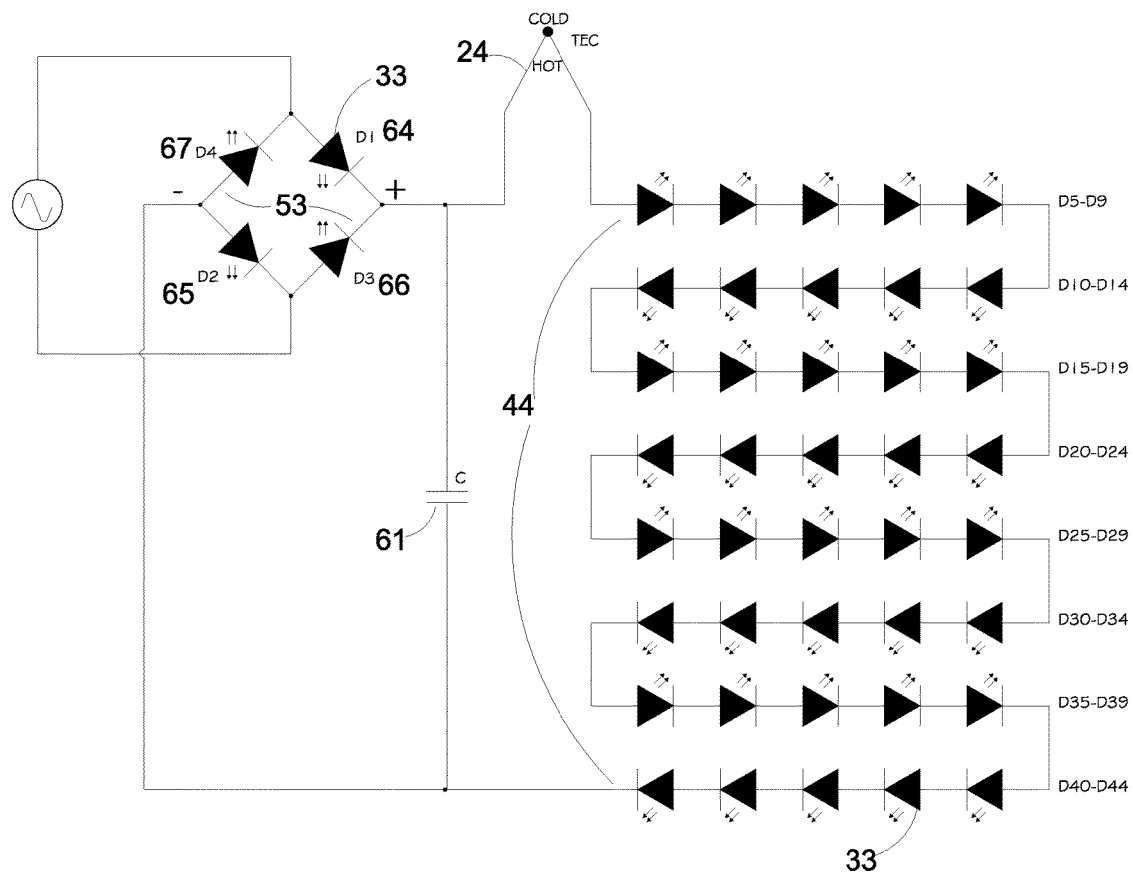
FIG. 26 is another electrical schematic of an exemplary embodiment for an AC powered LED bulb.
Figure 27:
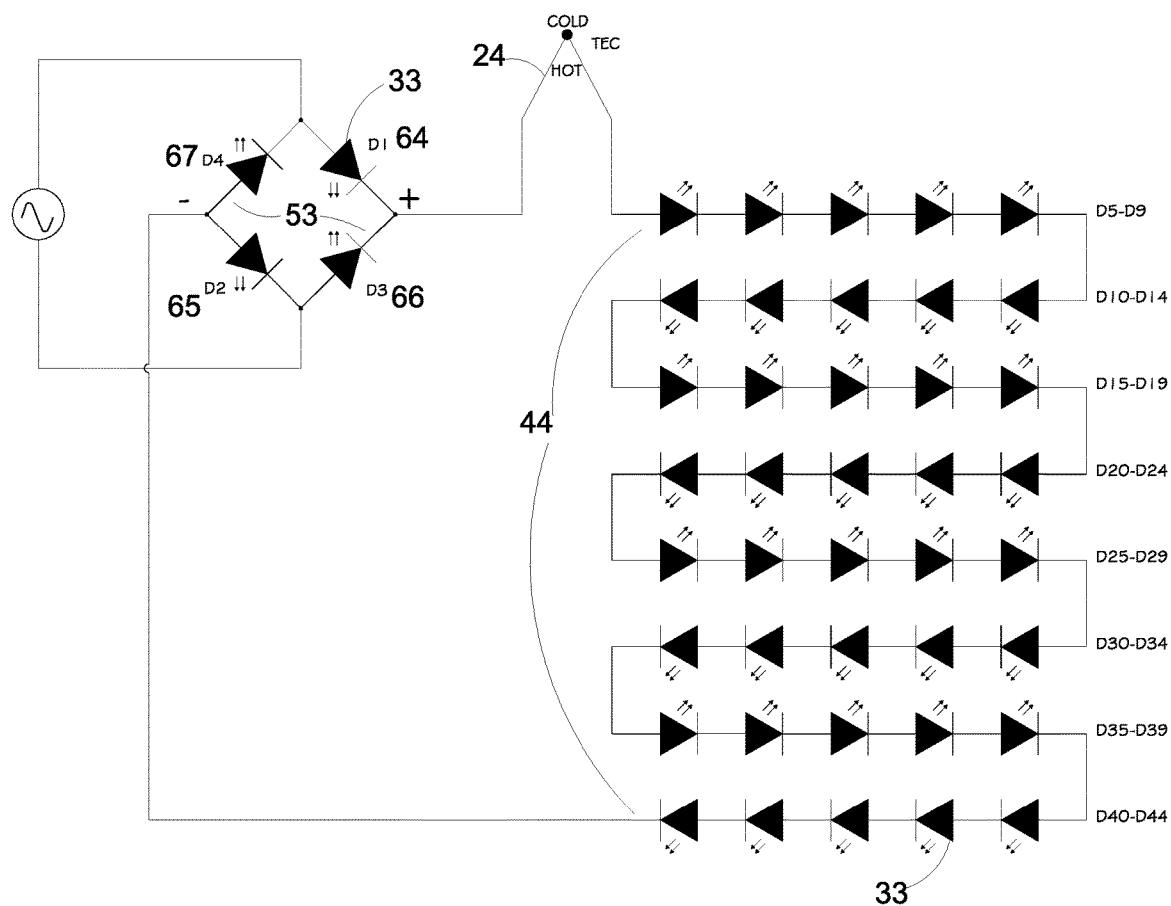
FIG. 27 is another electrical schematic of an exemplary embodiment for an AC powered LED bulb.

FIG. 23 is a schematic diagram of an exemplary embodiment of an LED bulb. In FIG. 23, the LED string 44 may be electrically wired according to, for example, FIG. 24, 25, 26 or 27, to accept A/C current without the need of transformers and/or secondary rectifying circuitry by using at least two of the needed LEDs 33 required for light output along with at least two additional LEDs 33 to make up a four LED bridge rectifier 53. The individual LEDs 33 of the LED string 44 and each of the four LED bridge rectifier 53 LEDs 33 may be kept clear of negative changes to their lenses refractive index and/or from negative photovoltaic effects due to other LEDs 33 in the LED string 44 shining upon them by their location in and/or embedment into the bulb shell 58. The LED strings 44 cathodes 6 and anodes 5 are wired according to, for example, FIG. 24, 25, 26 or 27, on a flexible circuit, hand-wired manually, wired by automation and/or prewired by a LED manufacturer as a single bulb-shaped die, on the inside of the bulb shell 58. The circuit may be electrically attached to connecting wires 47 that electrically attach to the standard bulb screw cap 49 interior in, for example, the same or similar manner as the current incandescent bulb. In order to keep the bulb atmosphere's 56 ambient temperature cool at least one thermoelectric chiller 24 may be included to the circuit shown in, for example, FIG. 24, 25, 26 or 27, with the "cold" side, when powered, facing into the bulb atmosphere 56 and the "hot" side, when powered, facing away from the bulb atmosphere's 56 and embedded in ceramic filler 55. The outer shell of the bulb 58 may be of recycled plastic, new plastic or other moldable material. In certain aspects, the material selected may be of limited, acceptably, or not electrically conductive, and/or shaped to match the incandescent bulb it is replacing and attached to a standard bulb screw cap 49. If the individual LEDs 33 of the LED string 44 are not manufactured into the bulb shell 58 they may be connected to the bulb shell 58 with optical adhesive 59 that may be cured with ultraviolet light so as not to diminish the light emission of the LEDs 33 while bonding and sealing the LEDs 33 and bulb shell 58. Additionally, as shown in the electrical schematics of FIGS. 24 and 25, at least one protective removable fuse 60 may be added to prevent damage in the event of power spikes. Also, as shown in the electrical schematics of FIGS. 24 and 26, at least one capacitor 61 may be included in the circuit for current smoothing purposes.

Figure 28:
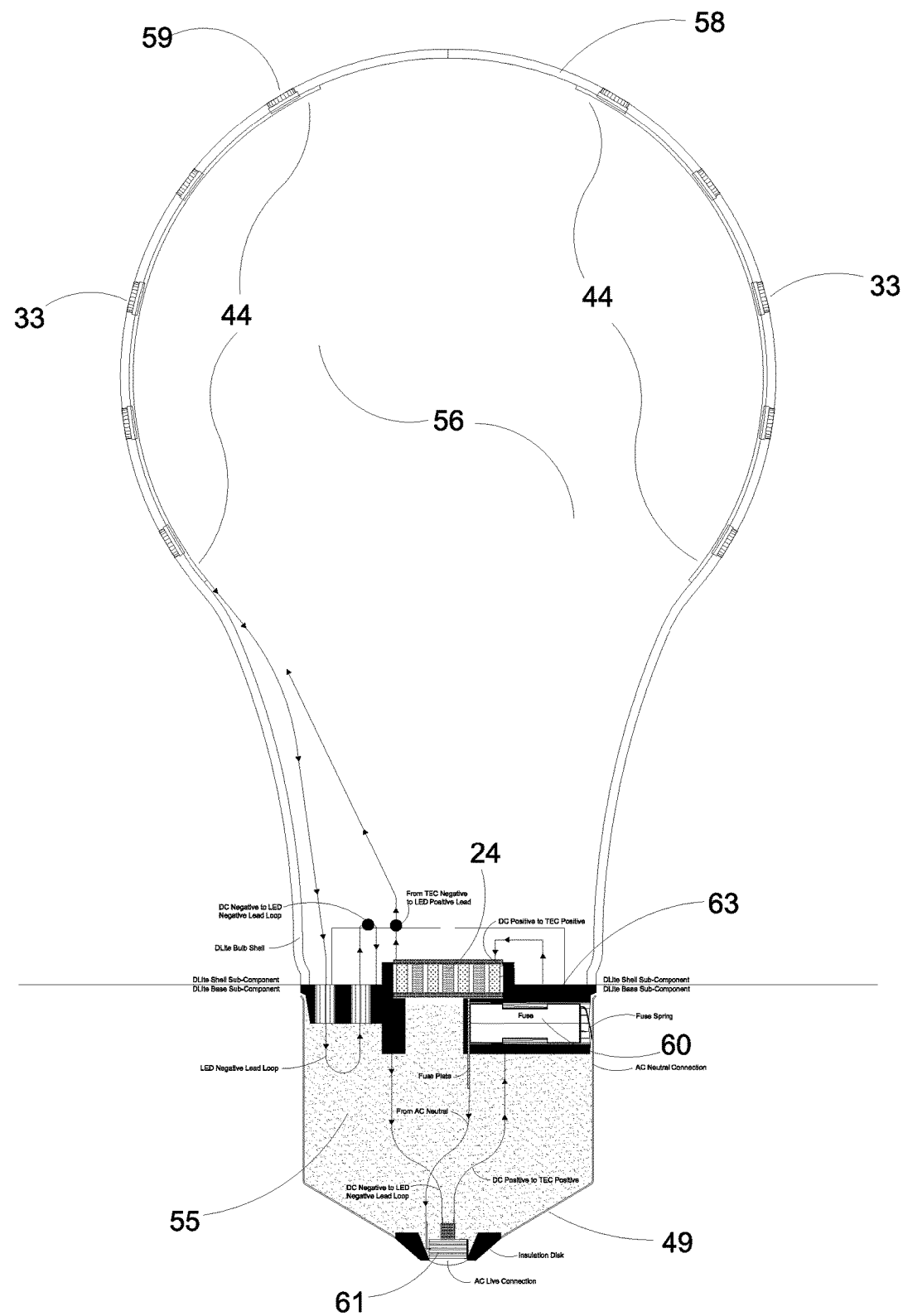
FIG. 28 is a schematic diagram of an exemplary embodiment of an LED bulb.
Figure 29:
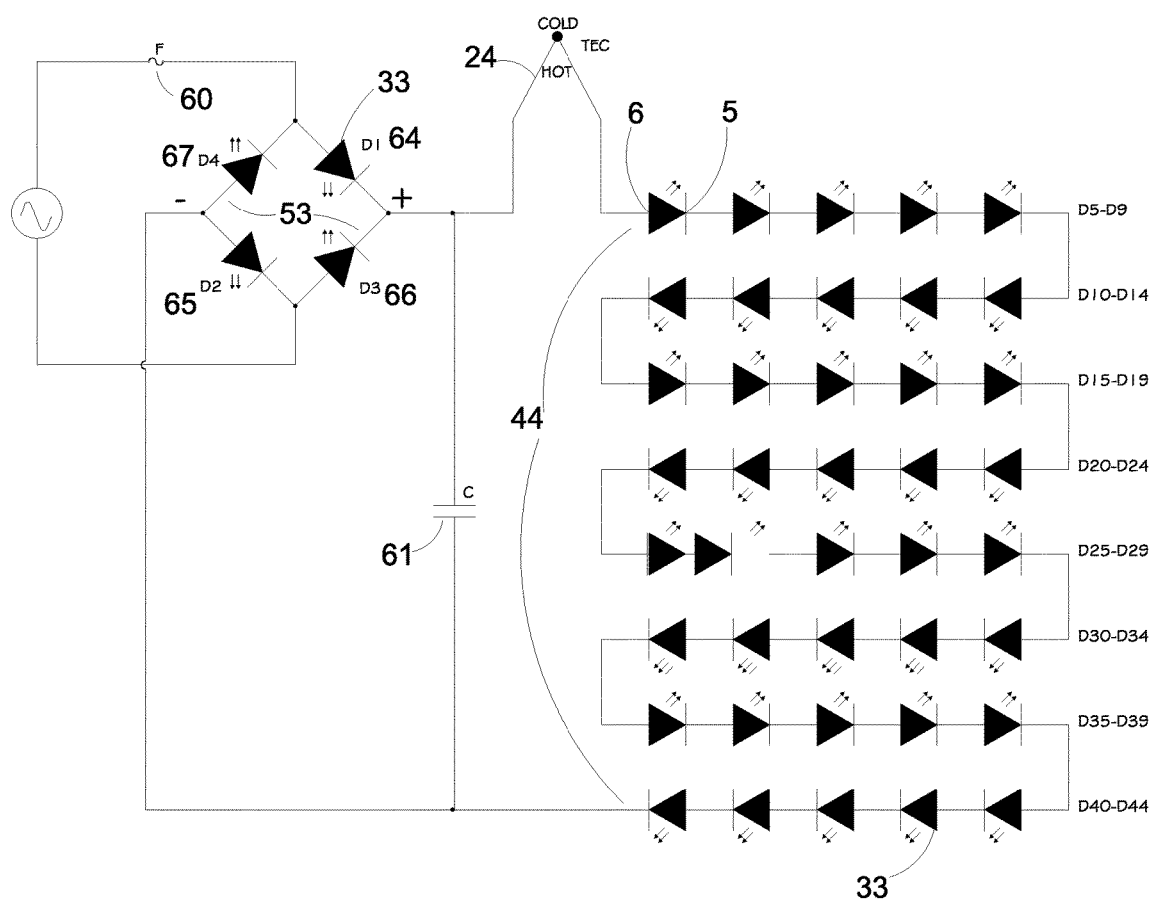
FIG. 29 is an electrical schematic of an exemplary embodiment for an AC powered LED bulb.
Figure 30:
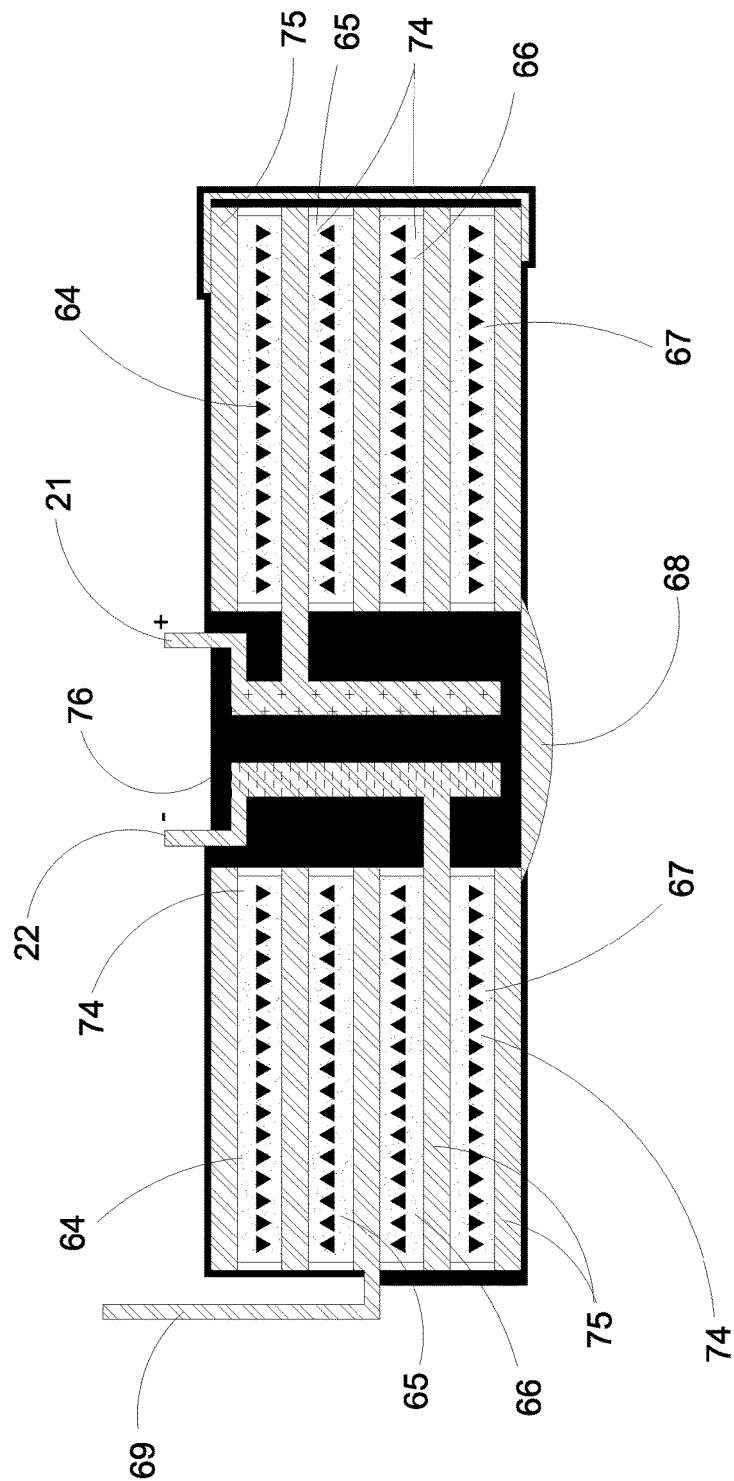
FIG. 30 is a schematic section diagram of a conditioned bridge rectifier used in an exemplary embodiment of an LED lighting assembly.
Figure 31:
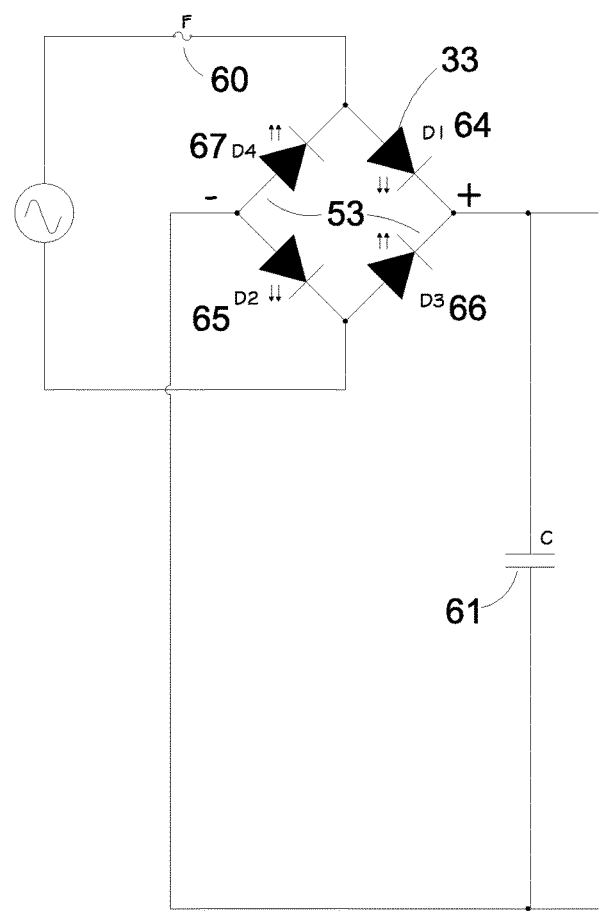
FIG. 31 is an electrical schematic of a conditioned bridge rectifier used in an exemplary embodiment of an LED lighting assembly.

FIG. 28 is a schematic diagram of an exemplary embodiment of an LED bulb. Referring to FIG. 28, the LED string 44 is electrically wired according to, for example, FIG. 29, to accept A/C current without the need of transformers by using at least one conditioned bridge rectifier 62 as shown in FIG. 30 and FIG. 31. The individual LEDs 33 of the LED string 44 may be kept clear of negative changes to their lenses refractive index and/or from negative photovoltaic effects due to the other LEDs 33 in the LED string 44 shining upon them by their location in and/or embedment into the bulb shell 58. The LED strings 44 cathodes 6 and anodes 5 are wired, for example, according to FIG. 29, on a flexible circuit, hand-wired manually, wired by automation and/or prewired by a LED manufacturer as a single bulb shaped die, on the inside of the bulb shell 58 with each LED 33 lens (or a plurality of LED lens) at the bulb surface by using cutouts in the outer bulb shell 58. The circuit may be electrically attached to the conditioned bridge rectifier 62 that may be attached to the standard bulb screw cap 49 interior in the same or similar manner as the current incandescent bulb with the option of adding a removable fuse 60. In order to keep the bulb atmosphere's 56 ambient temperature cool at least one thermoelectric chiller 24 may be included to the circuit shown, for example, in FIG. 29, with the "cold" side, when powered, facing into the bulb atmosphere 56 through a temperature isolation plate 63 and the "hot" side, when powered, facing away from the bulb atmosphere's 56 and embedded in ceramic filler 55. The outer shell of the bulb 58 may be of recycled plastic, new plastic or other moldable material. In certain aspects, the material selected may be of limited, acceptably or not electrically conductive, and/or shaped to match the incandescent bulb it is replacing and attached to a standard bulb screw cap 49. If the individual LEDs 33 of the LED string 44 are not manufactured into the bulb shell 58, they may be connected to the bulb shell 58 with optical adhesive 59 that may be cured with ultraviolet light so as not to diminish the light emission of the LEDs 33 while bonding and sealing the LEDs 33 and the bulb shell 58. Referring to FIGS. 30 and 31, schematics of a conditioned bridge rectifier that may be used in an exemplary embodiment of an LED lighting assembly, AC current is bridge rectified into DC current by assembling at least four silicone foam diode donuts 64, 65, 66, and 67 into the usual configuration of a standard bridge rectifying circuit. Diode donut D1's 64 cathode side shares a contact plate with diode donut D3's 66 cathode side. Diode donut D3's 66 anode side shares a contact plate with diode donut D2's 65 cathode side and diode donut D2's 65 anode side shares a contact plate with diode donut D4's 67 anode side. Diode donut D4's 67 cathode side plate is connected to the AC live contact 68 and is also connected, without making electrical contact to other electrically conductive contact plates, to diode donut D1's 64 anode side plate. An AC neutral contact 69 is connected to the shared contact plate of diode donut D2 65 and diode donut D3 66. A capacitor 61, or ultra capacitor, is inserted in the holes of the diode donuts with its positive lead connected to the shared contact plate between diode donut D1 64 and diode donut D3 66, without making electrical contact to other electrically conductive contact plates, and then continuing out to form a positive lead terminal and with its negative lead connected to the shared contact plate between diode donut D2 65 and diode donut D4 67, without making electrical contact to other electrically conductive contact plates, and then continuing out to form a negative lead terminal. This configuration allows the AC input to be bridge rectified into direct current (DC) first through diode donuts 64, 65, 66, and 67, then conditioned with the capacitor or ultra capacitor 61 prior to the remainder of the electrical circuit of the thermoelectric chiller 24 and the LED string 44. A hand built prototype of this configuration was tested to have a lumen output of 910 lumens and consumed 8 Watts of power using Nichia 157A LED components. It is calculated, using a more efficient chip and producing the bulb under proper manufacturing conditions, the power consumption will be further reduced down to 5.4 Watts with a lumen output of 910 lumens with a CCT of 2,700K.

Figure 32:
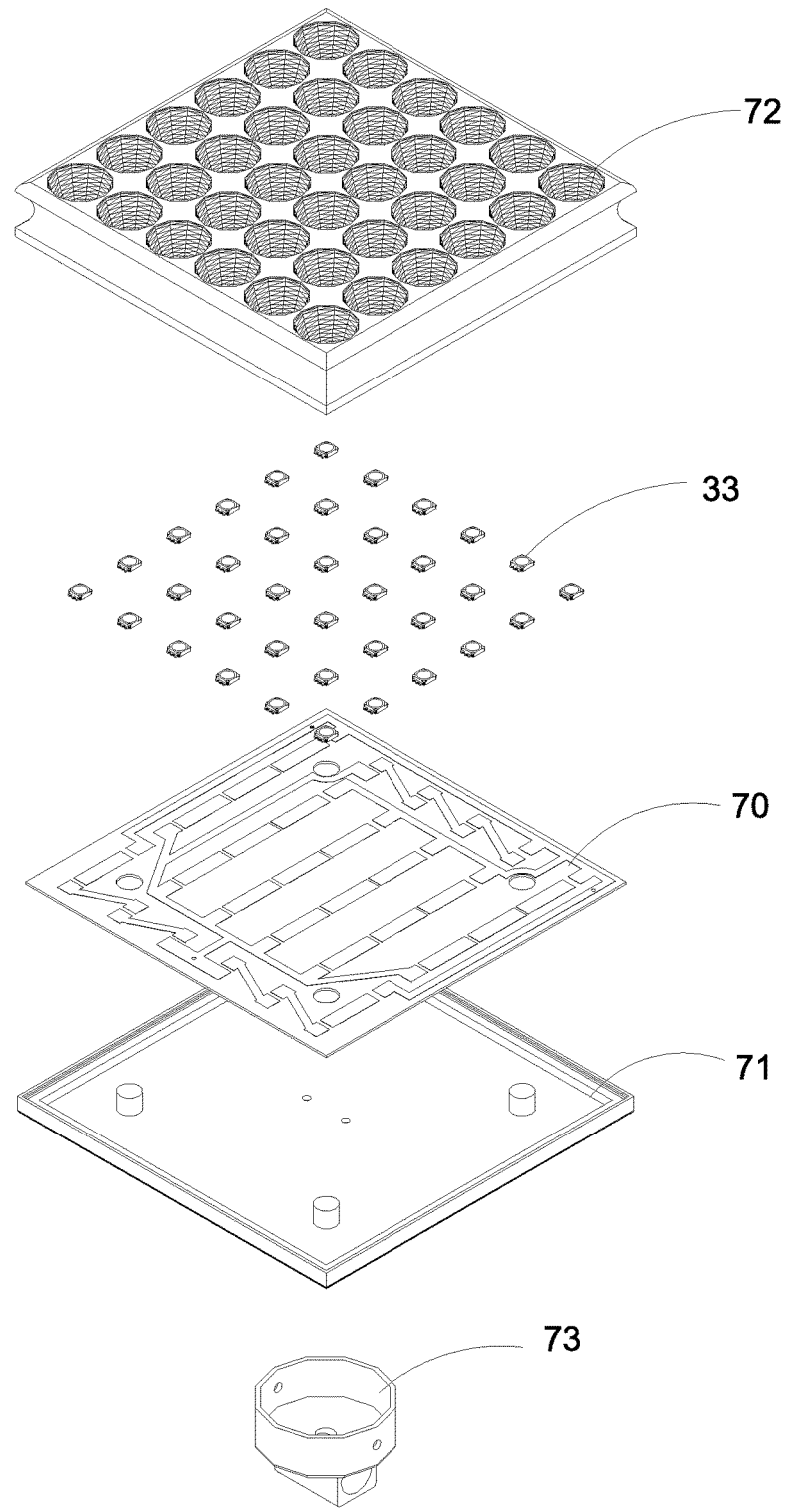
FIG. 32 is an exploded diagram of an exemplary embodiment of an LED lighting assembly.

FIG. 32 an exploded view diagram of an exemplary embodiment of an LED lighting assembly that may be used, for example, for parking lot lights, work lights and other directional light sources. LEDs 33 are connected to a ceramic circuit plate 70 according to one or more of the electrical schematics shown in FIG. 33, 34 or 35 using electrical conductive epoxy that will cure at or below sixty five degrees Celsius and/or electrically conductive optical adhesive that will cure using ultra violet light that may be placed using common pick and place machine and/or other methods. The circuit traces may be designed for the optimal resistance to limit the voltage and/or current to the desired LED 33 levels without the use of, or a reduced use of, other electronic components. The ceramic circuit plate 70 may be attached to a thermally conductive back housing 71 with thermally conductive epoxy resulting in a sufficient heat sink for the LEDs 33. The positive and negative lead wires may be fed through a hole or holes of the back housing 71 for connection to a power source. A Parabolic Cover Plate 72 covers the assembly that may be attached with epoxy, having one parabolic reflector per LED 33, designed for beam spreads from three degrees to ninety degrees from either side of the centerline of light beam (though other ranges of degrees may also be used), in order to isolate, or substantially isolate, each LED 33 (or a plurality of LEDS) from one another to ensure that a reduced amount of, substantially no, or no photometric and/or photovoltaic interference occurs. Optical cement may then be placed at the base of each parabolic reflector (or a plurality of parabolic reflectors) and over the LEDs 33 and cured under ultraviolet light, sealing and waterproofing the LEDs 33 without causing refractive loss, reducing refractive loss or minimizing refractive loss. An end cap 73 may be added to aid in attachment to new or existing fixtures and to enclose electrical connections to a power source.

Figure 33:
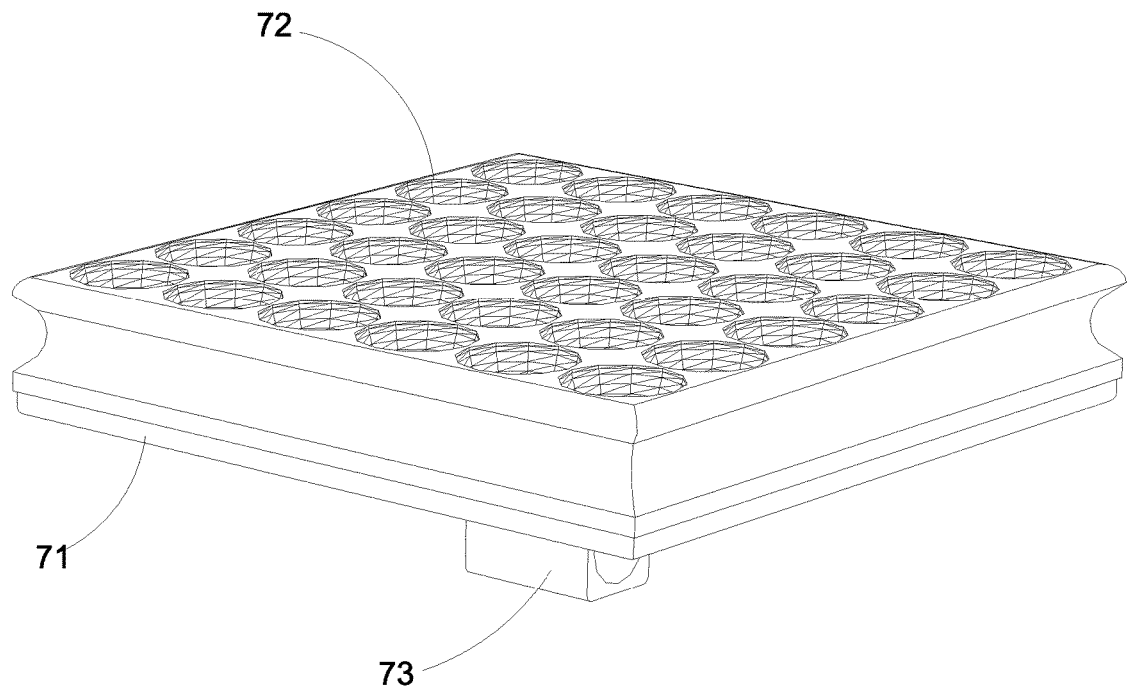
FIG. 33 is an isometric view of an exemplary embodiment of an LED lighting assembly.

FIG. 33 an isometric view of an exemplary embodiment of the LED lighting assembly described in FIG. 32. Prototypes using the described method was built with the following results: A parking lot fixture prototype to replace parking lot and parking structure lamps and ballast that typically consume 1,250 Watts with a system lifespan of three to five years was built and tested, provided equivalent light output at the working surface and based upon the LED current and LED temperature should have a lifespan that exceeds a million hours. The parking lot prototype consumed approximately 12 Watts. A work-light prototype to replace halogen work-lights that consume 500 Watts with a lamp lifespan of 1,000 hours was built and tested, provided more light output at the working surface and based upon the LED current and LED temperature should have a lifespan that exceeds a million of hours. The work-light prototype consumed approximately 8 Watts. A roadway light prototype to replace 400 Watt roadway Type I fixtures was built and tested and has been running basically continuously for over 11 months produces the required illumination with a significantly improved beam pattern than the typical 400 Watt roadway light fixture and consumes 1.5 Watts of power.

Figure 34:
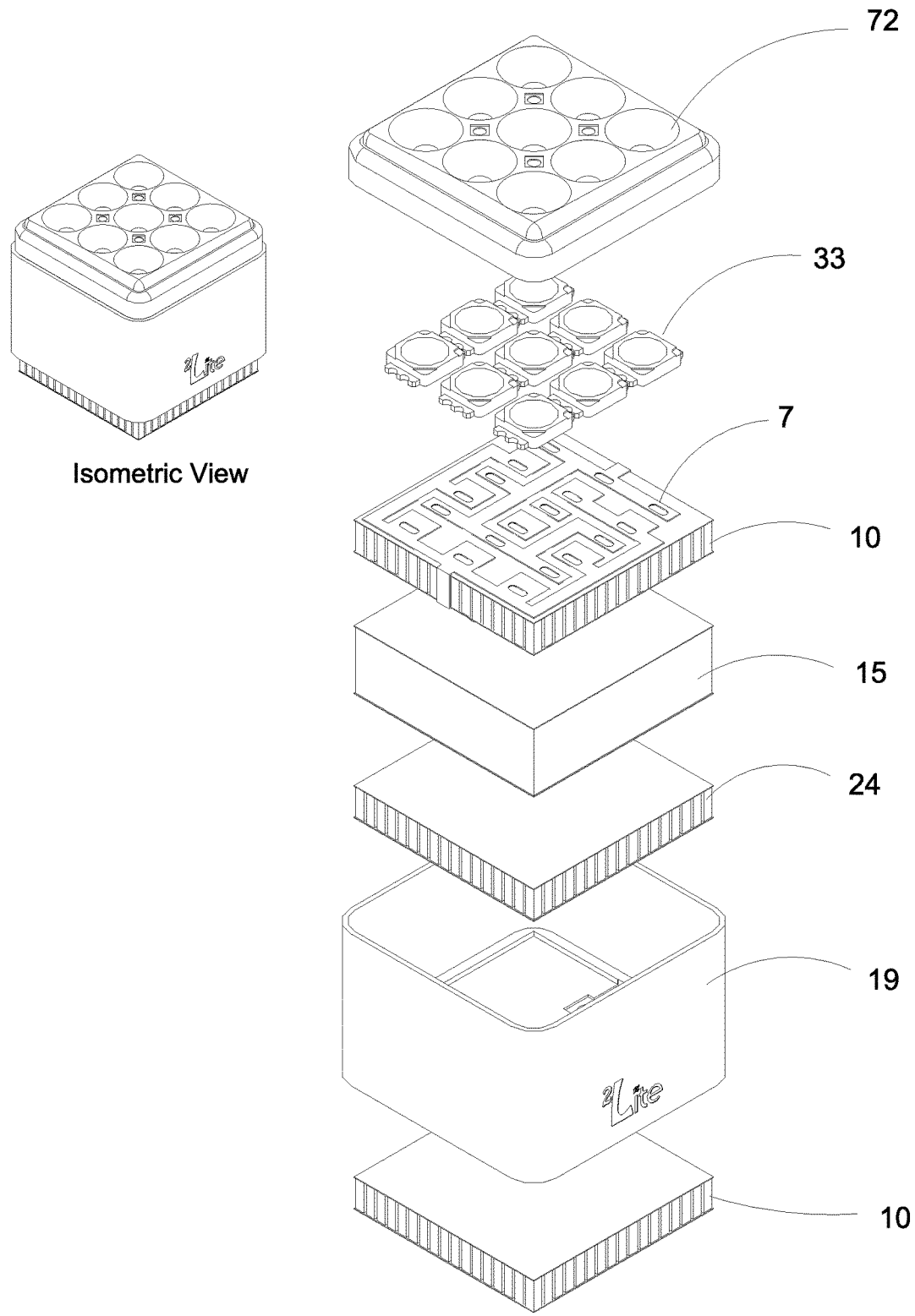
FIG. 34 is an exploded and isometric view of another exemplary embodiment of an LED lighting assembly as described in FIG. 1.

FIG. 34 an exploded diagram and isometric view of another exemplary embodiment of an LED lighting assembly as described in FIG. 1. Prototypes of this lighting assembly have been built and show significant improvements for recessed can lighting (60 Watt equivalent=1 Watt), fluorescent troffer fixtures (200 Watt equivalent=5 Watts), and automobile headlamps (200 Watt equivalent=0.25 Watt).

Figure 35:
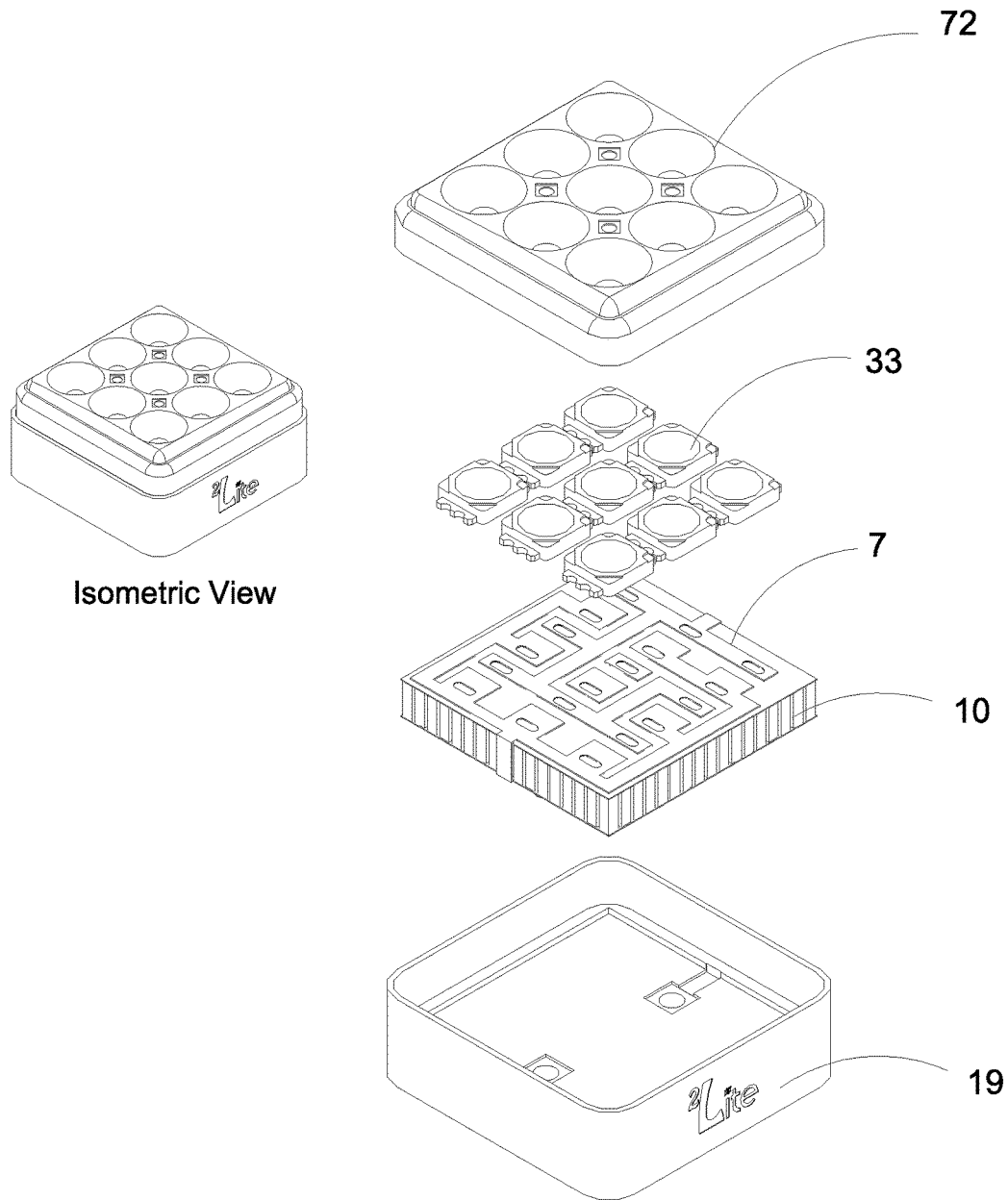
FIG. 35 is an exploded and isometric view of another exemplary embodiment of an LED lighting assembly as described in FIG. 2.

FIG. 35 an exploded diagram and isometric view of another exemplary embodiment of an LED lighting assembly as described in FIG. 2. A prototype was built to test the amount of thermal energy that could be harvested if there was a significant thermal difference. The prototype successfully powered additional LEDs with harvested heat energy from its LED circuit. In another test, it also was able to run a small thermoelectric chiller with harvested heat energy from its LED circuit.

Figure 36:
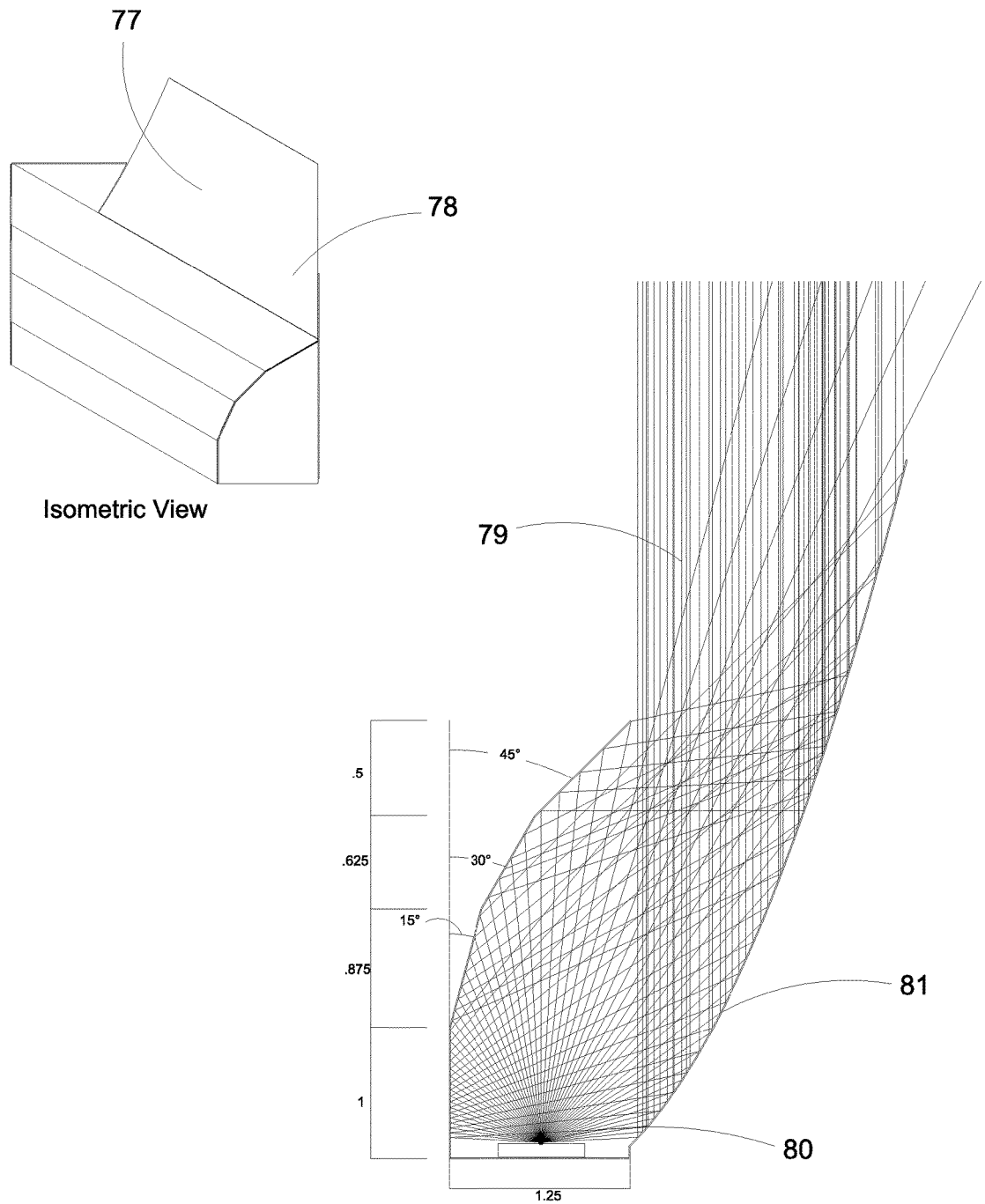
FIG. 36 is a section and isometric view of a parabolic reflector to be used for architectural building illumination.
Figure 37:
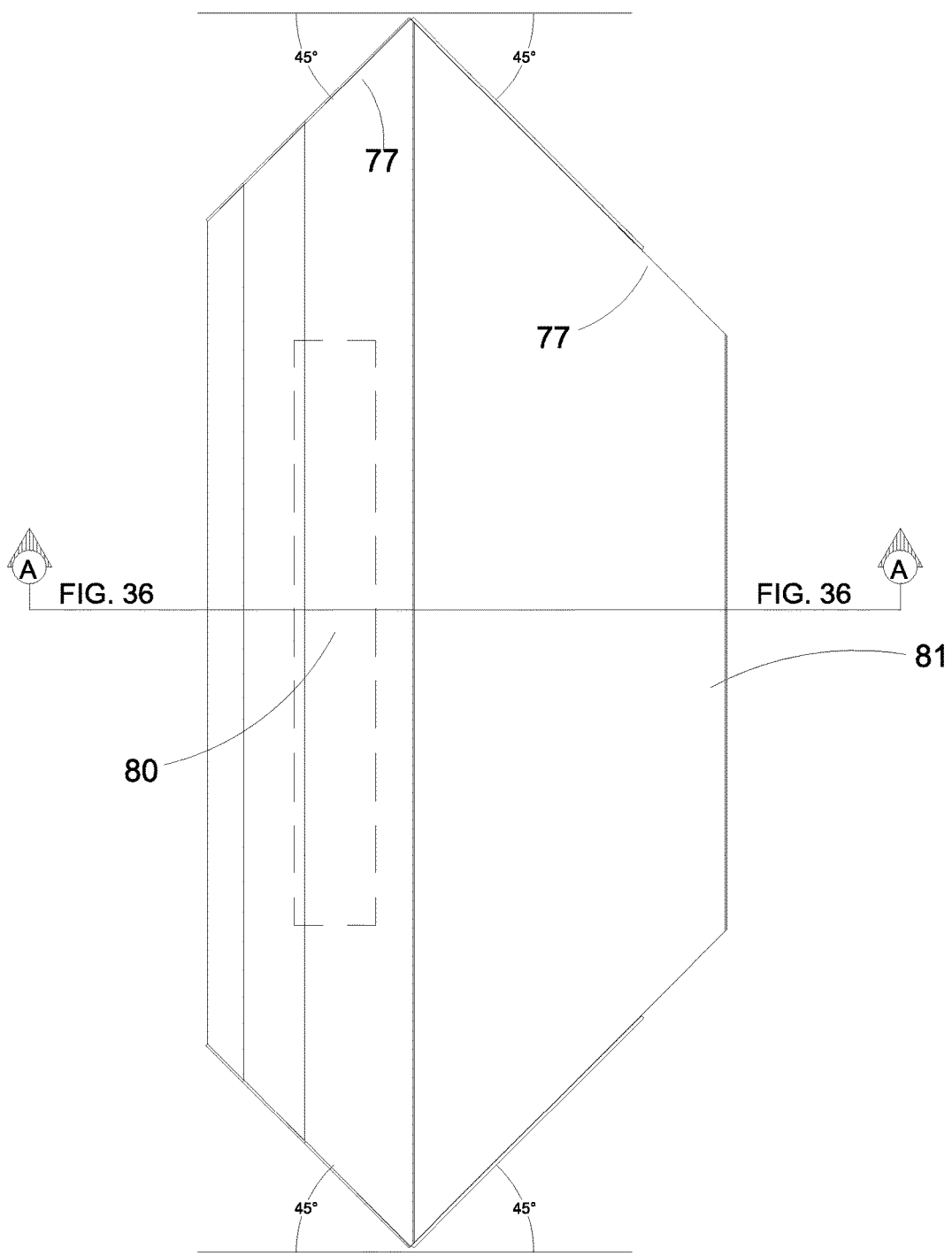
FIG. 37 is a plan view of a parabolic reflector to be used for architectural building illumination.

FIG. 36 is a section view and isometric view and FIG. 37 is a plan view of FIG. 36 of a parabolic reflector to be used for architectural building illumination. A prototype was built and a side-by-side test was done replacing two-1,500 Watts H.I.D. parabolic architectural building illumination fixtures using 60 Watts of power.

In the exemplary embodiment described herein, The following reference numerals have the identified label/structure/operation:

1) Individual Optic (lens or reflector)
2) Optic Separator-Reflector
3) L.E.D. Lens
4) L.E.D. Die
5) L.E.D. Anode (+)
6) L.E.D. Cathode (−)
7) Circuit Layer
8) Electrical and Thermal Conductive Epoxy
9) Thermoelectric Device Substrate (hot side)
10) Thermoelectric Generator
11) L.E.D. Power Supply Connector
12) Thermoelectric Device Substrate (cold side)
13) Thermally Conductive Substrate or Heat Sink
14) Thermally Conductive Vertical Path Walls
15) Low Temperature Phase Change Material Storage
16) Heat Rejection Flow
17) High Temperature Flow
18) Insulating Barrier
19) Outer Housing
20) Direct Current Flow
21) Positive lead
22) Negative lead
23) Blocking Diode
24) Thermoelectric Chiller
25) Thermally Conductive Link
26) Sintered Heat Pipe
27) Working Fluid
28) A/C Transformer
29) Primary Leads
30) Secondary Leads
31) Resistor Clamp
32) Inline Resistor
33) L.E.D.
34) Thermally Modified P.C.B.
35) Electrically Isolated Thermal Pad
36) Solid Copper Vias
37) Screw
38) Nut
39) Low Temperature Phase Change Pellet Insulation
40) Polypropylene Case Walls
41) Ultra Capacitor Array
42) Bimetallic Strip Switch
43) Nichrome Coil Heat Element
44) L.E.D. Strings
45) Ceramic Geodesic Substrate and Shaft
46) Copper Foil Circuit Layer
47) Enameled Connecting Wire
48) Connecting Wire Contact
49) Standard Bulb Screw Cap
50) Glass Fuse Enclosure
51) Resident Memory Switch Chip
52) Enameled Wire Coil Around Cylindrical Ferrite Core
53) Rectifying Circuit
54) A/C Connectors
55) Ceramic Filler
56) Bulb Atmosphere
57) Cellulose Triacetate Diffuser Bulb
58) Bulb Shell
59) Optical Adhesive or Cement
60) Protective Removable Fuse
61) Capacitor
62) Conditioned Bridge Rectifier
63) Temperature Isolation Plate
64) Foam Diode Donut D-1
65) Foam Diode Donut D-2
66) Foam Diode Donut D-3
67) Foam Diode Donut D-4
68) AC Live
69) AC Neutral
70) Ceramic Circuit Plate
71) Back Housing
72) Parabolic Cover Plate
73) End Cap.

EXAMPLES

A lighting device comprising: a plurality of LEDs; a plurality of optic devices corresponding to the plurality of LEDs; at least one optical separator for substantially preventing the light emitted from one LED from effecting the other LEDs; a thermoelectric device configured to harvest heat generated by the LEDs and convert the harvested heat into electrical energy; and a low temperature material for creating a temperature difference across the thermoelectric device.

The lighting device may comprise at least one optical separator that substantially prevents a change in refractive index of the other lights.

The lighting device may comprise at least one optical separator that substantially prevents a photovoltaic effect on the other lights.

The lighting device may comprise a low temperature material that is a phase change material.

The lighting device may generate electrical energy that is used to aid in maintaining the low temperature material at a low temperature.

The lighting device the generated electrical energy is used to aid in powering at least one additional LED.

The lighting device may be powered by DC voltage.

The DC power may be harvested from the site where the light is needed (e.g., waste thermal energy from a water line or other local process, radio waves, sunlight, etc.).

The lighting device may be supplied with AC voltage and a plurality of LEDs may be arranged such that about 50% are in a first polarity and about 50% are in a reverse polarity.

The power source may be designed to supply about 2.78V and about 80 mA.

The power supply may be a substantial power match to the LED specifications.

Matching the power supply may benefit the lighting device by increasing the output by +72.57 lm/w (e.g., 20 lm/w, 30 lm/w, 40 lm/w, 50 lm/w, 60 lm/w, 70 lm/w, 75 lm/w, 80 lm/w, 90 lm/w, etc.).

Matching the power supply may result in a lifecycle gain of about 600% (e.g., 50%, 100%, 200%, 300%, 400%, 500%, 700%, 800%).

The LEDs in the lighting device may be mounted on the TEG substrate using conductive paste: +/−0 lm/w—Lifecycle loss 0% (e.g., substantially no lifecycle loss).

An active thermal design of the lighting device to remove/reduce ambient heat may result in an increase in output of about +8 lm/w (e.g., 4 lm/w, 5 lm/w, 6, lm/w, 7 lm/w, 9 lm/w, 10 lm/w, 15 lm/w, etc.) and/or a lifecycle gain of about 100% (e.g., 20%, 30%, 40%, 50%, 60%, 70%, 80%, 90%, 100%, 110%, 120%, 130%, 140%, 150%).

An active thermal design of the lighting device to remove solder junction heat may result in an increase of output by about +5 lm/w (e.g., 4 lm/w, 5 lm/w, 6, lm/w, 7 lm/w, 9 lm/w, 10 lm/w, 15 lm/w, etc.) and/or a lifecycle gain of about 100% (e.g., 20%, 30%, 40%, 50%, 60%, 70%, 80%, 90%, 100%, 110%, 120%, 130%, 140%, 150%).

The harvested thermal energy may be converted back to light which may result in an effective improvement of about +6 lm/w (e.g., 4 lm/w, 5 lm/w, 6, lm/w, 7 lm/w, 9 lm/w, 10 lm/w, 15 lm/w, etc.) and/or a lifecycle gain of about 0% (e.g., substantially no lifecycle loss).

The lighting device may have a lens designed to reduce optical loss from the lens or reflectors which may reduce lens/reflector loss to about −3% lm/w—(e.g., 1 lm/w, 2 lm/w, 3 lm/w, 4 lm/w, 5 lm/w, 6 lm/w, 7 lm/w, etc.) and/or a lifecycle loss of about 0% (e.g., substantially no lifecycle loss).

The lighting device may have an LED Efficacy that is raised from 150 lm/w to 234.32 lm/w (e.g., an improvement of 25%, 30%, 40%, 50%, 55%, 60%, 70%, 75%, 80%, 90%, 100%, etc.).

The lighting device may have an LED Lifecycle: raised from 100,000 hours to 800,000 hours (e.g., 150,000, 200,000, 250,000, 300,000, 350,000, 400,000, 450,000, 500,000, 550,000, 600,000, 650,000, 700,000, 750,000, 800,000, 850,000, 900,000, 1,000,000 hours, etc.) or a life cycle extension of, e.g., 100%, 200%, 300%, 400%, 500%, 600%, 700%, etc.

The lighting device may have fewer components than convention device and may cost less to manufacture.

The lighting device may be easier to manufacture and have a smaller BOM;

The lighting device may have heat transfer methods that work in suitable fixture housings and environments.

Outdoor versions of the lighting device may have fixtures that benefit from harvesting heat from the sun cold thermal energies at night.

The lighting device may have optic design at the individual LED level that improves the percentage of the lumens that reach the intended working surface;

The lighting device may be able to harvest more thermal energy to run another type of subsystem (e.g., camera, signal, sensors, etc.).

Additional examples of certain exemplary embodiments are set forth below:

Example 1. A lighting device comprising:
a plurality of LEDs;
a plurality of optic devices corresponding to the plurality of LEDs;
at least one optical separator for substantially preventing the light emitted from one LED from effecting the other LEDs;
a thermoelectric device configured to harvest heat generated by the LEDs and convert the harvested heat into electrical energy; and
a low temperature material for creating a temperature difference across the thermoelectric device.

2. The lighting device of example 1 wherein the at least one optical separator substantially prevents a change in refractive index of the other lights.

3. The lighting device of one or more of the preceding examples wherein the at least one optical separator substantially prevents a photovoltaic effect on the other lights.

4. The lighting device of one or more of the preceding examples wherein the low temperature material is a phase change material.

5. The lighting device of one or more of the preceding examples wherein the generated electrical energy is used to aid in maintaining the low temperature material at a low temperature.

6. The lighting device of one or more of the preceding examples wherein the generated electrical energy is used to aid in powering at least one additional LED.

7. The lighting device of one or more of the preceding examples wherein the lighting device is supplied with DC voltage.

8. The lighting device of one or more of the preceding examples wherein the lighting device is supplied with AC voltage and at plurality of LEDs are arranged such that about 50% are in a first polarity and about 50% are in a reverse polarity.

9. The lighting device of one or more of the proceeding examples wherein the plurality of LEDs are configured such that the efficacy of the plurality of LEDs is greater than the efficacy of an individual LED.

10. The lighting device of one or more of the proceeding examples wherein the plurality of LEDs are configured such that the efficacy of the plurality of LEDs is at least 5%, 10%, 15%, 20%, 25%, 30%, 40%, 50%, 60%, 70%, 80%, 90%, 95% or 99% greater than the efficacy of an individual LED.

11. The lighting device of one or more of the proceeding examples wherein the plurality of LEDs are configured such that the efficacy of the plurality of LEDs is between 5% to 99%, 5% to 40%, 10% to 30%, 20% to 40% 50% to 70%, 60% to 85% or 40% to 90% greater than the efficacy of an individual LED.

12. The lighting device of one or more of the proceeding examples wherein the plurality of LEDs are configured such that the lumens per watt of the plurality of LEDs is greater than the lumens per watt of an individual LED.

13. The lighting device of one or more of the proceeding examples wherein the plurality of LEDs are configured such that the lumens per watt of the plurality of LEDs is at least 5%, 10%, 15%, 20%, 25%, 30%, 40%, 50%, 60%, 70%, 80%, 90%, 95% or 99% greater than the lumens per watt of an individual LED.

14. The lighting device of one or more of the proceeding examples wherein the plurality of LEDs are configured such that the lumens per watt of the plurality of LEDs is between 5% to 99%, 5% to 40%, 10% to 30%, 20% to 40% 50% to 70%, 60% to 85% or 40% to 90% greater than the lumens per watt of an individual LED.

15. A lighting device comprising:
a plurality of LEDs;
a plurality of optic devices corresponding to the plurality of LEDs;
at least one optical separator for substantially preventing the light emitted from one LED from effecting the other LEDs;

16. The lighting device of example 15 wherein the at least one optical separator substantially prevents a change in refractive index of the other lights.

17. The lighting device of one or more of the preceding examples wherein the at least one optical separator substantially prevents a photovoltaic effect on the other lights.

18. The lighting device of one or more of the preceding examples further comprising: a thermoelectric device configured to harvest heat generated by the LEDs and convert the harvested heat into electrical energy; and a low temperature material for creating a temperature difference across the thermoelectric device.

19. The lighting device of one or more of the preceding examples wherein the low temperature material is a phase change material.

20. The lighting device of one or more of the preceding examples wherein the generated electrical energy is used to aid in maintaining the low temperature material at a low temperature.

21. The lighting device of one or more of the preceding examples wherein the generated electrical energy is used to aid in powering at least one additional LED.

22. The lighting device of one or more of the preceding examples wherein the lighting device is supplied with DC voltage.

23. The lighting device of one or more of the preceding examples wherein the lighting device is supplied with AC voltage and at plurality of LEDs are arranged such that about 50% are in a first polarity and about 50% are in a reverse polarity.

24. The lighting device of one or more of the proceeding examples wherein the plurality of LEDs are configured such that the efficacy of the plurality of LEDs is greater than the efficacy of an individual LED.

25. The lighting device of one or more of the proceeding examples wherein the plurality of LEDs are configured such that the efficacy of the plurality of LEDs is at least 5%, 10%, 15%, 20%, 25%, 30%, 40%, 50%, 60%, 70%, 80%, 90%, 95% or 99% greater than the efficacy of an individual LED.

26. The lighting device of one or more of the proceeding examples wherein the plurality of LEDs are configured such that the efficacy of the plurality of LEDs is between 5% to 99%, 5% to 40%, 10% to 30%, 20% to 40% 50% to 70%, 60% to 85% or 40% to 90% greater than the efficacy of an individual LED.

27. The lighting device of one or more of the proceeding examples wherein the plurality of LEDs are configured such that the lumens per watt of the plurality of LEDs is greater than the lumens per watt of an individual LED.

28. The lighting device of one or more of the proceeding examples wherein the plurality of LEDs are configured such that the lumens per watt of the plurality of LEDs is at least 5%, 10%, 15%, 20%, 25%, 30%, 40%, 50%, 60%, 70%, 80%, 90%, 95% or 99% greater than the lumens per watt of an individual LED.

29. The lighting device of one or more of the proceeding examples wherein the plurality of LEDs are configured such that the lumens per watt of the plurality of LEDs is between 5% to 99%, 5% to 40%, 10% to 30%, 20% to 40% 50% to 70%, 60% to 85% or 40% to 90% greater than the lumens per watt of an individual LED.

30. A lighting device comprising:
a plurality of LEDs;
a thermoelectric device configured to harvest heat generated by the LEDs and convert the harvested heat into electrical energy; and
a low temperature material for creating a temperature difference across the thermoelectric device 31. The lighting device of example 30 further comprising: at least one optical separator for substantially preventing the light emitted from one LED from effecting the other LEDs.

32. The lighting device of one or more of the proceeding examples wherein the at least one optical separator substantially prevents a change in refractive index of the other lights.

33. The lighting device of one or more of the preceding examples wherein the at least one optical separator substantially prevents a photovoltaic effect on the other lights.

34. The lighting device of one or more of the preceding examples wherein the low temperature material is a phase change material.

35. The lighting device of one or more of the preceding examples wherein the generated electrical energy is used to aid in maintaining the low temperature material at a low temperature.

36. The lighting device of one or more of the preceding examples wherein the generated electrical energy is used to aid in powering at least one additional LED.

37. The lighting device of one or more of the preceding examples wherein the lighting device is supplied with DC voltage.

38. The lighting device of one or more of the preceding examples wherein the lighting device is supplied with AC voltage and at plurality of LEDs are arranged such that about 50% are in a first polarity and about 50% are in a reverse polarity.

39. The lighting device of one or more of the proceeding examples wherein the plurality of LEDs are configured such that the efficacy of the plurality of LEDs is greater than the efficacy of an individual LED.

40. The lighting device of one or more of the proceeding examples wherein the plurality of LEDs are configured such that the efficacy of the plurality of LEDs is at least 5%, 10%, 15%, 20%, 25%, 30%, 40%, 50%, 60%, 70%, 80%, 90%, 95% or 99% greater than the efficacy of an individual LED.

41. The lighting device of one or more of the proceeding examples wherein the plurality of LEDs are configured such that the efficacy of the plurality of LEDs is between 5% to 99%, 5% to 40%, 10% to 30%, 20% to 40% 50% to 70%, 60% to 85% or 40% to 90% greater than the efficacy of an individual LED.

42. The lighting device of one or more of the proceeding examples wherein the plurality of LEDs are configured such that the lumens per watt of the plurality of LEDs is greater than the lumens per watt of an individual LED.

43. The lighting device of one or more of the proceeding examples wherein the plurality of LEDs are configured such that the lumens per watt of the plurality of LEDs is at least 5%, 10%, 15%, 20%, 25%, 30%, 40%, 50%, 60%, 70%, 80%, 90%, 95% or 99% greater than the lumens per watt of an individual LED.

44. The lighting device of one or more of the proceeding examples wherein the plurality of LEDs are configured such that the lumens per watt of the plurality of LEDs is between 5% to 99%, 5% to 40%, 10% to 30%, 20% to 40% 50% to 70%, 60% to 85% or 40% to 90% greater than the lumens per watt of an individual LED.

45. A lighting device comprising:
a plurality of LEDs;
wherein the plurality of LEDs are configured such that the efficacy of the plurality of LEDs is greater than the efficacy of an individual LED.

46. The lighting device of example 45 further comprising:
a plurality of optic devices corresponding to the plurality of LEDs; and at least one optical separator for substantially preventing the light emitted from one LED from effecting the other LEDs.

47. The lighting device of examples 45 or 46 further comprising:
a thermoelectric device configured to harvest heat generated by the LEDs and convert the harvested heat into electrical energy; and
a low temperature material for creating a temperature difference across the thermoelectric device.

48. The lighting device of one or more of the proceeding examples wherein the at least one optical separator substantially prevents a change in refractive index of the other lights.

49. The lighting device of one or more of the preceding examples wherein the at least one optical separator substantially prevents a photovoltaic effect on the other lights.

50. The lighting device of one or more of the preceding examples wherein the low temperature material is a phase change material.

51. The lighting device of one or more of the preceding examples wherein the generated electrical energy is used to aid in maintaining the low temperature material at a low temperature.

52. The lighting device of one or more of the preceding examples wherein the generated electrical energy is used to aid in powering at least one additional LED.

53. The lighting device of one or more of the preceding examples wherein the lighting device is supplied with DC voltage.

54. The lighting device of one or more of the preceding examples wherein the lighting device is supplied with AC voltage and at plurality of LEDs are arranged such that about 50% are in a first polarity and about 50% are in a reverse polarity.

55. The lighting device of one or more of the proceeding examples wherein the plurality of LEDs are configured such that the efficacy of the plurality of LEDs is greater than the efficacy of an individual LED.

56. The lighting device of one or more of the proceeding examples wherein the plurality of LEDs are configured such that the efficacy of the plurality of LEDs is at least 5%, 10%, 15%, 20%, 25%, 30%, 40%, 50%, 60%, 70%, 80%, 90%, 95% or 99% greater than the efficacy of an individual LED.

57. The lighting device of one or more of the proceeding examples wherein the plurality of LEDs are configured such that the efficacy of the plurality of LEDs is between 5% to 99%, 5% to 40%, 10% to 30%, 20% to 40% 50% to 70%, 60% to 85% or 40% to 90% greater than the efficacy of an individual LED.

58. A method for providing lighting that comprises using the lighting device of one or more of the proceeding examples.

59. A system for providing lighting that comprises using the lighting device of one or more of the proceeding examples.

In the description of exemplary embodiments of this disclosure, various features are sometimes grouped together in a single embodiment, figure or description thereof for the purpose of streamlining the disclosure and aiding in the understanding of one or more of the various disclosed aspects. This method of disclosure, however, is not to be interpreted as reflecting an intention that the claimed inventions requires more features than are recited expressly in each claim. Rather, as the following claims reflect, inventive aspects may lie in less than all features of a single foregoing disclosed embodiment.

Thus, the claims following the Detailed Description are hereby expressly incorporated into this Description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art.

Although the present disclosure makes particular reference to exemplary embodiments thereof, variations and modifications can be effected within the spirit and scope of the following claims.

What is claimed is:

1. A lighting device comprising:
a plurality of LEDs;
a plurality of optic devices corresponding to the plurality of LEDs;
at least one optical separator for substantially preventing the light emitted from one LED from effecting the other LEDs;
a thermoelectric device configured to harvest heat generated by the LEDs and convert the harvested heat into electrical energy; and
a low temperature material for creating a temperature difference across the thermoelectric device;
wherein the plurality of LEDs are configured such that the efficacy of the plurality of LEDs is greater than the efficacy of an individual LED.

2. The lighting device of claim 1 wherein the at least one optical separator substantially prevents a change in refractive index of the other lights.

3. The lighting device of claim 1 wherein the at least one optical separator substantially prevents a photovoltaic effect on the other lights.

4. The lighting device of claim 1 wherein the generated electrical energy is used to aid in maintaining the low temperature material at a low temperature.

5. The lighting device of claim 1 wherein the generated electrical energy is used to aid in powering at least one additional LED.

6. The lighting device of claim 1 wherein the lighting device is supplied with DC voltage.

7. The lighting device of claim 1 wherein the lighting device is supplied with AC voltage and at plurality of LEDs are arranged such that about 50% are in a first polarity and about 50% are in a reverse polarity.

8. The lighting device of claim 1 wherein the plurality of LEDs are configured such that the efficacy of the plurality of LEDs is at least 5% greater than the efficacy of an individual LED.

9. The lighting device of claim 1 wherein the plurality of LEDs are configured such that the efficacy of the plurality of LEDs is between 5% to 40% greater than the efficacy of an individual LED.

10. The lighting device of claim 1 wherein the plurality of LEDs are configured such that the lumens per watt of the plurality of LEDs is greater than the lumens per watt of an individual LED.

11. The lighting device of claim 1 wherein the plurality of LEDs are configured such that the lumens per watt of the plurality of LEDs is at least 5% greater than the lumens per watt of an individual LED.

12. The lighting device of claim 1 wherein the plurality of LEDs are configured such that the lumens per watt of the plurality of LEDs is between 5% to 40% greater than the lumens per watt of an individual LED.

13. A lighting device comprising:
a plurality of LEDs;
a plurality of optic devices corresponding to the plurality of LEDs;
at least one optical separator for substantially preventing the light emitted from one LED from effecting the other LEDs;
wherein the plurality of LEDs are configured such that the efficacy of the plurality of LEDs is greater than the efficacy of an individual LED.

14. The lighting device of claim 13 wherein the at least one optical separator substantially prevents a change in refractive index of the other LEDs.

15. The lighting device of claim 13 wherein the at least one optical separator substantially prevents a photovoltaic effect on the other LEDs.

16. The lighting device of claim 13 further comprising: a thermoelectric device configured to harvest heat generated by the LEDs and convert the harvested heat into electrical energy; and a low temperature material for creating a temperature difference across the thermoelectric device.

17. The lighting device of claim 16 wherein the low temperature material is a phase change material.

18. The lighting device of claim 16 wherein the generated electrical energy is used to aid in maintaining the low temperature material at a low temperature.

19. The lighting device of claim 16 wherein the generated electrical energy is used to aid in powering at least one additional LED.

20. The lighting device of claim 13 wherein the lighting device is supplied with DC voltage.

21. The lighting device of claim 13 wherein the lighting device is supplied with AC voltage and at plurality of LEDs are arranged such that about 50% are in a first polarity and about 50% are in a reverse polarity.

22. The lighting device of claim 13 wherein the plurality of LEDs are configured such that the efficacy of the plurality of LEDs is at least 5% greater than the efficacy of an individual LED.

23. The lighting device of claim 13 wherein the plurality of LEDs are configured such that the efficacy of the plurality of LEDs is between 5% to 40% greater than the efficacy of an individual LED.

24. The lighting device of claim 13 wherein the plurality of LEDs are configured such that the lumens per watt of the plurality of LEDs is greater than the lumens per watt of an individual LED.

25. The lighting device of claim 13 wherein the plurality of LEDs are configured such that the lumens per watt of the plurality of LEDs is at least 5% greater than the lumens per watt of an individual LED.

26. The lighting device of claim 13 wherein the plurality of LEDs are configured such that the lumens per watt of the plurality of LEDs is between 5% to 40% greater than the lumens per watt of an individual LED.

* * * * *